(12) United States Patent
Widmer et al.

(10) Patent No.: US 11,394,253 B2
(45) Date of Patent: Jul. 19, 2022

(54) SYSTEMS, METHODS AND APPARATUSES FOR GUIDANCE AND ALIGNMENT IN ELECTRIC VEHICLES WIRELESS INDUCTIVE CHARGING SYSTEMS

(71) Applicant: WiTricity Corporation, Watertown, MA (US)

(72) Inventors: Hans Peter Widmer, Wohlenschwil (CH); Andreas Daetwyler, Unterentfelden (CH); Lukas Sieber, Olten (CH)

(73) Assignee: WiTricity Corporation, Watertown, MA (US)

( * ) Notice: Subject to any disclaimer, the term of this patent is extended or adjusted under 35 U.S.C. 154(b) by 315 days.

(21) Appl. No.: 16/518,276

(22) Filed: Jul. 22, 2019

(65) Prior Publication Data

US 2019/0356178 A1 Nov. 21, 2019

Related U.S. Application Data

(62) Division of application No. 15/069,570, filed on Mar. 14, 2016, now Pat. No. 10,411,524.
(Continued)

(51) Int. Cl.
*B60L 53/126* (2019.01)
*H02J 50/90* (2016.01)
(Continued)

(52) U.S. Cl.
CPC ............ *H02J 50/90* (2016.02); *B60L 53/126* (2019.02); *B60L 53/36* (2019.02); *B60L 53/38* (2019.02);
(Continued)

(58) Field of Classification Search
CPC ........ B60L 53/36; B60L 53/30; B60L 53/126; H02J 50/90; H02J 50/10; G01R 33/0206; G01R 33/02; G01R 33/028
See application file for complete search history.

(56) References Cited

U.S. PATENT DOCUMENTS 6,472,975 B1 10/2002 Beigel et al.
8,922,440 B2 12/2014 Schantz et al.
(Continued)

FOREIGN PATENT DOCUMENTS

CN 1604426 A 4/2005
CN 101568847 A 10/2009
(Continued)

OTHER PUBLICATIONS

International Search Report and Written Opinion—PCT/US2016/034118—ISA/EPO—dated Aug. 12, 2016.

*Primary Examiner* — Dominic E Hawkins
(74) *Attorney, Agent, or Firm* — Knobbe, Martens, Olson & Bear, LLP

(57) ABSTRACT

An apparatus for determining a relative position of a wireless power transmitter from a wireless power receiver is provided. The apparatus comprises a plurality of sense coils, each configured to generate a respective signal under influence of an alternating magnetic field comprising a plurality of wave pulses, each wave pulse occurring in a respective time slot of a plurality of time slots. The apparatus further comprises a processor configured to determine the relative position of the wireless power transmitter from the wireless power receiver based on the respective signal from each of the plurality of sense coils.

4 Claims, 29 Drawing Sheets

Related U.S. Application Data

(60) Provisional application No. 62/183,661, filed on Jun. 23, 2015.

(51) Int. Cl.

| | | |
|---|---|---|
| *B60L 53/36* | (2019.01) | |
| *B60L 53/39* | (2019.01) | |
| *B60L 53/38* | (2019.01) | |
| *G01D 5/20* | (2006.01) | |
| *G01R 33/02* | (2006.01) | |
| *G01R 33/028* | (2006.01) | |
| *H01F 38/14* | (2006.01) | |
| *H04B 5/00* | (2006.01) | |
| *H02J 50/10* | (2016.01) | |

(52) U.S. Cl.
CPC .............. *B60L 53/39* (2019.02); *G01D 5/204* (2013.01); *G01D 5/2066* (2013.01); *G01R 33/02* (2013.01); *G01R 33/0206* (2013.01); *G01R 33/028* (2013.01); *H01F 38/14* (2013.01); *H02J 50/10* (2016.02); *H04B 5/0037* (2013.01); *H04B 5/0087* (2013.01); *H01F 2038/143* (2013.01); *Y02T 10/70* (2013.01); *Y02T 10/7072* (2013.01); *Y02T 90/12* (2013.01); *Y02T 90/14* (2013.01)

(56) References Cited

U.S. PATENT DOCUMENTS

| | | | |
|---|---|---|---|
| 9,888,337 | B1 | 2/2018 | Zalewski et al. |
| 10,411,524 | B2 | 9/2019 | Widmer et al. |
| 2005/0068019 | A1 | 3/2005 | Nakamura et al. |
| 2008/0204004 | A1 | 8/2008 | Anderson |
| 2010/0053789 | A1 | 3/2010 | Duric |
| 2010/0270970 | A1* | 10/2010 | Toya ...................... H02J 50/60 320/108 |
| 2010/0315038 | A1* | 12/2010 | Terao ...................... H02J 50/10 320/108 |
| 2011/0292972 | A1 | 12/2011 | Budianu et al. |
| 2012/0262002 | A1 | 10/2012 | Widmer et al. |
| 2013/0024059 | A1 | 1/2013 | Miller et al. |
| 2013/0043734 | A1 | 2/2013 | Stone et al. |
| 2014/0062213 | A1 | 3/2014 | Wheatley, III et al. |
| 2014/0070622 | A1 | 3/2014 | Keeling et al. |
| 2014/0172338 | A1 | 6/2014 | Lafontaine et al. |
| 2015/0042168 | A1 | 2/2015 | Widmer |
| 2015/0115727 | A1* | 4/2015 | Carobolante ......... H02J 50/402 307/104 |
| 2015/0180286 | A1 | 6/2015 | Asanuma et al. |
| 2015/0285926 | A1 | 10/2015 | Oettinger et al. |
| 2016/0218559 | A1* | 7/2016 | Mehas .................. H02J 50/70 |
| 2016/0380487 | A1 | 12/2016 | Widmer et al. |
| 2016/0380488 | A1 | 12/2016 | Widmer et al. |

FOREIGN PATENT DOCUMENTS

| | | |
|---|---|---|
| CN | 104269944 A | 1/2015 |
| DE | 102010012356 A1 | 9/2011 |
| EP | 1209648 A2 | 5/2002 |
| EP | 1707984 A2 | 10/2006 |
| EP | 2876772 A1 | 5/2015 |
| WO | WO-2012132144 A1 | 10/2012 |
| WO | WO-2014073990 A1 | 5/2014 |

* cited by examiner

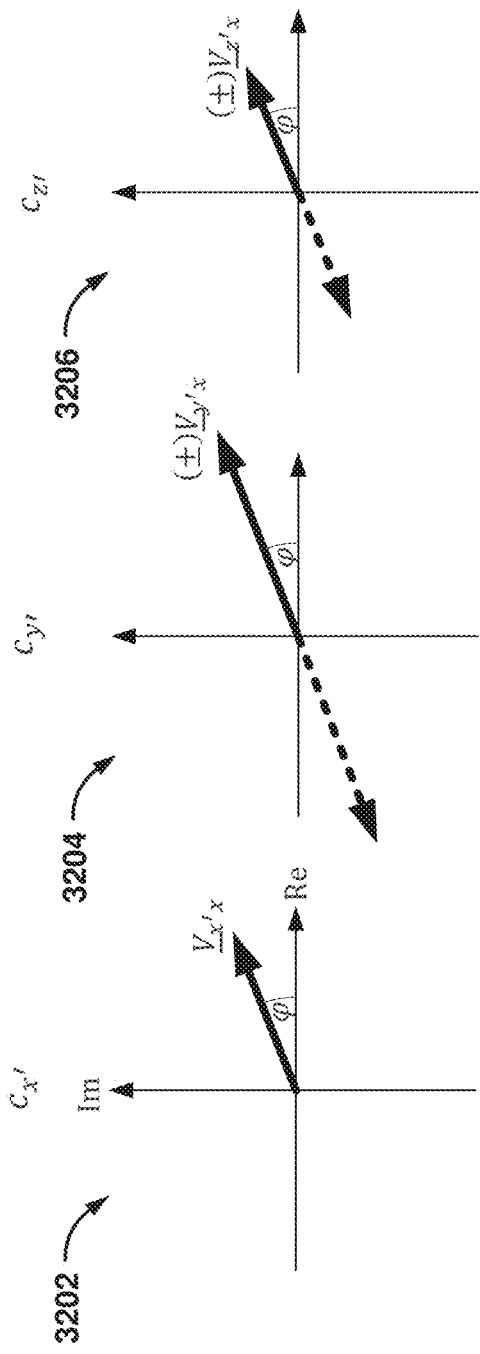
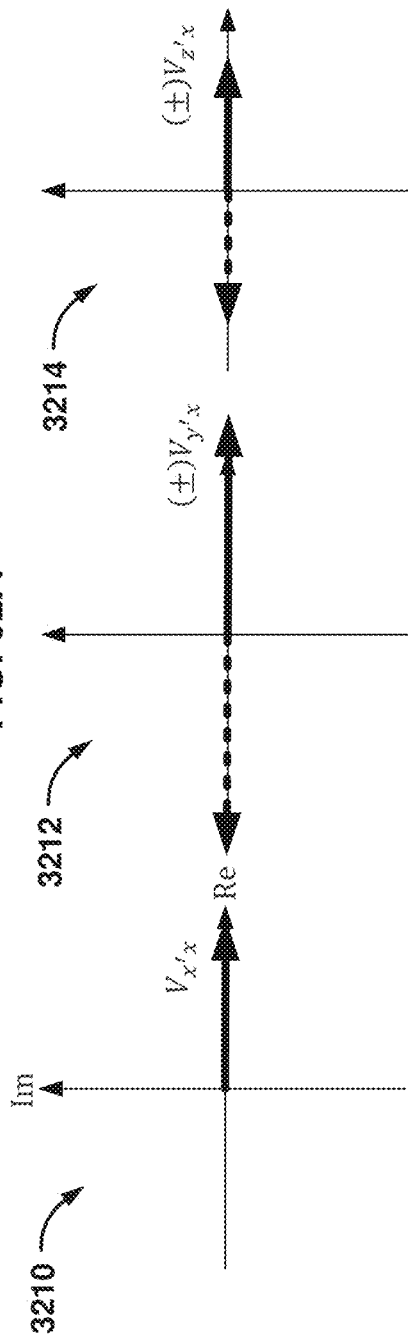
FIG. 32A
FIG. 32B

SYSTEMS, METHODS AND APPARATUSES FOR GUIDANCE AND ALIGNMENT IN ELECTRIC VEHICLES WIRELESS INDUCTIVE CHARGING SYSTEMS

CROSS REFERENCE TO RELATED APPLICATIONS

This application is a divisional of U.S. patent application Ser. No. 15/069,570 entitled "SYSTEMS, METHODS AND APPARATUSES FOR GUIDANCE AND ALIGNMENT IN ELECTRIC VEHICLES WIRELESS INDUCTIVE CHARGING SYSTEMS" filed Mar. 14, 2016, which claims priority to and the benefit under 35 U.S.C. § 119(e) of U.S. Provisional Patent Application No. 62/183,661 entitled "SYSTEMS, METHODS AND APPARATUSES FOR GUIDANCE AND ALIGNMENT IN ELECTRIC VEHICLES WIRELESS INDUCTIVE CHARGING SYSTEMS" filed on Jun. 23, 2015, the disclosures of which are hereby incorporated by reference in their entireties.

FIELD

This application is generally related to wireless charging power transfer applications, and specifically to systems, methods and apparatuses for guidance and alignment of electric vehicles with wireless inductive charging power transmitters. More specifically the present disclosure relates to determining a position of the electric vehicle relative to a ground-based charging unit based on magnetic vector fields (magnetic vectoring) and receiver synchronization methods for magnetic vectoring.

BACKGROUND

Efficiency in wireless inductive charging power applications depends at least in part on achieving at least a minimum alignment threshold between a wireless power transmitter and a wireless power receiver. One method for aiding such alignment is the use of magnetic vectoring, where a distance and/or direction between the wireless power transmitter and the wireless power receiver is determined based on sensing one or more attributes of a magnetic field generated at or near either the wireless power transmitter or the wireless power receiver (the magnetic field may not be for wireless power transfer but for guidance and alignment purposes). However, determining a non-ambiguous position between a wireless power transmitter and a wireless power receiver utilizing magnetic vectoring requires some form of synchronization of the magnetic field detection system with the magnetic field generating system. Accordingly, systems, methods and apparatuses for guidance and alignment of electric vehicles with wireless inductive charging power transmitters as described herein are desirable.

SUMMARY

In some implementations, an apparatus for determining a relative position of a wireless power transmitter from a wireless power receiver is provided. The apparatus comprises a plurality of sense coils, each configured to generate a respective signal under influence of an alternating magnetic field comprising a plurality of wave pulses, each wave pulse occurring in a respective time slot of a plurality of time slots. The apparatus further comprises a processor configured to determine the relative position of the wireless power transmitter from the wireless power receiver based on the respective signal from each of the plurality of sense coils.

In some other implementations, a method for determining a relative position of a wireless power transmitter from a wireless power receiver is provided. The method comprises generating, by each of a plurality of sense coils, a respective voltage signal under influence of an alternating magnetic field comprising a plurality of wave pulses, each wave pulse occurring in a respective time slot of a plurality of time slots. The method comprises determining the relative position of the wireless power transmitter from the wireless power receiver based on the respective voltage signal from each of the plurality of sense coils.

In some other implementations, a non-transitory, computer-readable medium comprises code that, when executed, causes an apparatus for determining a relative position of a wireless power transmitter from a wireless power receiver to generate, by each of a plurality of sense coils, a respective voltage signal under influence of an alternating magnetic field comprising a plurality of wave pulses, each wave pulse occurring in a respective time slot of a plurality of time slots. The code, when executed further causes the apparatus to determine the relative position of the wireless power transmitter from the wireless power receiver based on the respective voltage signal from each of the plurality of sense coils.

In some other implementations, an apparatus for determining a relative position of a wireless power transmitter from a wireless power receiver is provided. The apparatus comprises a plurality of means for generating a respective voltage signal under influence of an alternating magnetic field comprising a plurality of wave pulses, each wave pulse occurring in a respective time slot of a plurality of time slots. The apparatus further comprises means for determining the relative position of the wireless power transmitter from the wireless power receiver based on the respective voltage signal from each of the plurality of means for generating the respective voltage signal.

In some other implementations, an apparatus for determining a relative position of a wireless power transmitter from a wireless power receiver is provided. The apparatus comprises a driver circuit configured to generate at least a first signal, a second signal and a third signal, each comprising at least one respective wave pulse of a plurality of wave pulses, each wave pulse occurring in a respective time slot of a plurality of time slots. The apparatus comprises a plurality of coils configured to generate an alternating magnetic field while being driven by a respective one of the first signal, the second signal and the third signal.

In some other implementations, a method for determining a relative position of a wireless power transmitter from a wireless power receiver is provided. The method comprises generating at least a first signal, a second signal and a third signal, each comprising at least one respective wave pulse of a plurality of wave pulses, each wave pulse occurring in a respective time slot of a plurality of time slots. The method comprises generating an alternating magnetic field by driving each coil of a plurality of coils with a respective one of the first signal, the second signal and the third signal.

In some other implementations, a non-transitory, computer-readable medium comprises code that, when executed, causes an apparatus for determining a relative position of a wireless power transmitter from a wireless power receiver to generate at least a first signal, a second signal and a third signal, each comprising at least one respective wave pulse of a plurality of wave pulses, each wave pulse occurring in a respective time slot of a plurality of time slots. The code when executed further causes the apparatus to generate an alternating magnetic field by driving each coil of a plurality of coils with a respective one of the first signal, the second signal and the third signal.

In some other implementations, an apparatus for determining a relative position of a wireless power transmitter from a wireless power receiver is provided. The apparatus comprises means for generating at least a first signal, a second signal and a third signal, each comprising at least one respective wave pulse of a plurality of wave pulses, each wave pulse occurring in a respective time slot of a plurality of time slots. The apparatus comprises a plurality of means for generating an alternating magnetic field by being driven with a respective one of the first signal, the second signal and the third signal.

In some other implementations, an apparatus for determining a relative position of a wireless power transmitter from a wireless power receiver is provided. The apparatus comprises a plurality of sense coils, each configured to generate a respective voltage signal under influence of an alternating magnetic field comprising a plurality of beacon signals occurring simultaneously, each beacon signal modulated with a unique spreading code. The apparatus further comprises a processor configured to determine the relative position of the wireless power transmitter from the wireless power receiver based on the respective voltage signal from each of the plurality of sense coils.

In some other implementations, a method for determining a relative position of a wireless power transmitter from a wireless power receiver is provided. The method comprises generating, by each of a plurality of sense coils, a respective voltage signal under influence of an alternating magnetic field comprising a plurality of beacon signals occurring simultaneously, each beacon signal modulated with a unique spreading code. The method comprises determining the relative position of the wireless power transmitter from the wireless power receiver based on the respective voltage signal from each of the plurality of sense coils.

In some other implementations, a non-transitory, computer-readable medium comprises code that, when executed, causes an apparatus for determining a relative position of a wireless power transmitter from a wireless power receiver to generating, by each of a plurality of sense coils, a respective voltage signal under influence of an alternating magnetic field comprising a plurality of beacon signals occurring simultaneously, each beacon signal modulated with a unique spreading code. The method comprises determining the relative position of the wireless power transmitter from the wireless power receiver based on the respective voltage signal from each of the plurality of sense coils.

In some other implementations, an apparatus for determining a relative position of a wireless power transmitter from a wireless power receiver is provided. The apparatus comprises a plurality of means for generating a respective voltage signal under influence of an alternating magnetic field comprising a plurality of beacon signals occurring simultaneously, each beacon signal modulated with a unique spreading code. The apparatus further comprises means for determining the relative position of the wireless power transmitter from the wireless power receiver based on the respective voltage signal from each of the plurality of sense coils.

In some other implementations, an apparatus for determining a relative position of a wireless power transmitter from a wireless power receiver is provided. The apparatus comprises a driver circuit configured to generate at least a first signal, a second signal and a third signal, each comprising a respective beacon signal of a plurality of beacon signals occurring simultaneously, each beacon signal modulated with a unique spreading code. The apparatus comprises a plurality of coils configured to generate an alternating magnetic field while being driven by a respective one of the first signal, the second signal and the third signal.

In some other implementations, a method for determining a relative position of a wireless power transmitter from a wireless power receiver is provided. The method comprises generating at least a first signal, a second signal and a third signal, each comprising a respective beacon signal of a plurality of beacon signals occurring simultaneously, each beacon signal modulated with a unique spreading code. The method comprises generating an alternating magnetic field by driving each coil of a plurality of coils with a respective one of the first signal, the second signal and the third signal.

In some other implementations, a non-transitory, computer-readable medium comprises code that, when executed, causes an apparatus for determining a relative position of a wireless power transmitter from a wireless power receiver to generate at least a first signal, a second signal and a third signal, each comprising a respective beacon signal of a plurality of beacon signals occurring simultaneously, each beacon signal modulated with a unique spreading code. The code when executed further causes the apparatus to generate an alternating magnetic field by driving each coil of a plurality of coils with a respective one of the first signal, the second signal and the third signal.

In some other implementations, an apparatus for determining a relative position of a wireless power transmitter from a wireless power receiver is provided. The apparatus comprises means for generating at least a first signal, a second signal and a third signal, each comprising a respective beacon signal of a plurality of beacon signals occurring simultaneously, each beacon signal modulated with a unique spreading code. The apparatus comprises a plurality of means for generating an alternating magnetic field by being driven with a respective one of the first signal, the second signal and the third signal.

BRIEF DESCRIPTION OF THE DRAWINGS

FIGS. 32A and 32B show complex phasors as simultaneously detected by the x-branch synchronous detector before and after phasor rotation, respectively, in accordance with some implementations.

DETAILED DESCRIPTION

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) may be received, captured, or coupled by a "receive coupler" to achieve power transfer.

The terminology used herein is for the purpose of describing particular implementations only and is not intended to be limiting on the disclosure. It will be understood that if a specific number of a claim element is intended, such intent will be explicitly recited in the claim, and in the absence of such recitation, no such intent is present. For example, as used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Figure 1:
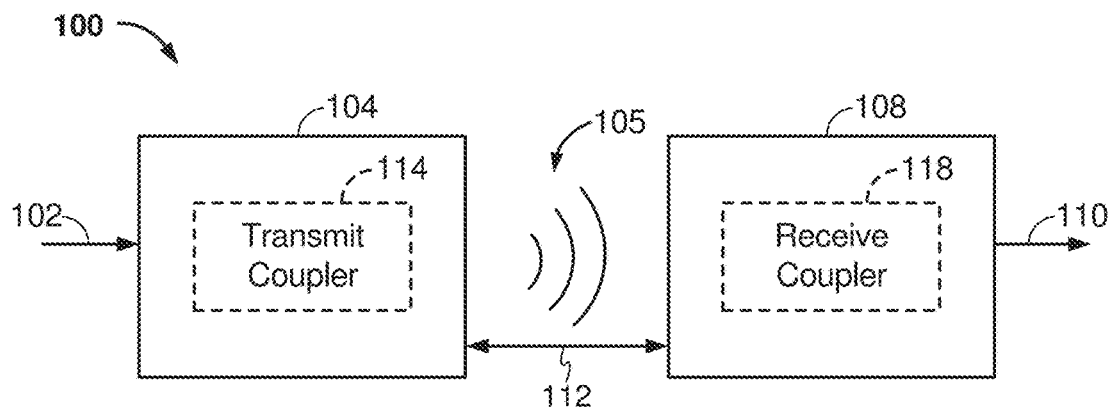
FIG. 1 is a functional block diagram of a wireless power transfer system, in accordance with some implementations.

FIG. 1 is a functional block diagram of a wireless power transfer system 100, in accordance with some implementations. Input power 102 may be provided to a transmitter 104 from a power source (not shown) to generate a wireless (e.g., magnetic or electromagnetic) field 105 via a transmit coupler 114 for performing energy transfer. The receiver 108 may receive power when the receiver 108 is located in the wireless field 105 produced by the transmitter 104. The wireless field 105 corresponds to a region where energy output by the transmitter 104 may be captured by the receiver 108. A receiver 108 may couple to the wireless field 105 and generate output power 110 for storing or consumption by a device (not shown in this figure) coupled to the output power 110. Both the transmitter 104 and the receiver 108 are separated by a distance 112.

In one example implementation, power is transferred inductively via a time-varying magnetic field generated by the transmit coupler 114. The transmitter 104 and the receiver 108 may further be configured according to a mutual resonant relationship. When the resonant frequency of the receiver 108 and the resonant frequency of the transmitter 104 are substantially the same or very close, transmission losses between the transmitter 104 and the receiver 108 are minimal. However, even when resonance between the transmitter 104 and receiver 108 are not matched, energy may be transferred, although the efficiency may be reduced. For example, the efficiency may be less when resonance is not matched. Transfer of energy occurs by coupling energy from the wireless field 105 of the transmit coupler 114 to the receive coupler 118, residing in the vicinity of the wireless field 105, rather than propagating the energy from the transmit coupler 114 into free space. Resonant inductive coupling techniques may thus allow for improved efficiency and power transfer over various distances and with a variety of inductive coupler configurations.

In some implementations, the wireless field 105 corresponds to the "near-field" of the transmitter 104. The near-field may correspond to a region in which there are strong reactive fields resulting from the currents and charges in the transmit coupler 114 that minimally radiate power away from the transmit coupler 114. The near-field may correspond to a region that is within about one wavelength (or a fraction thereof) of the transmit coupler 114. Efficient energy transfer may occur by coupling a large portion of the energy in the wireless field 105 to the receive coupler 118 rather than propagating most of the energy in an electromagnetic wave to the far field. When positioned within the wireless field 105, a "coupling mode" may be developed between the transmit coupler 114 and the receive coupler 118.

Figure 2:
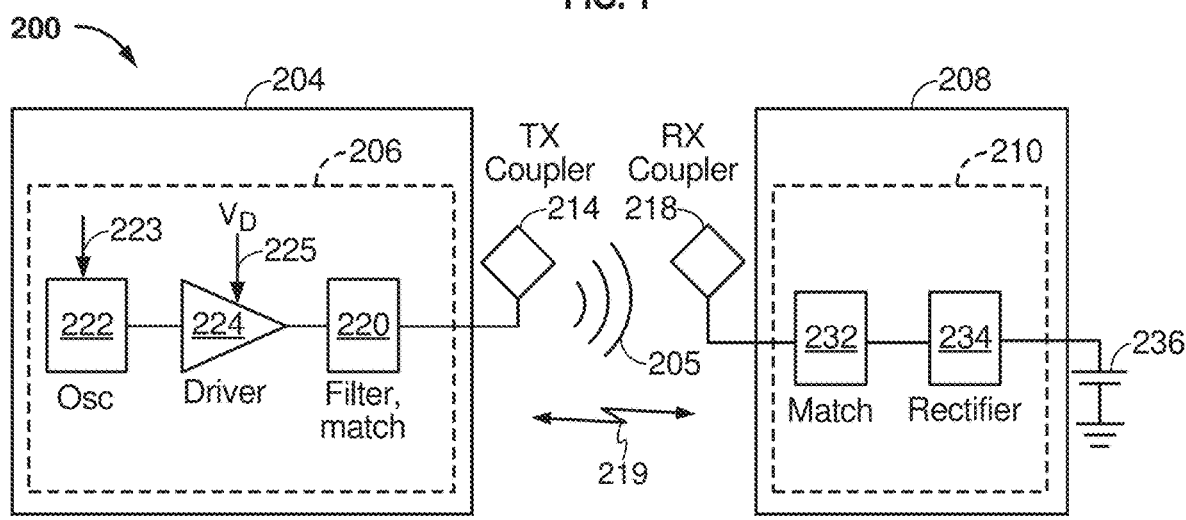
FIG. 2 is a functional block diagram of a wireless power transfer system, in accordance with some other implementations.

FIG. 2 is a functional block diagram of a wireless power transfer system 200, in accordance with some other implementations. The system 200 may be a wireless power transfer system of similar operation and functionality as the system 100 of FIG. 1. However, the system 200 provides additional details regarding the components of the wireless power transfer system 200 as compared to FIG. 1. The system 200 includes a transmitter 204 and a receiver 208. The transmitter 204 includes transmit circuitry 206 that includes an oscillator 222, a driver circuit 224, and a filter and matching circuit 226. The oscillator 222 may be configured to generate a signal at a desired frequency that may be adjusted in response to a frequency control signal 223. The oscillator 222 provides the oscillator signal to the driver circuit 224. The driver circuit 224 may be configured to drive the transmit coupler 214 at a resonant frequency of the transmit coupler 214 based on an input voltage signal ($V_D$) 225.

The filter and matching circuit 226 filters out harmonics or other unwanted frequencies and matches the impedance of the transmit circuitry 206 to the transmit coupler 214. As a result of driving the transmit coupler 214, the transmit coupler 214 generates a wireless field 205 to wirelessly output power at a level sufficient for charging a battery 236.

The receiver 208 comprises receive circuitry 210 that includes a matching circuit 232 and a rectifier circuit 234. The matching circuit 232 may match the impedance of the receive circuitry 210 to the impedance of the receive coupler 218. The rectifier circuit 234 may generate a direct current (DC) power output from an alternate current (AC) power input to charge the battery 236. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205. In some implementations, the receiver 208 may be configured to determine whether an amount of power transmitted by the transmitter 204 and received by the receiver 208 is appropriate for charging the battery 236.

Figure 3:
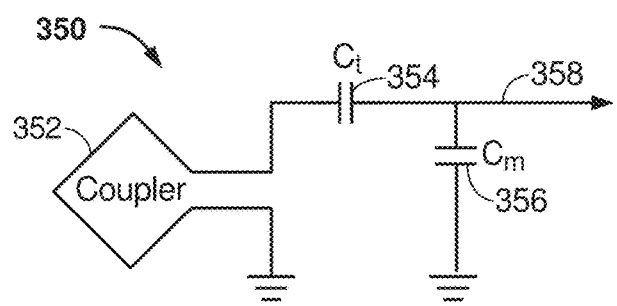
FIG. 3 is a schematic diagram of a portion of transmit circuitry or receive circuitry of FIG. 2 including a transmit or receive coupler, in accordance with some implementations.

FIG. 3 is a schematic diagram of a portion of the transmit circuitry 206 or the receive circuitry 210 of FIG. 2, in accordance with some implementations. As illustrated in FIG. 3, transmit or receive circuitry 350 may include a coupler 352. The coupler 352 may also be referred to or be configured as a "conductor loop", a coil, an inductor, or a "magnetic" coupler. The term "coupler" generally refers to a component that may wirelessly output or receive energy for coupling to another "coupler."

The resonant frequency of the loop or magnetic couplers is based on the inductance and capacitance of the loop or magnetic coupler. Inductance may be simply the inductance created by the coupler 352, whereas, capacitance may be added via a capacitor (or the self-capacitance of the coupler 352) to create a resonant structure at a desired resonant frequency, or at a fixed frequency set or prescribed by a particular operations standard. As a non-limiting example, a capacitor 354 and a capacitor 356 may be added to the transmit or receive circuitry 350 to create a resonant circuit that selects a signal 358 at a resonant frequency. For larger sized couplers using large diameter couplers exhibiting larger inductance, the value of capacitance needed to produce resonance may be lower. Furthermore, as the size of the coupler increases, coupling efficiency may increase. This is mainly true if the size of both transmit and receive couplers increase. For transmit couplers, the signal 358, oscillating at a frequency that substantially corresponds to the resonant frequency of the coupler 352, may be an input to the coupler 352. In some implementations, the frequency for inductive power transfer may be in the range of 20 kHz to 150 kHz.

In order to maintain a requisite threshold of efficiency and compliance with regulatory standards, inductive charging of electric vehicles in the kilowatt range require relatively tight coupling; the higher the power transfer, the tighter the coupling requirement to maintain EMI levels within compliance of regulatory standards. For example, inductive power transfer (IPT) of 3 kW from a ground-based charging unit to a vehicle-based charging unit over an air gap typically in the range of 70-150 mm may tolerate alignment errors of up to approximately 150 mm, depending on the technology and design of the couplers used. For systems inductively transferring energy at 20 kW, the tolerable alignment error may be less than 50 mm, requiring considerably higher parking precision.

Parking assist systems can potentially help to overcome such alignment issues, thereby increasing convenience and user experience. This is particularly true for position-critical electric vehicle charging. A system that assists a driver in reliably parking an electric vehicle within a so-called "sweet spot" of the coupler system may generally be called a guidance and alignment system. The "sweet spot" may define a zone of alignments between the vehicle-based IPT coupler and a ground-based IPT coupler where coupling efficiency is above a certain minimum value. Such a "sweet spot" may also be defined in terms of emissions, e.g., if the electric vehicle is parked in this "sweet spot," the leakage of the magnetic field, as measured in the area surrounding the vehicle may be below regulatory limits, e.g., ICNIRP limits for electro-motive force (EMF) or electro-magnetic interference (EMI) exposure.

In a minimum solution, the system may simply indicate whether the vehicle has been parked within such a "sweet spot" or not. This may always be needed even in case of an IPT technology that is very tolerant to alignment errors.

A more sophisticated system, which is the subject of this application, determines a position of a vehicle reference point relative to a base reference point. This position data may be translated into visual and/or acoustic guidance and alignment information to assist the driver of the electric vehicle in reliably parking the vehicle within the "sweet spot" of the charging system so as to avoid failed alignment attempts. The driver may use this feedback to correct the trajectory towards the charging spot in real-time and to stop the vehicle within the "sweet spot." Such guidance information may be particularly useful for IPT systems having small alignment tolerances or in conditions that render parking for charging difficult (e.g., by night or snow clad parking lots). In an advanced and yet more sophisticated system, position information may be used to park a vehicle automatically with no or only minimal driver intervention (drive by wire).

Both "guidance" and "alignment" of such an electric vehicle may rely on a local positioning system having components aboard the electric vehicle and components installed in a parking lot (e.g., infrastructure). Systems, devices and methods disclosed herein for positioning are based on generating and sensing a low frequency magnetic field that may be generated either by the base charging unit or by the vehicle charging unit at a frequency preferably below 150 kHz. Such methods, disclosed herein, are referred to as magnetic vectoring and may be used for positioning at a distance range of between 0 and 5 meters from the source of the low frequency magnetic field.

Alignment and particularly guidance may be based at least on determining an accurate position of the vehicle relative to the charging base. There may be several technical approaches to such positioning or localization. These approaches may be based on optical or infrared methods using cameras, appropriate road markings and/or laser scanners, inertial systems using accelerometers and/or gyrometers, measuring propagation time and performing triangulation of acoustic (ultrasonic) waves or electromagnetic waves (e.g., microwaves), and/or sensing a magnetic near-field that may be generated by the base charging unit, vehicle charging unit or by other external devices.

A positioning/localization method should be reliably functional in substantially all conditions as experienced in an automotive environment indoors (no GPS reception) and outdoors, in different seasonal weather conditions (snow, ice, water, foliage), at different day times (sun irradiation, darkness), with signal sources and sensors polluted (dirt, mud, dust, etc.), with different ground properties (asphalt, ferroconcrete), and/or in the presence of vehicles and other reflecting or line-of-sight obstructing objects (e.g., wheels of own vehicle, vehicles parked adjacent, etc.). Moreover, for the sake of minimizing infrastructure installation complexity and costs, methods allowing full integration of all system components into the base charging unit and/or vehicle charging unit and not requiring installation of additional components external to these units (e.g., signal sources, antennas, etc.) are desirable. Considering all of above aspects, sensing a magnetic near field has been found particularly promising for alignment and guidance within a parking stall and in the surrounding area.

A basic method of sensing the magnetic field for purposes of positioning assumes that at least one of a charging base or vehicle generates an alternating magnetic field that can be sensed by a sensor system, which may be either integrated into the vehicle charging unit or built into the charging base, respectively. In some implementations, the frequency of the sensing magnetic field may be substantially the same as the operating frequency of the IPT system. In some other implementations, the frequency of the sensing magnetic field may be different from the IPT frequency, but low enough so that sensing (e.g., positioning) takes place in the so-called near-field (e.g., within $1/2\pi$ or ~15.9% of a wavelength) of the sensing magnetic field. A suitable frequency may be in a low frequency (LF) band (e.g., in the range from 120-140 kHz), however, a frequency in a high frequency (HF) band (e.g., in the 6.78 MHz or 13.56 MHz ISM-band) may also be utilized. In addition, in some implementations, the sense magnetic field may be generated using the same coil or the same coil arrangement that is used for IPT (e.g., the transmit coupler 274 of FIG. 2 or the transmit coupler 352 of FIG. 3). However for higher accuracy and wider applicability, use of one or more separate coils specifically for the purpose of positioning may be advantageous.

In some implementations presenting a simple, low cost solution, only an alignment score representative of the coupling strength between one or more coil generating the sense magnetic field and one or more sense coils receiving the generated sense magnetic field is determined but the system may not be able to provide a driver of the electric vehicle with any more information (e.g., actual alignment error and/or how the driver should correct in case of a failed alignment attempt). In such low complexity solutions, the sense magnetic field may be generated by the one or more primary IPT coils of the base unit and an alignment score is determined by measuring, e.g., the vehicle's secondary coil short circuit current or open circuit voltage using current/ voltage transducers that may also be used for controlling and monitoring the IPT system. In such low complexity solutions, primary current of the one or more primary coils required in the alignment mode may be lower than during regular IPT operation. However, the magnetic and/or electric fields generated may still be too high to meet applicable regulatory limits, e.g., a human exposure standard or an OEM-specified limit. This may be particularly true if the alignment mode is activated before the vehicle has fully parked over the one or more primary coils of the charging base.

In some other, more sophisticated implementations, magnetic field sensing may provide position information over an extended range that can be used to assist the driver in accurately parking the vehicle within the "sweet" spot. Such systems may require dedicated active field sensors that are frequency selective and considerably more sensitive than ordinary current or voltage transducers used for wirelessly transferring power. Furthermore, such a system has the potential to operate at lower magnetic and electric field levels that are compliant with human exposure standards in all situations.

Yet other even more sophisticated implementations may provide higher positioning accuracy and wider applicability by utilizing one or more dedicated coils for generating the magnetic field. These generator coils may be arranged and configured for generating a more complex magnetic field pattern that may be utilized to resolve position ambiguity issues, as will be described in more detail below. Sensing the magnetic near field may also apply for positioning outside a parking stall in an extended area, e.g., inside a parking garage. In such implementations, magnetic field sources may be road-embedded, e.g., in the access aisles. Such designs may also be used for dynamic roadway powering and charging systems.

One difficulty of quasi-static magnetic field (near field) positioning techniques based on sensing an alternating (sinusoidal) magnetic field is the requirement for synchronization between magnetic field generator and magnetic field sensor. Absence of any synchronization information leads to a signal polarity (180° phase) ambiguity issue and consequently to position ambiguity. The 180° phase ambiguity is a problem of the magnetic radio compass, which has been used for radio direction finding, e.g., in nautical and aeronautical navigation systems. It is also a problem in magnetic field-based vehicle positioning systems used for guidance and alignment of an electric vehicle for purposes of inductive charging.

The present application mainly relates to the magnetic vector polarity issue and to methods and systems for achieving the necessary synchronization between magnetic field transmitter and receiver in positioning systems using a multi-axis magnetic field generator and a multi-axis magnetic field sensor. Some implementations herein assume a multi-tone scheme (FDM) to transmit magnetic beacon signals in different axes. The rational behind FDM is low complexity, spectral efficiency, robustness against interference and high dynamic range as needed to cope with the "near-far" effects as typically encountered in magnetic near field transmissions.

The 3-axis or 2-axis generator/3-axis sensor position finding problem of vehicle charging only requires knowledge of the relative signal (vector) polarities and thus relative phase synchronization between tones of an FDM transmission. As opposed to absolute phase, relative phase synchronization can be achieved in-band by either using a narrow-band modulated signal or in a very simple way by using a double-tone transmission in at least one of the generator axis.

Preferably, this double-tone has a tone separation equal to the frequency separation of tones transmitted in other axis resulting in a FDM transmission scheme with equal spacing between adjacent tone frequencies. In the receiver, these tones and tones emanating from other positioning transmitters may be separated using Fast Fourier Transform Techniques with high side-lobe and thus high cross-talk and adjacent channel attenuation.

FIGS. 4A, 4B, 4C, 4D illustrate different positional relationships between a charging base (e.g., a base pad) 402 and a vehicle charging unit, e.g., a vehicle pad) 404 using one of a ground-based coordinate frame and a vehicle-based coordinate frame. FIGS. 4A, 4B, 4C, 4D assume a magnetic vectoring (MV) field generator and a MV field sensor are integrated with the IPT couplers in the base pad 402 and the vehicle pad 404 of a vehicle 406 in positions such that the magnetic centers of the respective IPT coupler and of the MV generator coincide. Furthermore, FIGS. 4A, 4B, 4C, 4D assume any magnetic field polarization axis of the base IPT coupler and of the vehicle IPT coupler are equally oriented with any of the axes of the MV field generator and MV field sensor, respectively, such that a single coordinate frame from the perspective of each of the MV field generator and the MV field sensor is required to define a positional relationship between a base IPT coupler and a vehicle IPT coupler. Moreover, FIGS. 4A, 4B, 4C, 4D assume that the axis of the ground-based coordinate frame is oriented parallel to the parking stall outline as indicated in FIGS. 4A-4D by a parking stall marking, and that the vehicle-based coordinate frame axis is oriented parallel to the vehicle's symmetry axis.

The above assumptions have been made for the sake of simplicity and clarity and should not be construed as either a requirement or precluding other configurations and arrangements. For example, the coordinate frames of the IPT couplers may differ from the coordinate frames of the MV generator and sensor in position and orientation. The coordinate frames may also differ from any symmetry axis as defined by the parking stall and/or the vehicle geometry. In such implementations, additional positional relationships among the different coordinate frames should be defined.

For FIGS. 4A, 4B, 4C, 4D, the magnetic centers of the IPT couplers may be defined as a first point in the base IPT coupler (e.g., the transmit coupler 214 of FIG. 2) and a second point in the vehicle IPT coupler (e.g., the receive coupler 218 of FIG. 2) where the first point and the second point have essentially zero horizontal (e.g., x or y axis) offset from one another when IPT coupling is at a maximum for any amount of rotation of the vehicle 406 that is within constraints dictated by the type of IPT coupler. For "polarized" IPT couplers, this definition for magnetic centers of the IPT couplers may hold for rotations of the vehicle restricted to within approximately ±30° and/or 150°-210°. Normally, the magnetic center of a particular IPT coupler is located approximately on a symmetry axis of the magnetic field generated by that particular IPT coupler.

Likewise, the magnetic centers of the MV field generator and of the MV field sensor may be defined as a first point in the generator and a second point in the sensor where the first point and the second point have essentially zero horizontal offset from one another when the positioning system determines that an essentially zero relative horizontal offset between the first point and the second point has been reached for any azimuthal rotation of the sensor.

As shown in FIGS. 4A, 4B, 4C, 4D, the x-axis and y-axis always refer to the coordinate frame from the perspective of the MV field sensor, while the x'-axis and y'-axis always refer to the coordinate frame from the perspective of the MV field generator. This is true regardless of whether the MV field sensor is located in the base pad (see FIGS. 4C and 4D) or in the vehicle pad (see FIGS. 4A and 4B). The z-axis and the z'-axis, respectively, are not shown in FIGS. 4A, 4B, 4C, 4D but are assumed to point towards the sky (e.g., the zenith), thus defining a "right-handed" or "positive" coordinate system. These coordinate systems will be referenced throughout this application.

Figures 4A, 4B:
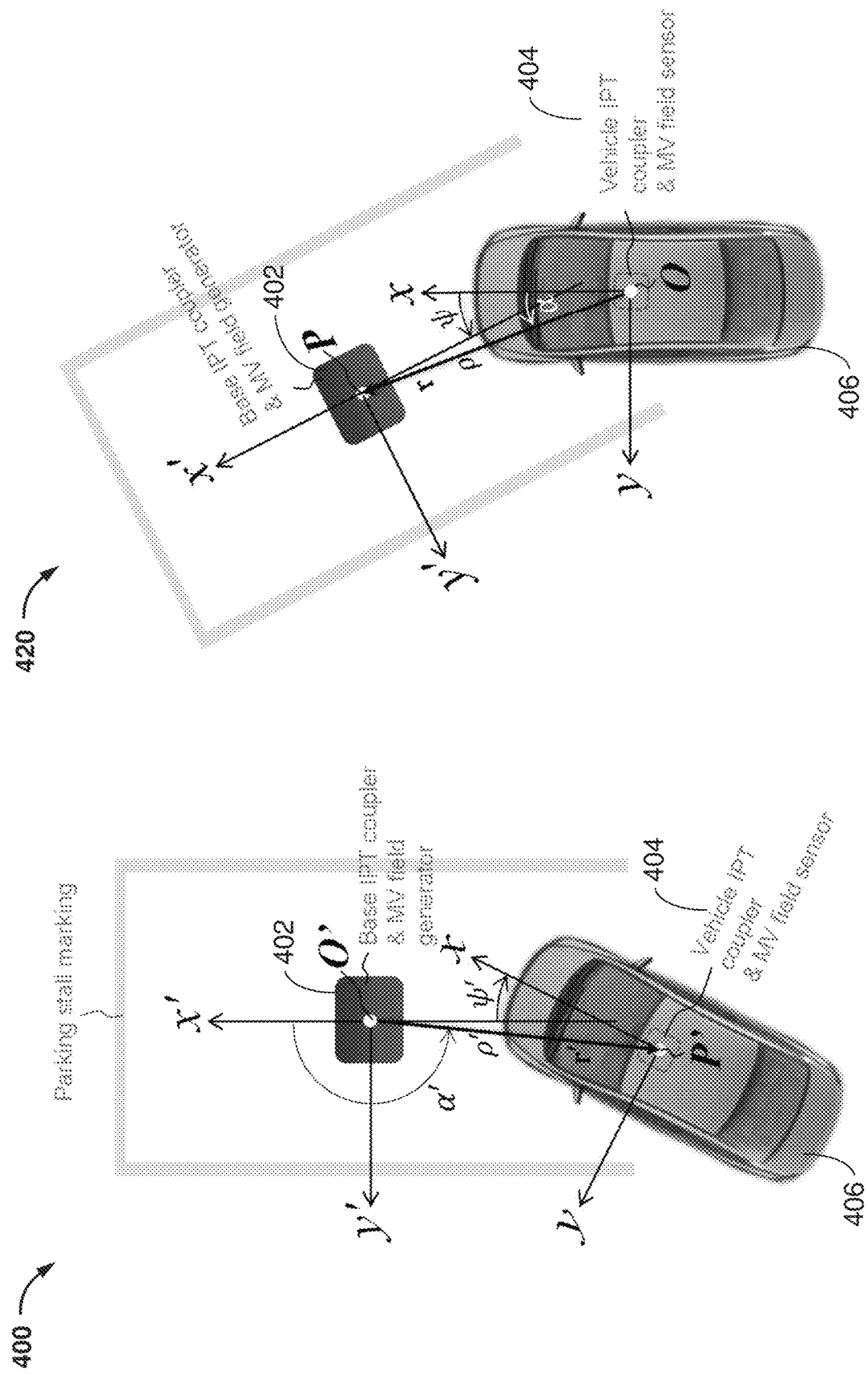
FIG. 4A illustrates a positional relationship between a vehicle-based magnetic field sensor and a ground-based magnetic field generator installed in a parking stall, the sensor's position and rotation represented in the generator's coordinate frame.
FIG. 4B illustrates a positional relationship between a vehicle-based magnetic field sensor and a ground-based magnetic field generator installed in a parking stall, the generator's position and rotation represented in the sensor's coordinate frame.

FIGS. 4A, 4B illustrate a positional relationship between a ground-based generator and a vehicle-mounted sensor, in accordance with some implementations. In FIG. 4A, position and rotation of the sensor are represented in generator coordinates by a position vector r'=$\overrightarrow{O'P'}$ where O' and P' denote the magnetic center points of the generator and sensor, respectively, and where P' is represented in the generator's coordinate frame, having its origin at O'. The rotation of the sensor's coordinate frame with respect to the generator's coordinate frame (e.g., an angle of intersection between the x-axis of the sensor's coordinate frame and the x'-axis of the generator's coordinate frame) is defined by the angle of rotation ψ' measured from the x'-axis. Using polar coordinates, the sensor's position and rotation may be defined by azimuth angle α' measured from the x'-axis, the distance ρ' (length of r'), and ψ', respectively, as defined with respect to the generator's coordinate frame.

In FIG. 4B, position and rotation of the generator are represented in sensor coordinates by a position vector r=$\overrightarrow{OP}$ where O and P denote the magnetic center points of sensor and the generator, respectively, and where P is represented in the sensor's coordinate frame, having its origin at O. The rotation of the generator's coordinate frame with respect to the sensor's coordinate frame (e.g., an angle of intersection between the x'-axis of the generator's coordinate frame and the x-axis of the sensor's coordinate frame) is defined by the angle of rotation ψ measured from the x-axis. Using polar coordinates, the generator's position and rotation may be defined by azimuth angle α measured from the x-axis, the distance ρ (length of r), and ψ, respectively, as defined with respect to the sensor's coordinate frame.

Figure 4D:
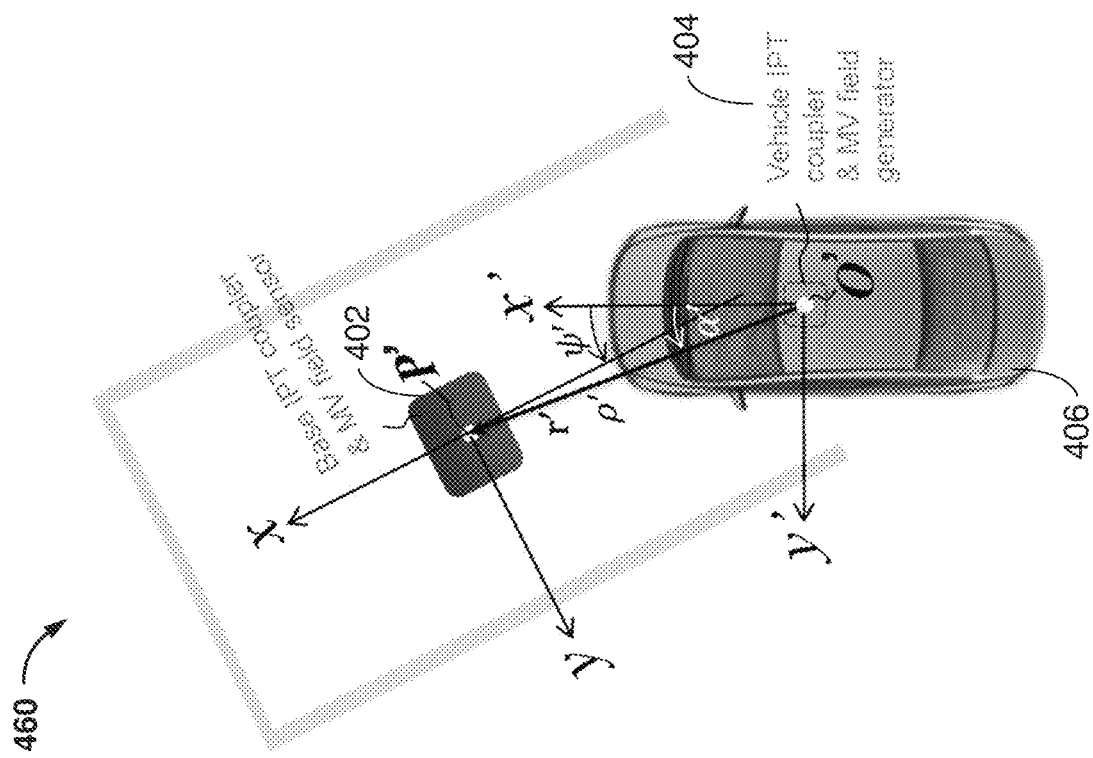
FIG. 4D illustrates a positional relationship between of a vehicle-based magnetic field generator and a ground-based magnetic field sensor installed in a parking stall, the sensor's position and rotation represented in the generator's coordinate frame.
Figure 4C:
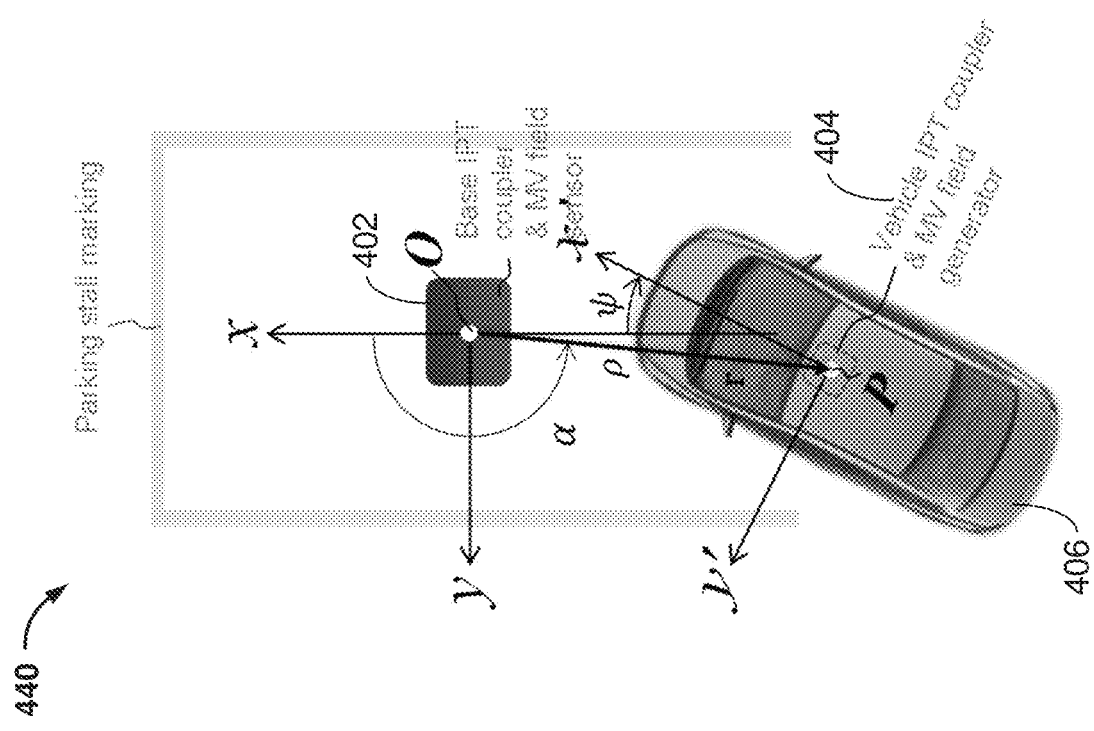
FIG. 4C illustrates a positional relationship between a vehicle-based magnetic field generator and a ground-based magnetic field sensor installed in a parking stall, the generator's position and rotation represented in the sensor's coordinate frame.

FIGS. 4C and 4D illustrate a positional relationship between a vehicle-mounted generator and ground-based sensor, in accordance with some implementations. In FIG. 4C, position and rotation of the generator are represented in sensor coordinates by a position vector r=$\overrightarrow{OP}$ where O and P denote the magnetic center points of sensor and the generator, respectively, and where P is represented in the sensor's coordinate frame, having its origin at O. The rotation of the generator's coordinate frame with respect to the sensor's coordinate frame (e.g., an angle of intersection between the x'-axis of the generator's coordinate frame and the x-axis of the sensor's coordinate frame) is defined by the angle of rotation ψ measured from the x-axis. Using polar coordinates, the generator's position and rotation may be defined by azimuth angle α measured from the x-axis, the distance ρ (length of r), and ψ, respectively, as defined with respect to the sensor's coordinate frame.

In FIG. 4D, position and rotation of the sensor are represented in generator coordinates by a position vector r'=$\overrightarrow{O'P'}$ where O' and P' denote the magnetic center points of the generator and sensor, respectively, and where P' is represented in the generator's coordinate frame, having its origin at O'. The rotation of the sensor's coordinate frame with respect to the generator's coordinate frame (e.g., an angle of intersection between the x-axis of the sensor's coordinate frame and the x'-axis of the generator's coordinate frame) is defined by the angle of rotation ψ' measured from the x'-axis. Using polar coordinates, the sensor's position and rotation may be defined by azimuth angle α' measured from the x'-axis, the distance ρ' (length of r'), and ψ', respectively, as defined with respect to the generator's coordinate frame.

Figure 5:
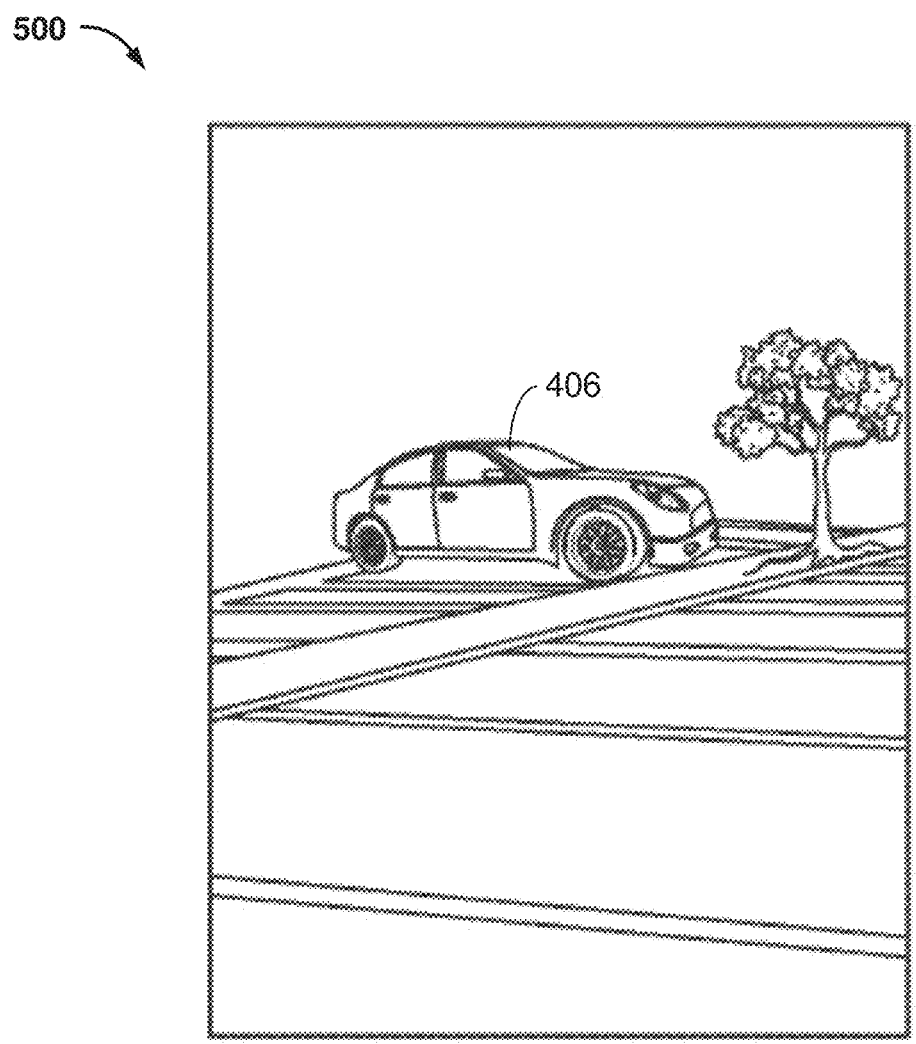
FIG. 5 is an illustration of a vehicle in a parking lot including structures and parking lot markings that can be used for positioning and aligning the vehicle.

In some guidance and alignment implementations, the positional relationship between generator and sensor includes the position vector (e.g., r) but excludes the rotation angle (e.g., ψ). This partially defined positional relationship may apply, e.g., in a system where the driver uses other information to align the vehicle 406 to the parking stall frame as required for proper parking, e.g., by using road markings, grass verges, curbstones, etc. as shown in FIG. 5.

In some other guidance and alignment implementations, the positional relationship excludes the parking sense of the vehicle (e.g., forward or reverse parking). This partially defined positional relationship may apply in a system where the parking sense of the vehicle does not matter (e.g., because base and vehicle IPT couplers are center mounted) or, if the parking sense matters, the driver uses other information to park the vehicle in the right sense, e.g., from markings, signs, knowledge of standard installation rules, etc.

Figure 6:
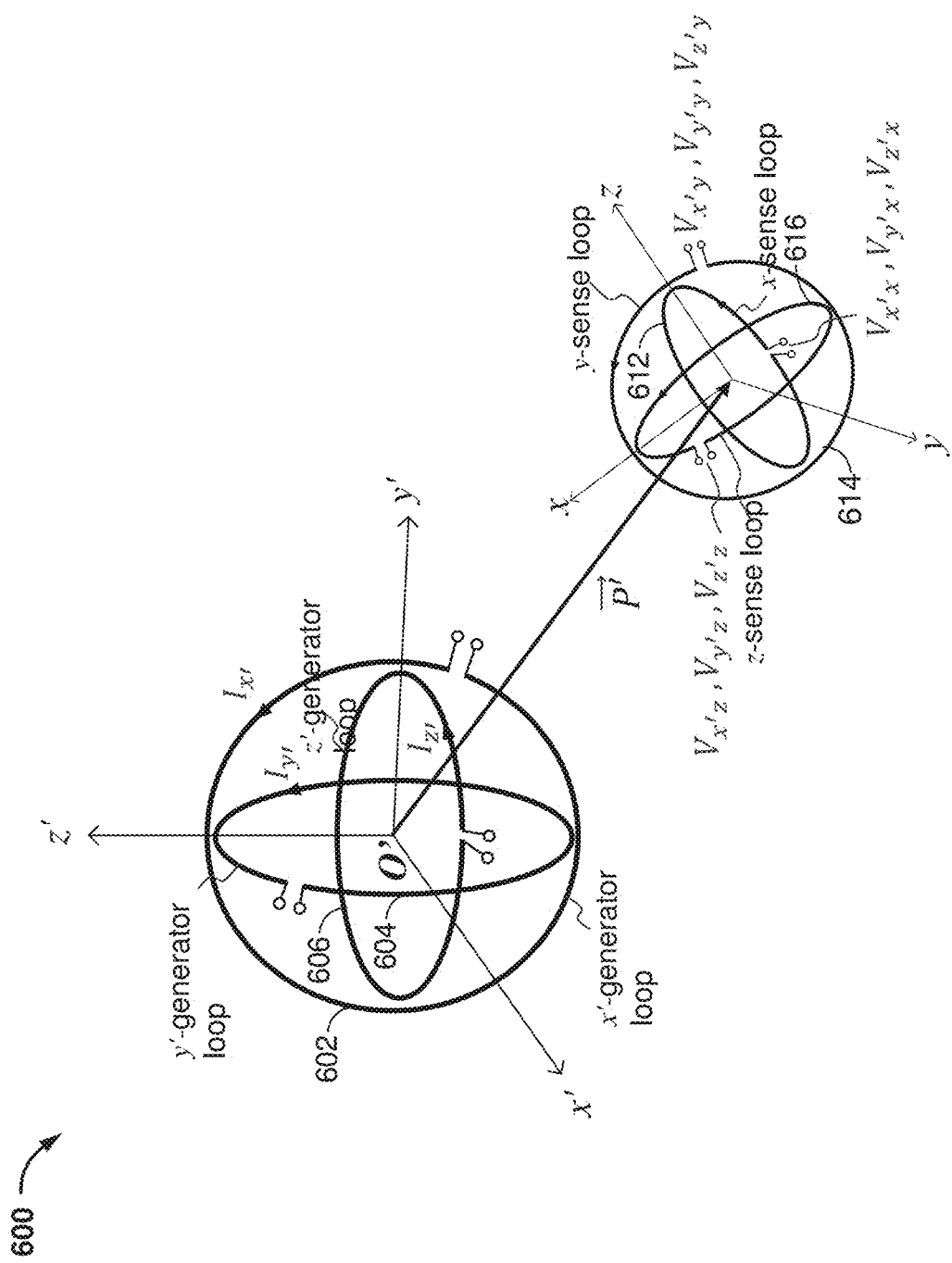
FIG. 6 illustrates a 3-axis magnetic field generator and a 3-axis magnetic field sensor based on an orthogonal arrangement of wire loops, in accordance with some implementations.

FIG. 6 illustrates a 3-axis magnetic field generator and a 3-axis magnetic field sensor based on an orthogonal arrangement of coils 602, 604, 606, 612, 614, 616 in accordance with some implementations. The coils 602, 604, 606, 612, 614, 616 may be multi-turn wire loops with or without a magnetic core. The generator coils 602, 604, 606 are arranged orthogonal to one another and are configured to be driven by respective currents $I_{x'}$, $I_{y'}$ and $I_{z'}$ to generate magnetic fields having magnetic moments in orthogonal directions, e.g., on a x'-, y'-, and z'-axis of the same generator coordinate frame previously described in connection with FIGS. 4A-4D. The same is true for the sense coils 612, 614, 616. If driven by respective currents, they would generate magnetic moments in orthogonal directions, e.g., on a x-, y-, and z-axis of the sensor's coordinate frame that may be arbitrarily rotated relative to that of the generator, as previously described in connection with FIGS. 4A-4D. In some implementations, the frequencies of oscillation of the currents $I_{x'}$, $I_{y'}$, and $I_{z'}$ may be low enough such that wavelengths of the magnetic fields generated by the generator coils 602, 604, 606 are much larger than a distance separating the generator from the sensor. Moreover, dimensions of the generator coils 602, 604, 606 and the sense coils 612, 614, 616 in the plane in which each is wound are much smaller than the distance separating the generator from the sensor. However, in operation, magnetic flux from the magnetic fields generated by the generator coils 602, 604, 606 may flow through the sense coils 612, 614, 616 (e.g., first sense coil 612, second sense coil 614, and third sense coil 616) and generate respective voltages across the terminals of each of the sense coils 612, 614, 616. For mathematical treatment, these voltage components may be written as a triple of three-dimensional vectors:

$$V_{x'} = \begin{bmatrix} V_{x'x} \\ V_{x'y} \\ V_{x'z} \end{bmatrix}, \quad V_{y'} = \begin{bmatrix} V_{y'x} \\ V_{y'y} \\ V_{y'z} \end{bmatrix}, \quad V_{z'} = \begin{bmatrix} V_{z'x} \\ V_{z'y} \\ V_{z'z} \end{bmatrix} \quad (1)$$

where $V_{x'}$, $V_{y'}$, $V_{z'}$ denote the voltage vector produced by the field generated by the x'-, y'-, and z'-generator coils 602, 604, 606, respectively.

The coil currents $I_{x'}$, $I_{y'}$, $I_{z'}$ generating the three magnetic moments in the x'-, y'-, and z'-direction may be also represented in vector form as:

$$I_{x'} = \begin{bmatrix} I_{x'} \\ 0 \\ 0 \end{bmatrix}, \quad I_{y'} = \begin{bmatrix} 0 \\ I_{y'} \\ 0 \end{bmatrix}, \quad I_{z'} = \begin{bmatrix} 0 \\ 0 \\ I_{z'} \end{bmatrix}. \quad (2)$$

Provided that the currents $I_{x'}$, $I_{y'}$, and $I_{z'}$ generate magnetic moments of equal strength in all three orthogonal directions, Equation (3) may be assumed:

$$I_{x'} = I_{y'} = I_{z'} = I \quad (3)$$

Figure 7A:
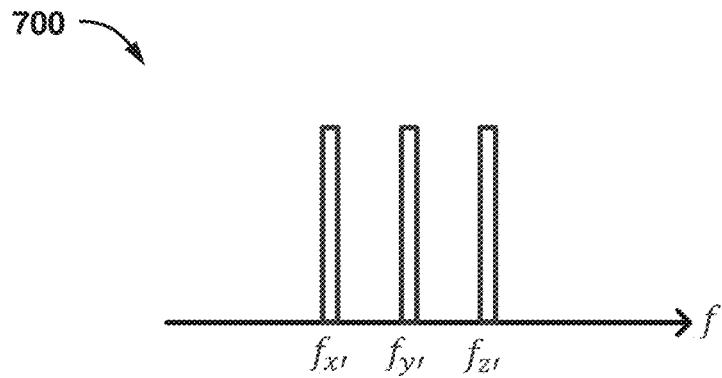
FIG. 7A illustrates a plurality of frequencies for use in frequency-division magnetic field multiplexing, in accordance with some implementations.

FIG. 7A illustrates a plurality of frequencies 700 for use in frequency-division magnetic field multiplexing, in accordance with some implementations. As shown in FIG. 7A, in order to differentiate between the magnetic field components generated by each of the generator coils 602, 604, 606, each of the generator coils 602, 604, 606 may be concurrently driven with currents oscillating at respective frequencies $f_{x'}$, $f_{y'}$, and $f_{z'}$, respectively. In some implementations, $f_{x'}$, $f_{y'}$, and $f_{z'}$ may be equally spaced in frequency.

Figure 7B:
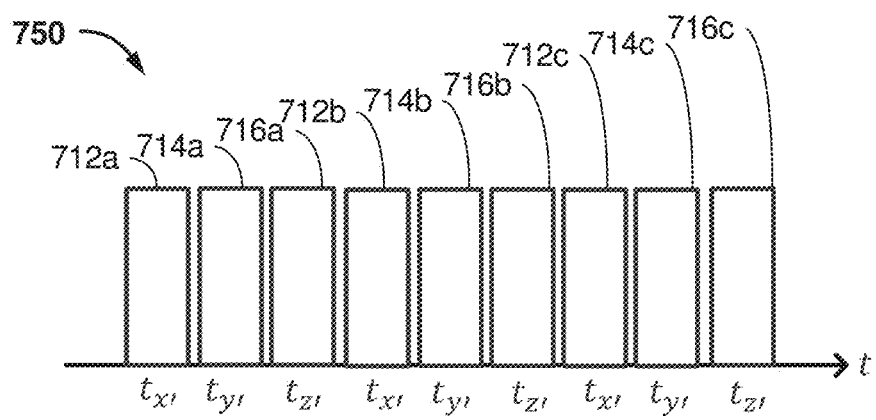
FIG. 7B illustrates a plurality of time slots for use in time-division magnetic field multiplexing, in accordance with some implementations.

FIG. 7B illustrates a plurality of time slots 750 for use in time-division magnetic field multiplexing, in accordance with some implementations. Time-division multiplexing schemes (TDM) may be utilized to generate magnetic field beacon signals with magnetic moments in different axis directions. As opposed to frequency-division multiplexing (FDM), magnetic field beacon signals may be generated and transmitted sequentially in different time slots in a repetitive fashion. In some implementations, each of the generator coils 602, 604, 606 are driven sequentially, during respective time slots. For example, time slots 712a, 712b, 712c may be time slots during which the generator coil 602 (e.g., x' coil) is driven, time slots 714a, 714b, 714c may be time slots during which the generator coil 604 (e.g., y' coil) is driven, and time slots 716a, 716b, 716c may be time slots during which the generator coil 606 (e.g., z' coil) is driven. A group of time slots (e.g., time slots 712a, 714a, 716a, respectively denoted as $t_{x'}$, $t_{y'}$ and $t_{z'}$ for a 3-axis generator) of a repetition period may be called a frame. In some implementations, the frame duration may correspond to the position data update period of the magnetic field positioning system, e.g., 200 ms (5 position updates per second). Frame synchronization of the magnetic field positioning receiver may be achieved, e.g., by transmitting in-band a synchronization signal such as a pseudo-random sequence from time to time (see FIG. 24), temporarily omitting the ordinary beacon signal transmissions, or out-of-band using a different carrier.

Figure 7C:
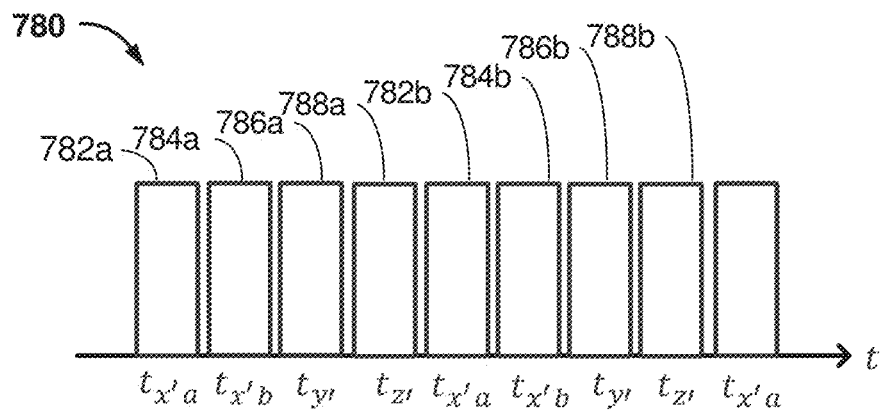
FIG. 7C illustrates a plurality of time slots for use in time-division magnetic field multiplexing, in accordance with some other implementations.

Alternatively, an extra time slot may be added to each frame for purposes of frame synchronization. In some implementations of a 3-axis generator system, at least one of a x'-, y'- and z'-magnetic field signal is transmitted in two time slots as illustrated in FIG. 7C. FIG. 7C illustrates a plurality of time slots 780 for use in time-division magnetic field multiplexing, in accordance with some other implementations. For example, time slots 782a, 782b, 784a, 784b may be time slots during which the generator coil 602 (e.g., x' coil) is driven, time slots 786a, 786b may be time slots during which the generator coil 604 (e.g., y' coil) is driven, and time slots 788a, 788b may be time slots during which the generator coil 606 (e.g., z' coil) is driven. The signal transmitted in time slot 782a, 782b (e.g., $t_{x'a}$) may be used to mark the start of each frame. This signal may differ from the signals transmitted in the other time slots so as to be distinguishable by the receiver as the start of a frame, even if it is altered in some way by the transmission channel.

In some other implementations, some other multiplexed format may be utilized that allows separation of the voltage components induced into each of the three sense coils 612, 614, 616 (e.g., x, y, and z coils respectively). Other multiplexed formats may use: code division multiplexing (CDM), frequency hopping, swept frequency, orthogonal frequency division multiplexing (OFDM), or the like.

Figure 8:
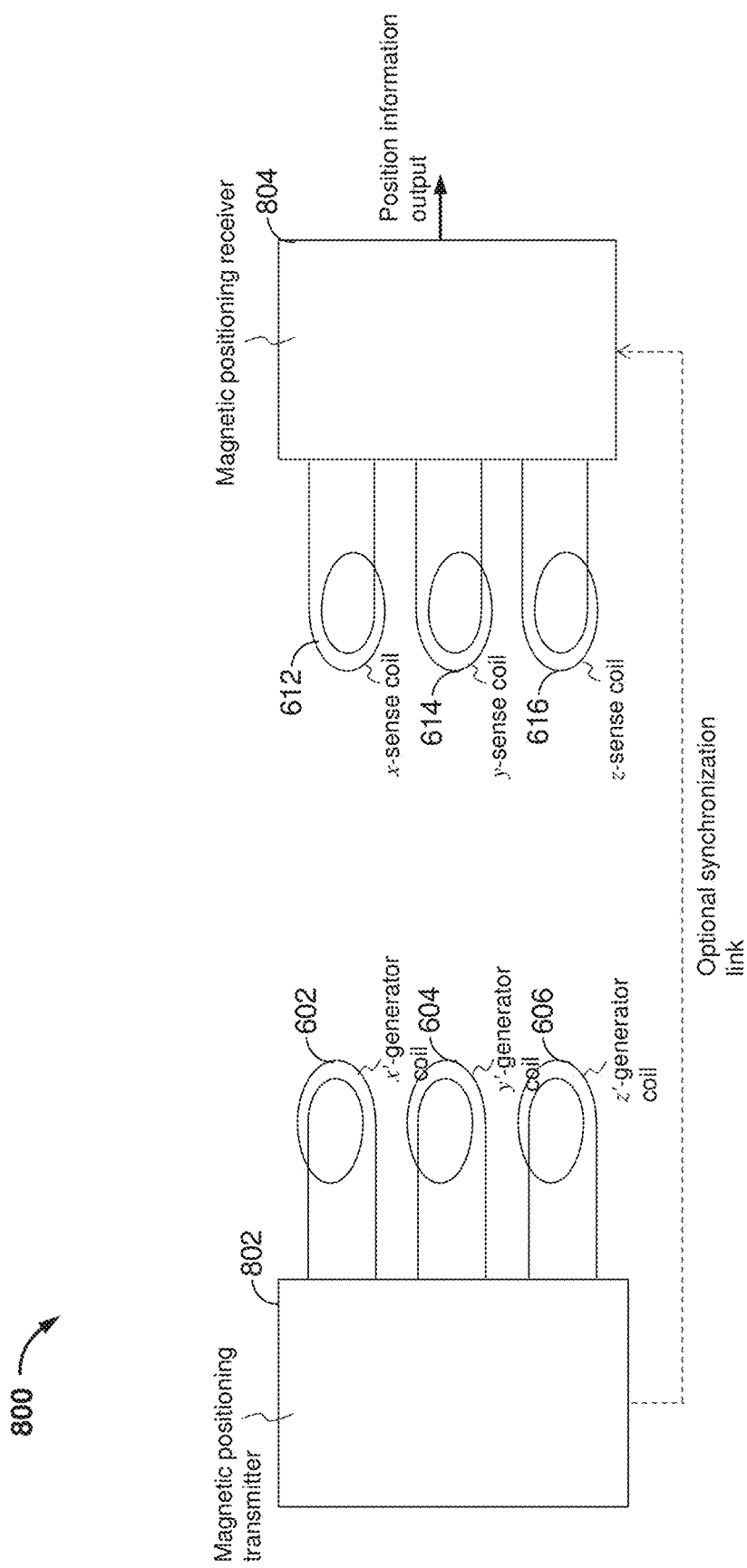
FIG. 8 illustrates a block diagram of a magnetic field position-finding system, in accordance with some implementations.

FIG. 8 illustrates a block diagram of a magnetic field position-finding system 800, in accordance with some implementations. The system 800 comprises a 3-axis generator 802 configured to drive each of the generator coils 602, 604, 606 with respective current signals. The system 800 additionally comprises a 3-axis sensor 804 configured to receive a plurality of voltage signals from the sense coils 612, 614, 616, where the voltage signals are induced in the sense coils 612, 614, 616 by magnetic flux, generated by the generator coils 602, 604, 606 passing though the sense coils 612, 614, 616.

Using a 3-axis generator 802 and a 3-axis sensor 804, as shown in FIG. 8 for example, it is possible to determine a bi-ambiguous position and a non-ambiguous direction to the sensor from the generator's coordinate frame in the full 3D space up to a radius that is limited by the performance characteristics of the system. However, this bi-ambiguity cannot be further resolved using information available in the sensed magnetic field components.

Figure 9:
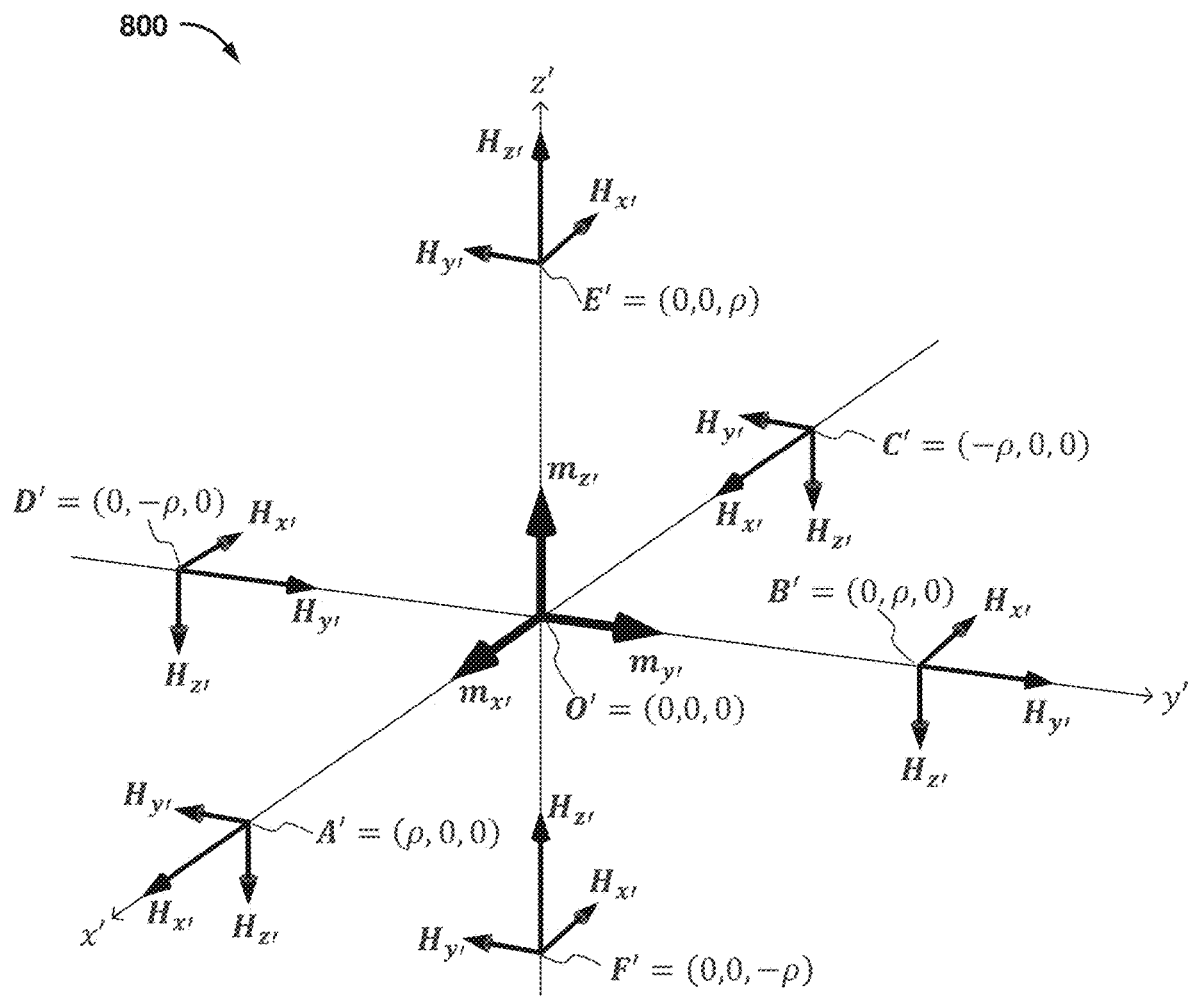
FIG. 9 illustrates magnetic moments of a magnetic field generated by a 3-axis generator and the resulting magnetic field vector triples at each of six different on-axis positions, in accordance with some implementations.

This bi-ambiguity issue is illustrated by example in FIG. 9. FIG. 9 illustrates magnetic moments $m_{x'}$, $m_{y'}$, $m_{z'}$ of a magnetic field generated by a 3-axis generator (e.g., such as that shown in FIG. 8) and the resulting magnetic field vector triples ($H_{x'}$, $H_{y'}$, $H_{z'}$) at each of six different on-axis positions A', B', C', D', E', F', in accordance with some implementations. The magnetic moment vectors $m_{x'}$, $m_{y'}$, $m_{z'}$ are illustrated at the origin of the generator coordinate frame O'=(0, 0, 0) and the resulting magnetic field vector triples $H_{x'}$, $H_{y'}$, $H_{z'}$ at the six equidistant on-axis points A'=(ρ, 0,0), B'=(0, ρ, 0), C'=(−ρ, 0,0), D'=(0, −ρ, 0), E'=(0,0, ρ), F'=(0,0, −ρ). At each of these six on-axis points, the vector triple comprises a vector in a radial direction (e.g., $H_{x'}$ for point A') resulting from the on-axis moment and two other vectors (e.g., $H_{y'}$, $H_{z'}$ for point A') in directions tangential to the radial directions resulting from the two other magnetic moments pointing in perpendicular directions. It can be seen that an ambiguous position always comprises two diametrically opposed (antipodal) positions, which may be mathematically expressed using position vectors in Equation (4) below:

$$r'_1 = -r'_2 \quad (4)$$

It can be shown that Equation (4) is also true for any off-axis position (not shown in FIG. 9). For each antipodal point pair there exists a unique vector triple that may be represented in terms of H-field vectors $H_{x'}$, $H_{y'}$, $H_{z'}$ or in terms of voltage vectors $V_{x'}$, $V_{y'}$, $V_{z'}$ induced in the sense coils 612, 614, 616 assuming the sense coils 612, 614, 616 are orthogonally placed. A vector triple forms a tetrahedron that is defined by six quantities, e.g., the three voltage vector magnitudes, which may be expressed as scalar (dot) products $|V_{x'}| = V_{x'} \cdot V_{x'}$, $|V_{y'}| = V_{y'} \cdot V_{y'}$, $|V_{z'}| = V_{z'} \cdot V_{z'}$, and the three angles between the three voltage vectors as obtained from the three scalar products $V_{x'} \cdot V_{y'}$, $V_{x'} \cdot V_{z'}$, $V_{y'} \cdot V_{z'}$.

It is evident that these 6 quantities and thus the shape of the tetrahedron are invariant to any rotation of the three-axis sensor. Therefore, an antipodal position pair can be determined based on the 6 quantities for any rotation of the sensor. The three vector magnitudes $|V_{x'}|$, $|V_{y'}|$, $|V_{z'}|$ alone can provide an ambiguous position with one solution in each octant and six of these position ambiguities can be resolved by using the sign of any two of the three scalar products, as shown in Table 1.

TABLE 1

| Octant | x' | y' | z' | $V_{x'} \cdot V_{y'}$ | $V_{x'} \cdot V_{y'}$ | $V_{x'} \cdot V_{y'}$ |
|---|---|---|---|---|---|---|
| 1 | + | + | + | + | + | + |
| 2 | − | + | + | − | + | − |
| 3 | − | − | + | + | − | − |
| 4 | + | − | + | − | − | + |
| 5 | + | + | − | + | − | − |
| 6 | − | + | − | − | − | + |
| 7 | − | − | − | + | + | + |
| 8 | + | − | − | − | + | − |

For example, if the signs of $V_{x'} \cdot V_{y'}$ and $V_{x'} \cdot V_{z'}$ are both positive, the sensor is located either in octant 1 or octant 7. From Table 1 it can be easily seen that the third scalar product ($V_{y'} \cdot V_{z'}$ in the example of Table 1) does not bring any more information, thus it is redundant. However, it may be used to improve a position estimate in the case of voltage vector corruption by noise.

The residual bi-ambiguity may be eliminated by using a physical restriction of the location of the sensor relative to the generator. Such a physical restriction may be z'>0, meaning that the system is configured to return only determinations where the sensor is located in the z'>0 half space. In such implementations, any position except positions on or near the x'-y'-plane where z' is virtually zero may be principally determined unambiguously.

From FIG. 9 it can be easily seen that the residual bi-ambiguity of a 3-axis generator and a 3-axis sensor positioning system cannot be resolved by restricting the direction (rotation) of the sensor, e.g., φ'=0, θ'=0, ψ'=0, where φ', θ', and ψ' denote the roll, pitch, and azimuth (yaw) rotation angles, respectively, of the sensor relative to the generator's frame.

Moreover, the magnetic vector field patterns as obtained in a real magnetic vectoring system for vehicle positioning may be significantly distorted as compared to patterns obtained with ideal magnetic dipoles. Such distortion of the magnetic vector field pattern may occur if the size of the generator coils 602, 604, 606 and/or the sense coils 612, 614, 616 are similar to the distance between them. Presence of the vehicle metallic chassis (underbody structure), a conductive ground, e.g., a ferroconcrete ground, and any other large metallic structures that may be located in the path between generator and sensor may also distort the magnetic dipole field. Practical tests in real environments however have shown that the basic field characteristics (field topology) resembles that of a dipole field and that the general findings on position ambiguity and resolution disclosed and discussed herein are also applicable to real vector fields. Though, special measures and algorithms for position and direction finding will be required to cope with field distortion of real environments.

One difficulty associated with quasi-static magnetic field (e.g., near field) positioning techniques based on sensing an alternating magnetic field is the requirement for synchronization between the magnetic field generator and the magnetic field sensor. Absence of any synchronization information may lead to a signal polarity ambiguity issue. Though related in some situations, this polarity ambiguity issue should not be confused with the position ambiguity described above.

A magnitude, an orientation and a sense (polarity) may be attributed to a vector. Two vectors a and b may have equal length, equal orientation but an opposite sense (polarity), e.g., a=−b. Orientation and sense together define the direction of a vector. Without supplementary synchronization information it may be impossible to determine the polarity of the sensed magnetic field vector in correct relation to the polarity of the magnetic moment of the generating magnetic field, e.g., as shown in FIG. 9. Polarity ambiguity is particularly an issue of magnetic field transmissions that are substantially unmodulated or narrowband modulated sinusoidal (harmonic) carrier signals. For sinusoidal carrier signals the polarity ambiguity may be called a 180°-phase ambiguity.

The 180° phase ambiguity is one problem associated with the magnetic radio compass, which has been used for radio direction finding, e.g., in nautical and aeronautical navigation systems. FIG. 10A illustrates a magnetic radio compass 1000 using an x-y-oscilloscope, in accordance with some implementations. The radio compass uses an oscilloscope to display bearing information. The concept of an "old" radio compass is used and described herein for solely explanatory purposes. FIG. 10A shows sinusoidal voltage signals $v_x(t)$ and $v_y(t)$ as induced in and received from the x- and y-sense coils (e.g., the sense coils 612, 614) that may be expressed according to Equations (5) and (6):

$$v_x(t) = V_x \sin(\omega t + \delta_x) \quad (5)$$

$$v_y(t) = V_y \sin(\omega t + \delta_y) \quad (6)$$

The sinusoidal voltage signals $v_x(t)$ and $v_y(t)$ are connected to the x- and y-channel of an oscilloscope so that they deflect the light point on the screen in the x-direction and y-direction, respectively. $V_x$ and $V_y$ denote the peak amplitude of the x- and y-components, respectively, which are generally different from one another and proportional to the amplitudes of the x- and y-component of the magnetic field at the location of the sense coils 612, 614, assuming a homogenous field distribution over the area of the sense coils.

The graph displaced on the screen of the scope and as perceived by the human eye is an ellipse. The ellipse is produced by the combined effect of the two deflecting signals $v_x(t)$ and $v_y(t)$ having the same angular frequency $\omega$ but different phase angles in general ($\delta_x \neq \delta_y$). This ellipse is also known as a Lissajous graph and results from a system of parametric equations such as those given in Equations (5) and (6). For a perfect sense circuitry and oscilloscope the phase angles are equal ($\delta_x = \delta_y$) and the ellipse collapses into a straight line segment. The long axis of the ellipse indicates the orientation of the magnetic field vector, provided that the terminals of the sense coils and the inputs of the oscilloscope are connected in the correct order. More precisely, the long axis of the ellipse indicates the projection of the magnetic field vector onto the x, y plane of the sensor's coordinate frame, assuming a 3D vector having a z-component as well. However, as opposed to a classical compass that senses the earth's static magnetic field, the radio compass cannot reveal the polarity of the magnetic field vector and thus cannot determine its direction. The two-dimensional (2D) magnetic radio compass concept may be extended to a 3D radio compass concept using an x-y-z-oscilloscope (not shown in FIG. 10A) and by additionally displaying the z-component, which may be defined by Equation (7) below:

$$v_z(t) = V_z \sin(\omega t + \delta_z) \quad (7)$$

Such a 3D radio compass would now display the image of an ellipsoid of rotation whose long axis indicates the orientation of the magnetic field vector. Again, $\delta_x = \delta_y = \delta_z$ may be assumed for the ideal case, so that the ellipsoid becomes a line segment with a certain length and orientation representing the magnetic field vector magnitude and orientation, respectively, in the sensor's coordinate frame. Still, the magnetic field vector polarity cannot be determined unless the sensor receives external synchronization information, e.g., a time instant, a phase value or the half cycle period where the signal is valid to read the polarity.

Figure 10B:
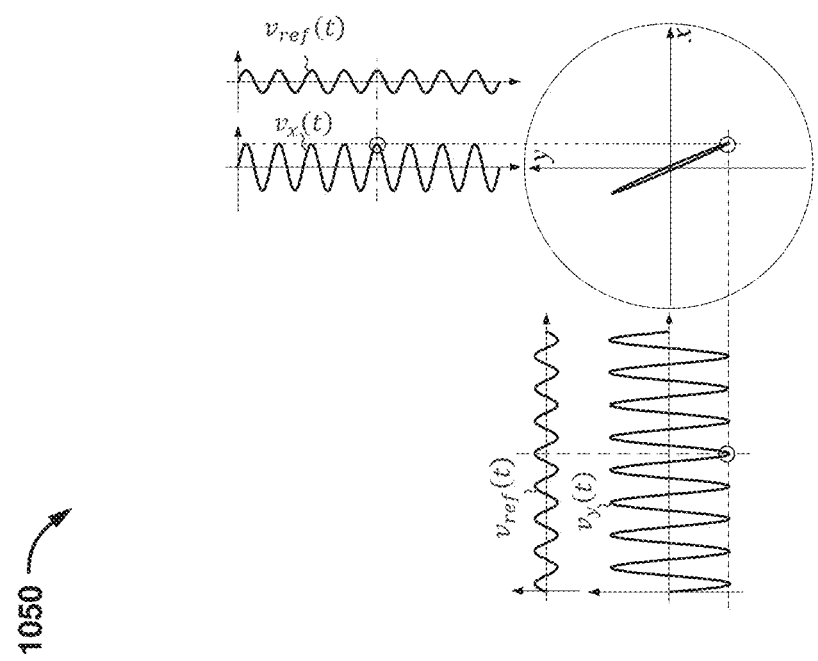
FIG. 10B illustrates a magnetic radio compass obtaining absolute phase information from a reference signal, in accordance with some implementations.
Figure 10A:
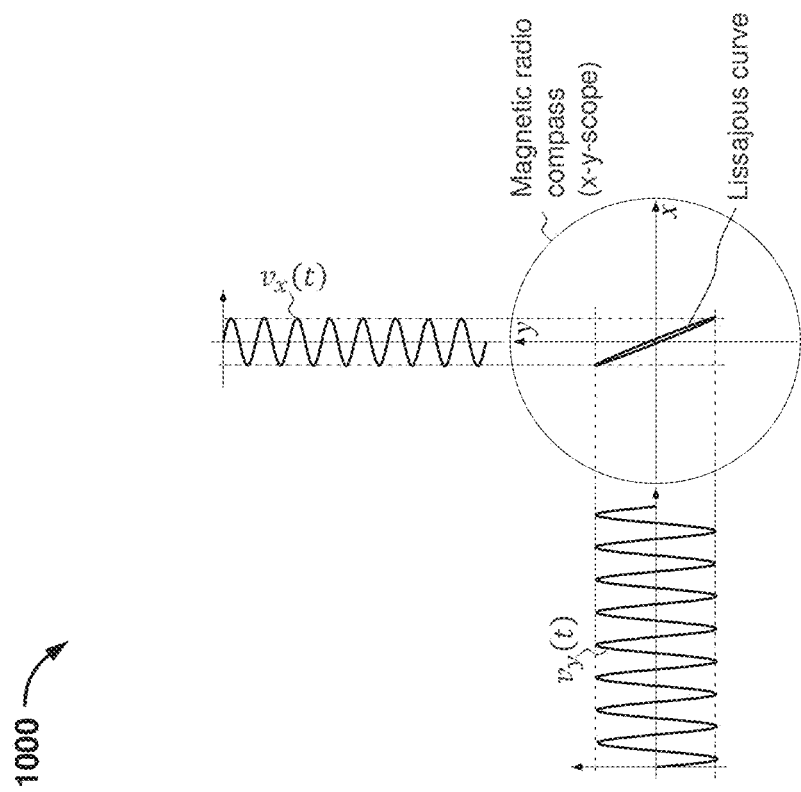
FIG. 10A illustrates a magnetic radio compass using an x-y-oscilloscope, in accordance with some implementations.

FIG. 10B illustrates a magnetic radio compass 1050 obtaining absolute phase information from a reference signal, in accordance with some implementations. In theory, a sinusoidal time synchronization reference signal $v_{ref}(t)$ may be transmitted through a separate channel whose phase is not affected by the position and rotation of the sensor's coordinate frame. Marking (or measuring) $v_x(t)$ and $v_y(t)$ at specific time instances where the amplitude of the reference signal is, e.g., positive, as illustrated by the dashed lines and associated circles on the waveforms for $v_x(t)$ and $v_y(t)$ in FIG. 10B, would reveal the true polarity and thus the direction of the magnetic field vector.

Figure 11A:
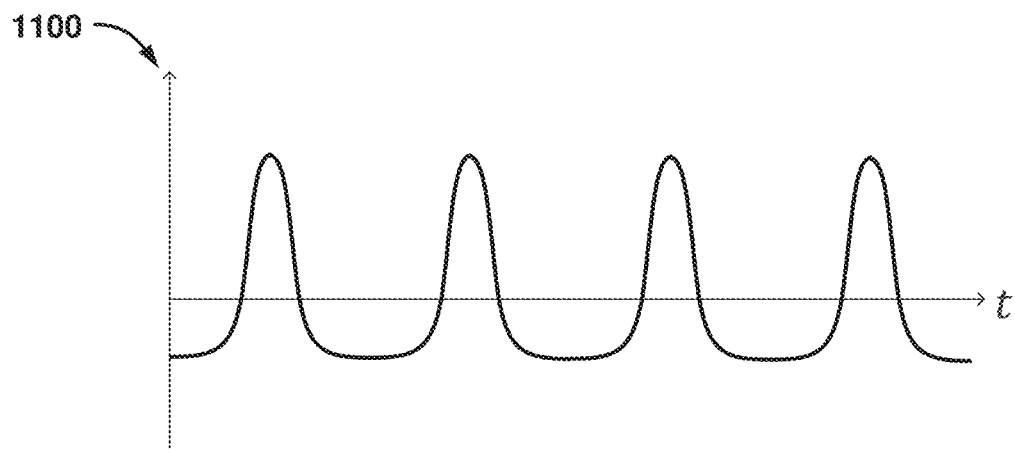
FIG. 11A shows a non-sinusoidal transmission signal suitable for resolving polarity ambiguity, in accordance with some implementations.

In some other implementations, a robust in-band synchronization may be accomplished using a magnetic field waveform whose induced voltage waveform (derivative with respect to the time) is easily distinguishable from its inverted replica for any time shift and also if corrupted by noise. Easily distinguishable may be quantified objectively by a correlation coefficient, e.g., <0.5, for any time shift. FIG. 11A shows a non-sinusoidal transmission signal 1100 suitable for resolving polarity ambiguity, in accordance with some implementations. Using such a signal 1100 (or a waveform having a similarly low correlation coefficient with its inverted replica for any time shift) may allow the system to resolve signal polarity regardless of the sensor's position, rotation or exposure to noise. However, waveforms with this property are non-sinusoidal which may be seen disadvantageous if there is only limited spectrum available for magnetic vectoring, e.g., 120-140 kHz, since such non-sinusoidal signals inherently comprise non-negligible signal energies in a wide range of harmonic frequencies.

Figure 11B:
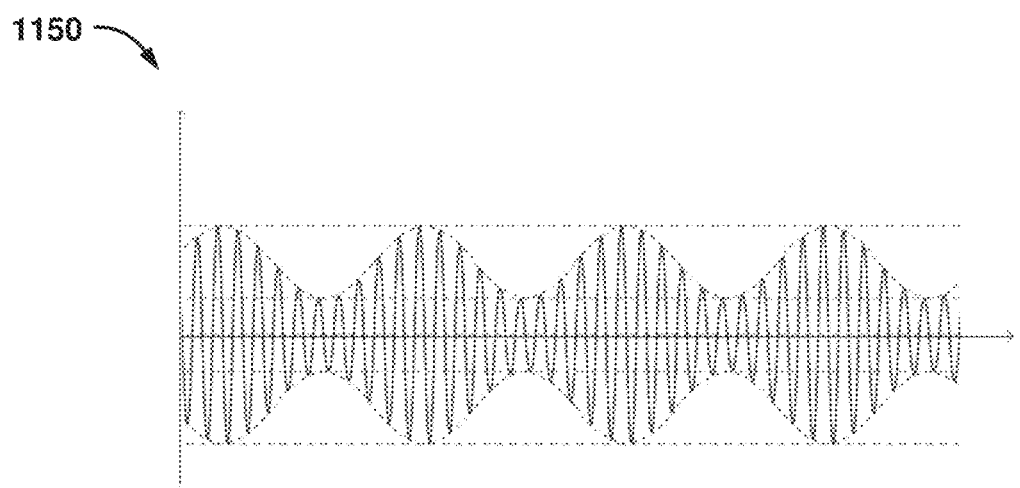
FIG. 11B shows an amplitude-modulated reference signal suitable for providing a receiver with synchronization information, in accordance with some implementations.

In yet other implementations, the magnetic field transmissions may be sinusoidal but a supplementary out-of-band reference signal at a carrier frequency significantly higher than the magnetic field frequency is transmitted. FIG. 11B shows an amplitude-modulated reference signal 1150 suitable for providing a receiver with synchronization information, in accordance with some implementations. This reference signal 1150 may be amplitude modulated (AM) with a waveform that is equal to the sinusoidal magnetic field transmission with respect to frequency and phase. Those skilled in the art will appreciate that the AM signal envelope remains largely unaffected by the typical signal propagation effects and the position and orientation of the antenna. The receiver may then employ simple envelope detection to obtain the required synchronization information. However, the need for a modulated out-of-band reference signal requiring extra hardware and antennas may be seen disadvantageous with respect to system complexity, cost and the requirement for additional frequency spectrum. Moreover, the available standard RF data communications may not be suitable for this purpose.

Analyzing the 3-axis generator/3-axis sensor problem, it has been discovered that the relative polarities between the three voltage vectors $V_{x'}$, $V_{y'}$, $V_{z'}$ are only needed to resolve ambiguity that is principally resolvable. A bi-ambiguous position can be determined by the three vector magnitudes $|V_{x'}|$, $|V_{y'}|$, $|V_{z'}|$ and the sign of the scalar product of two vector pairs as shown in Table 1 above. While the magnitudes neither depend on the sensor's rotation nor on the vectors' polarity, the sign of the scalar products do. More precisely, they depend on the relative polarity of the vectors $V_{x'}$ and $V_{y'}$. The sign of the scalar product, e.g., $V_{x'} \cdot V_{y'}$ would change if the polarity of one of the vectors was changed, e.g., $(-)V_{x'} \cdot V_{y'}$. However, it would not change if the polarity of both vectors was changed, e.g., $(-)V_{x'} \cdot (-)V_{y'}$. Therefore, for a 3-axis generator/3-axis sensor system using sinusoidal transmissions, the receiver only needs information about the relative phases between the x'-, y'- and z'-magnetic field signals (e.g., what the phases are relative to one another rather than their absolute phases). Absolute phase information may not be needed. This however does not exclude implementations where absolute phase information is used, e.g., to improve a position estimate in the presence of noise.

Provided that a relative phase relationship between the three signals is established, flipping the polarity of all signals, e.g., as would exist for a 180° absolute phase ambiguity, would result in the same position estimate. Changing all signal polarities at the same time may be seen as mirroring an entire vector triple forming a mirrored tetrahedron. It can be shown that there exists no position pair in a 3D space where the vector triples, as produced at a first position, is a mirrored version of the vector triple at a second position. Moreover, a mirrored vector triple cannot be produced by any rotation of the sensor about any axis. This is analogous to a right hand 3D coordinate frame that cannot be changed into a left hand 3D frame by rotation. However, this may not necessarily always be true for a 2-axis generator/3-axis sensor system, as will be described below.

Figure 12:
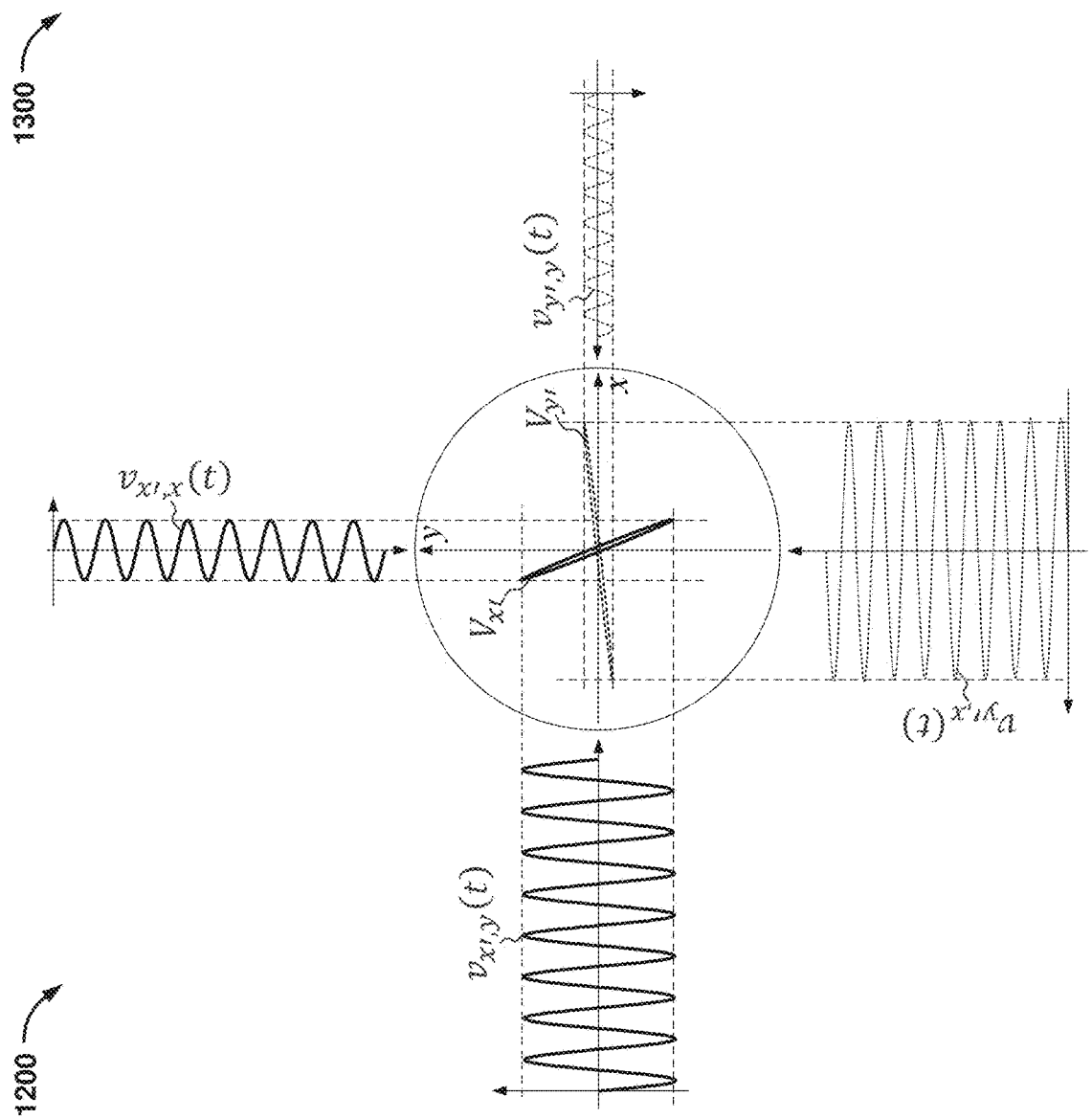
FIG. 12 illustrates a magnetic radio compass displaying orientations of two magnetic field vectors, in accordance with some implementations.

The difference between relative and absolute phase (polarity) synchronization can be illustrated using the concept of the "old" radio compass as shown in FIG. 12. FIG. 12 illustrates a magnetic radio compass 1200 displaying orientations of two magnetic field vectors, in accordance with some implementations. As opposed to the radio compass illustrated in FIG. 10A, the radio compass of FIG. 12 uses a four-channel oscilloscope connected to an analog circuitry having four outputs. The analog circuitry separates and amplifies the voltage signals $v_{x'x}(t)$ and $v_{y'x}(t)$ as induced into the x-sense coil (e.g., the coil 612) by the x'- and y'-magnetic field, respectively, as generated, e.g., at different frequencies. Likewise, this analog circuitry separates and amplifies the voltage signals $v_{x'y}(t)$ and $v_{y'y}(t)$ as induced into the y-sense coil (e.g., the coil 614) by the x'- and y'-magnetic field, respectively. The four channel oscilloscope is configured such that signals $v_{x'x}(t)$ and $v_{y'x}(t)$ deflect the light point in the x-direction and the signals $v_{x'y}(t)$ and $v_{y'y}(t)$ in the y-direction. If correctly wired, the displayed graph, as perceived by the human eye, indicates orientation of the x'- and y'-magnetic field vectors, separately, and more precisely their projection onto the x, y-plane, since the z-component is ignored.

Figure 13:
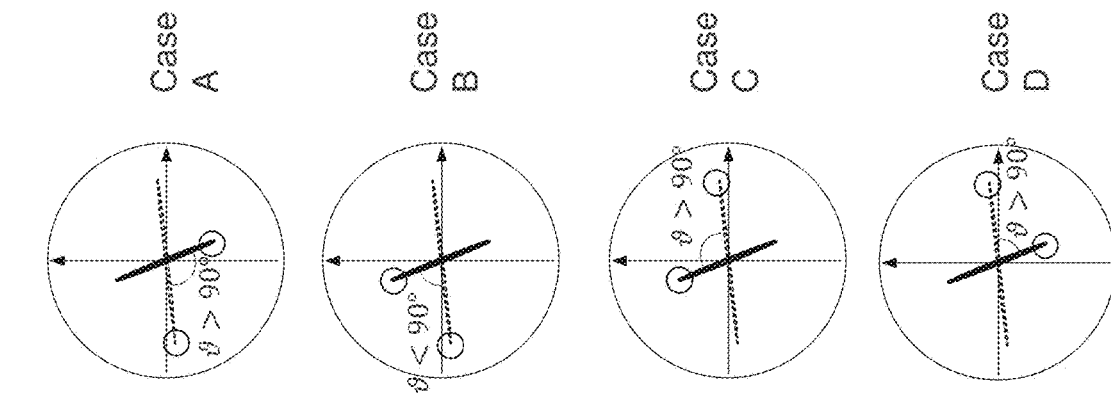
FIG. 13 shows the different combinations of magnetic vector polarity that may be resolved with supplementary synchronization information, in accordance with some implementations.

In the absence of any supplementary synchronization information, the 2-signal radio compass 1200 is not able to indicate a direction (polarity) of either of the two vectors. Since each vector has an ambiguous polarity, there exist four possible combinations of directions, as illustrated in FIG. 13. FIG. 13 shows the different combinations 1300 of magnetic vector polarity that may be resolved with supplementary synchronization information, in accordance with some implementations. FIG. 13 shows a case A, a case B, a case C, and a case D and uses circles to mark the heads of the two vectors previously described in connection with FIG. 13. Providing the radio compass 1200 with absolute phase information, the Lissajous graphs shown in each of cases A-D are marked in a manner such that all four cases can be distinguished. However, providing only relative phase information would still allow differentiation of case A from cases B and D but not from case C, for example. In other words, relative phase information allows the differentiation of those vector pairs that have an acute angle ($\vartheta<90°$) from those that have an obtuse angle ($\vartheta>90°$) between the vectors. Vector theory provides that an acute angle and an obtuse angle are equivalent to a positive scalar product and a negative scalar product, respectively. The sign of the scalar product and therefore relative phase (polarity) information suffices to resolve an ambiguous position between an acute angle and an obtuse angle between vectors at a first position and at a second position, respectively.

Figure 14:
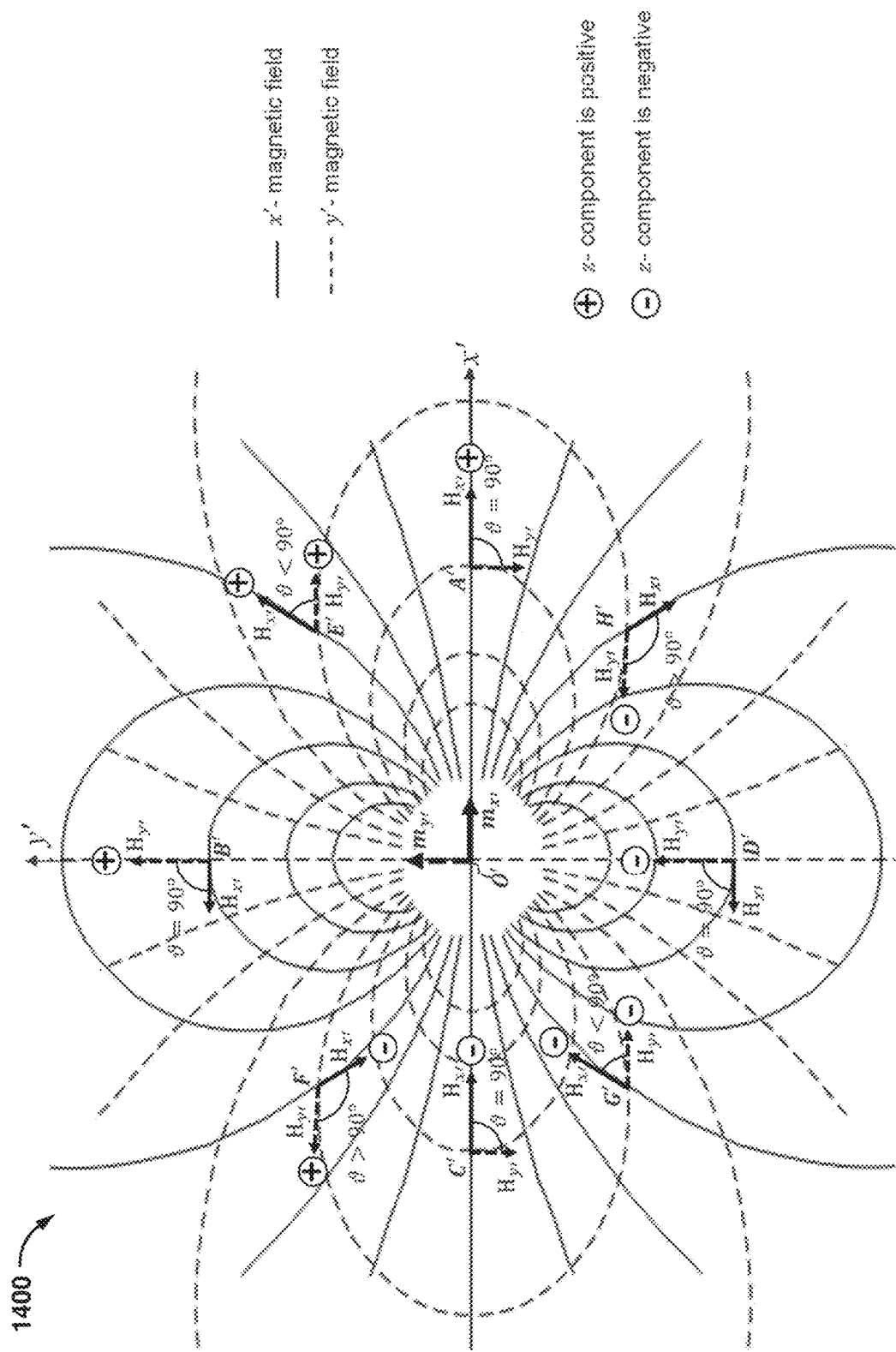
FIG. 14 displays field lines of a magnetic field generated by a 2-axis magnetic field generator and magnetic vector pairs present at 4 on-axis positions and 4 off-axis positions, in accordance with some implementations.

Different synchronization requirements may apply for a 2-axis generator/2-axis sensor or for a 3-axis generator/2-axis sensor system, as will be discussed below. In such configurations, knowledge of the absolute phase can help to resolve ambiguities, which will be shown for the application of vehicle positioning for wireless charging. FIG. 14 displays field lines of a magnetic field 1400 generated by a 2-axis magnetic field generator having magnetic moments $m_{x'}$ and $m_{y'}$ in accordance with some implementations. FIG. 14 also displays magnetic vector pairs present at 4 on-axis positions and 4 off-axis positions. The field pattern shown refers to a cut plane that is parallel to the x'-y'-plane and offset by a height $z'_0>0$. In some use cases of vehicle positioning, the x'-y'-plane may be considered the ground (or floor) and the offset plane at $z'_0$ the horizontal plane where the vehicle mounted sensor is located and in which it is moving. The magnetic moments $m_{x'}$ and $m_{y'}$ may refer to the magnetic moments of x'- and y'-generator coils 602, 604, respectively, as integrated into a base pad.

FIG. 14 also shows the horizontal (x'-, y'-) components of the magnetic field vectors $H_{x'}$ and $H_{y'}$ of the x'-, y'-magnetic field, respectively, as well as the angle $\vartheta$ between the two vectors at 8 selected points. The encircled ± sign indicates the sign of the vector's z'-component that is perpendicular to the x'-y'-plane. A + sign indicates a z'-component extending out the front of the page, while a sign indicates a z'-component extending out the back of the page. The 8 selected points comprise four on-axis points designated A', B', C', D' at equal distances from the origin O' and four off-axis points E', F', G', H' also the same distances from the origin O' and pairwise antipodal (e.g., diametric). As it can be seen in FIG. 14, vector pairs at on-axis points form an angle $\vartheta=90°$, while vector pairs at off-axis points show pairwise either an acute or obtuse angle (e.g., less than 90° and more than 90°, respectively). For the vehicle application, there are normally only three degrees of freedom for movement: the x'-y'-position and the azimuth (yaw) rotation angle $\psi'$, hence the following physical restrictions for the sensor's coordinate frame may apply:

$$z'\cong z'_0>0$$

$$\varphi'\cong 0$$

$$\theta'\cong 0$$

where $\varphi'\cong 0$ and $\theta'\cong 0$ refer to the vehicle's roll and pitch angles, respectively, which may be considered substantially zero.

By inspecting FIG. 14 it can be found that an unambiguous position can be determined using a 2-axis generator/3-axis sensor system, provided that the above physical restrictions apply. Non-antipodal vector pairs can be distinguished by the vectors' magnitudes $|H_{x'}|$, $|H_{y'}|$ and/or by the angle $\vartheta$, while the antipodal vector pairs whose horizontal components (e.g., $H_{x'}$ and $H_{y'}$) are the same can be distinguished by their vertical (z'-)component. It can also be found that distinction is possible for any azimuthal rotation $\psi'$ of the sensor with respect to the generator, provided that the vector's true direction (polarity) can be determined, e.g., based on absolute phase information. It can be found that no vector pair matches another vector pair if rotated by any azimuth angle $\psi'$ due to the z'-component.

Figure 15:
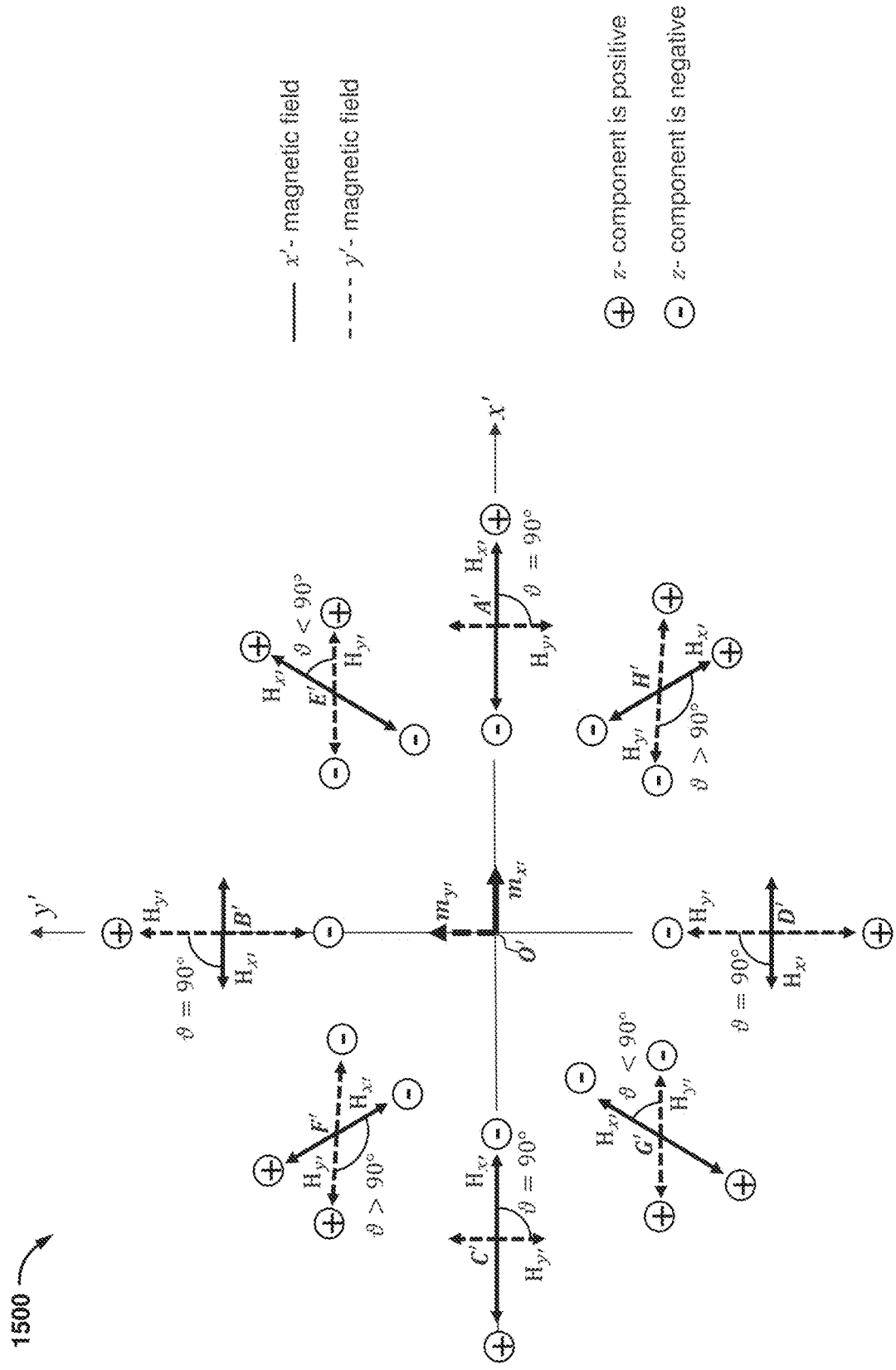
FIG. 15 illustrates vector polarity ambiguity in a system using a 2-axis generator and only relative phase synchronization, in accordance with some implementations.

FIG. 15 illustrates vector polarity ambiguity in a system 1500 using a 2-axis generator and only relative phase synchronization, in accordance with some implementations. In FIG. 15 vector polarity is ambiguous, as indicated by the double-arrows in opposite directions. Using this representation, it becomes evident that one vector pair matches another vector pair at the antipodal point when rotated by $\psi'=180°$. Hence there is a bi-ambiguity, e.g., position A' cannot be distinguished from C'. Without absolute phase information, this bi-ambiguity can only be resolved by introducing a further physical restriction either on the sensor's position, e.g., x'<0, or the sensor's rotation, e.g., $-90°<\psi'<90°$. In some applications of vehicle positioning there may be no need for resolving this bi-ambiguity. This may be true for systems that, for purposes of guidance and alignment, displays the position of the charging spot as seen from the vehicle, e.g., on a dashboard display. For such park assist applications, it may be acceptable that users cannot distinguish the two scenarios.

Figure 16A:
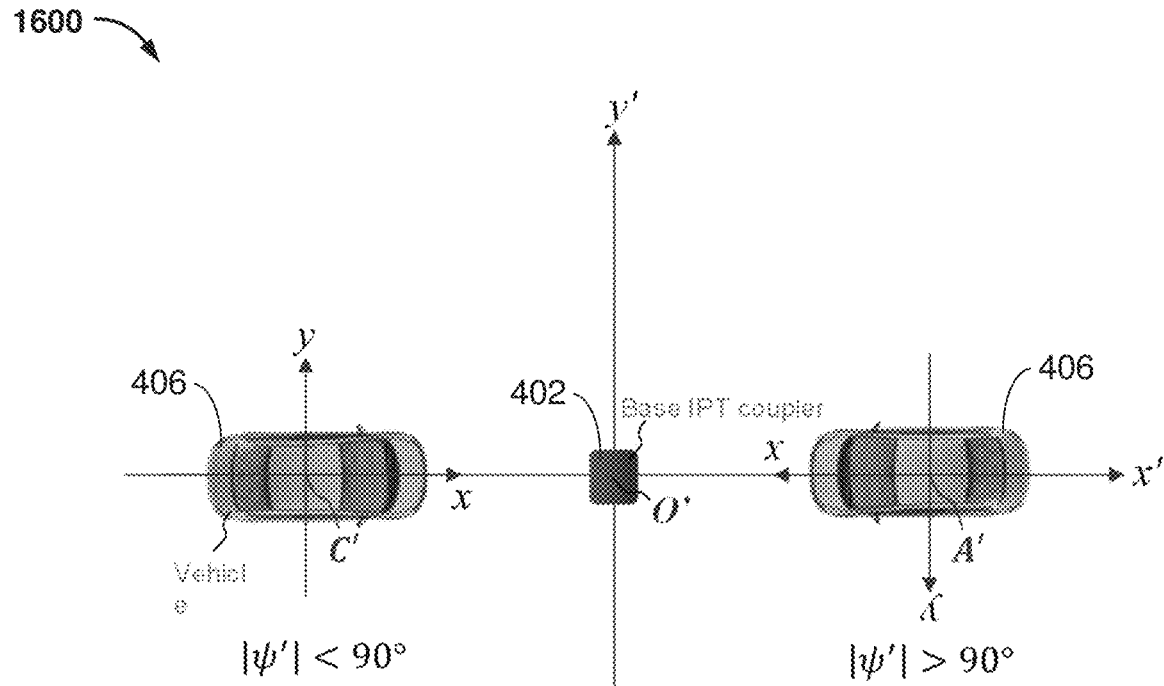
FIGS. 16A and 16B show vehicle parking scenarios that illustrate position and rotation ambiguity in a system using a 2-axis generator and only relative phase synchronization, in accordance with some implementations.
Figure 16B:
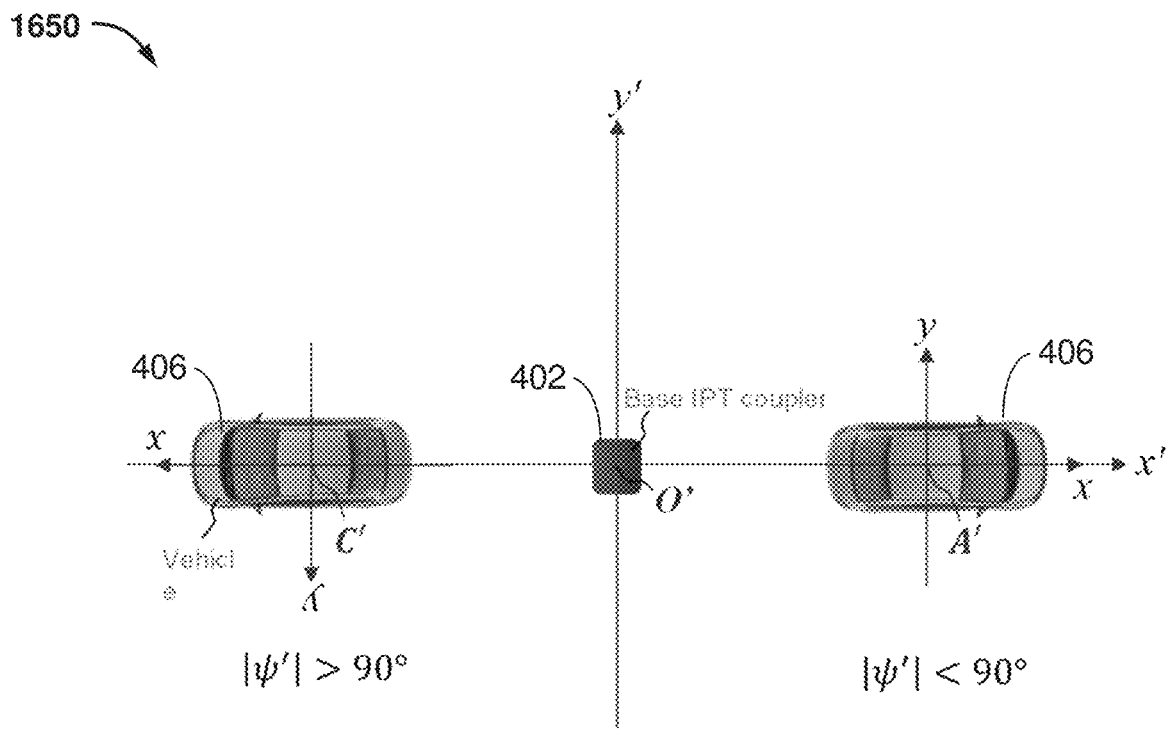

FIGS. 16A and 16B show vehicle parking scenarios 1600, 1650 that illustrate position and rotation ambiguity in a system using a 2-axis generator and only relative phase synchronization, in accordance with some implementations. FIG. 16A shows two positions of the vehicle 406 with respect to the base pad 402: at point A' heading essentially towards the base pad 402 ($|\psi'|<90°$), and at antipodal position C' heading essentially towards the base pad 402 ($|\psi'|>90°$). As per the above discussion, the vehicle 406 being located at either of points A' or C' would appear the same on an alignment display. However, in FIG. 16B, the user would get a different view for the two points A' and C'. Being able to distinguish between the ambiguous scenario of FIG. 16A and the ambiguous scenario of FIG. 16B is actually most important since the user needs to know whether a position of optimal alignment is located in front of (e.g., as in FIG. 16A) or behind (e.g., as in FIG. 16A) the vehicle 406 with respect to a forward direction of motion of the vehicle 406. This distinction is possible with only relative phase synchronization (as opposed to absolute phase synchronization) as long as the z'-component of the magnetic field can be sensed. This concept may be considered a partially defined positional relationship as described above where the driver cares about the direction of the vehicle 406 relative to the base pad 402 and thus relative to the parking stall.

Relative phase synchronization between the different magnetic field signals may be less demanding and less critical than absolute phase synchronization. This may be especially true if the system uses sinusoidal frequency multiplexed magnetic field transmissions and if out-of-band synchronization signaling is not an option. Using sinusoidal (e.g., multi-tone) transmissions can provide a system with low complexity, high spectral efficiency, and large dynamic range, e.g., to cope with the so-called "near-far" effects as are common for magnetic field transmissions that follow a third-power distance law (e.g., where magnetic field strength is proportional to the third power of the distance).

In a system using multi-tone signals, absolute phase synchronization may require timing accuracy of within a fraction of the cycle period, while relative phase synchronization may require a lower accuracy of within multiple cycle periods, depending on the actual frequency separation of the transmitted tones, the signal-to-noise ratio, and other synchronization requirements. This can be explained by the fact that the relative phase $\Delta\varphi$ between a signal with angular frequency $\omega_1$ and a signal with angular frequency $\omega_2$ evolves much slower than the absolute phase $\varphi$, provided that the angular frequency difference $|\Delta\omega|=|\omega_1-\omega_2|$ is much smaller than $\omega_1$ or $\omega_2$. This may be expressed mathematical terms, as shown in Equation 8.

$$\Delta\varphi(t)=|\Delta\omega|t<<\varphi(t)=|\omega_1|t \text{ for any } t\neq 0. \quad (8)$$

Figure 17:
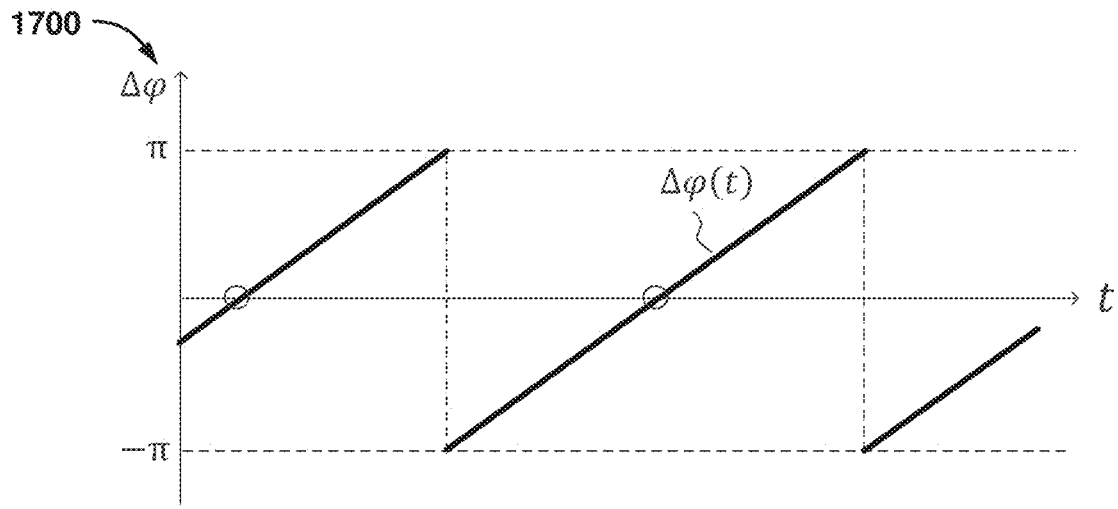
FIG. 17 displays a phase difference $\Delta\varphi$ of a double-tone signal as a function of time, in accordance with some implementations.

Since phases of the two signals evolve differently over time, determining a relative phase (relative polarity) between sinusoidal signals with different frequencies can only be performed at certain times and more precisely, during certain time intervals, which reoccur periodically. This is illustrated by the graph 1700 in FIG. 17, which displays the phase difference $\Delta\varphi$ of a double-tone signal as a function of time, in accordance with some implementations. Displaying the time-function of the relative phase $\Delta\varphi(t)$ in the form of $(\Delta\varphi(t) \text{ mod } 2\pi)-\pi$, where mod denotes the modulo function. FIG. 17 shows that the relative phase $\Delta\varphi(t)$ periodically returns to the same value, e.g., $\Delta\varphi=0$ with a period of $$\frac{2\pi}{\Delta\omega}.$$

In the following, relative phase synchronization will now be further discussed by assuming two sinusoidal signals with different angular frequencies and unknown polarity expressed by their peak amplitudes $(\pm)A_1$ and $(\pm)A_2$ and complex signal representation, as shown in Equations (9) and (10).

$$\underline{s}_1(t)=(\pm)A_1 \exp(j\omega_1 t), \quad (9)$$

$$\underline{s}_2(t)=(\pm)A_2 \exp(j\omega_2 t). \quad (10)$$

The relative polarity may be obtained from the sign of the product of $s_1(t)$ and the conjugate complex of $s_2(t)$ expressed as shown in Equation (11).

$$\text{sign}(\underline{s}_1(t_s)\cdot\underline{s}_2^*(t_s)) \quad (11)$$

at times, $t_s$, in periodically occurring intervals with a duration depending on the synchronization accuracy as required for a particular transmission scheme, choice of frequencies and the channel SNR.

Assuming an infinite SNR, the periodicity of times $t_s$ in Equation (11) may be as large as that defined by the inequality of Equation (12) below:

$$e\left(-j\frac{\pi}{2}\right) < e(j\omega_1 t_s)\cdot e(-j\omega_2 t_s) < e\left(j\frac{\pi}{2}\right). \quad (12)$$

We can define the phase difference $\Delta\varphi(t_s)$ by using the modulo function as shown in Equation (13), and using Equation (12), Equation (13) may be simplified to Equation (14):

$$\Delta\varphi(t_s) = \varphi_1(t_s) - \varphi_2(t_s) = (\omega_1 t_s \text{mod} 2\pi) - (\omega_2 t_s \text{mod} 2\pi) = \Delta\omega t_s \text{mod} 2\pi \quad (13)$$

$$|\Delta\varphi(t_s)| < \frac{\pi}{2}. \quad (14)$$

In low SNR conditions, the absolute value of the tolerable phase difference $\Delta\varphi_{max}$ may be only a fraction of $$\frac{\pi}{2}$$

Thus, the range for the tolerable phase difference $\Delta\varphi_{max}$ may be expressed as Equation (15) below:

$$|\Delta\varphi(t_s)| < \Delta\varphi_{max} < \frac{\pi}{2} \quad (15)$$

Based on Equation (15) the times $t_s$ where the relative polarity between $\underline{s}_1(t)$ and $\underline{s}_2(t)$ can be determined may be expressed as shown in Equation (16) below:

$$t_s = n\frac{2\pi}{\Delta\omega} + \delta t_s; \quad n \in \mathbb{N} \quad (16)$$

where $\delta t_s$ denotes the synchronization error tolerance having values as permitted according to Equation (17) below:

$$\frac{-\Delta\varphi_{max}}{\Delta\omega} < \delta t_s < \frac{\Delta\varphi_{max}}{\Delta\omega} \quad (17)$$

Equation (16) defines time intervals occurring periodically at times $$n \frac{2\pi}{\Delta \omega},$$

with $n \in \mathbb{N}$. For virtually zero tolerance ($\delta t_s \cong 0$), the relative polarity can only be determined at periodic distinct time instances that satisfy Equation (18) below.

$$t_s = n \frac{2\pi}{\Delta \omega}; n \in \mathbb{N} \quad (18)$$

In some implementations, a double-tone signal is used to generate at least one of the x'-, y'- and z'-magnetic fields of a three-axis generator system. Choosing the x'-field for the double tone transmission as an example, the double-tone excitation current $i_{x'}(t)$ may be expressed by Equation (19) below:

$$i_{x'}(t) = I_{x'a} \sin(\omega_{x'a} t) + I_{x'b} \sin(\omega_{x'b} t) \quad (19)$$

where $I_{x'a}$, $I_{x'b}$ denote the peak amplitudes and $\omega_{x'a}$ and $\omega_{x'b}$ the angular frequencies of tone "a" and tone "b", respectively. Assuming a single-tone transmission for the other magnetic field transmissions, the excitation currents to generate the y'- and z'-field may be expressed by Equations (20) and (21) below:

$$i_{y'}(t) = I_{y'} \sin(\omega_{y'} t), \quad (20)$$

$$i_{z'}(t) = I_{z'} \sin(\omega_{z'} t). \quad (21)$$

Since both tones of the double-tone transmission are equally affected by the transmission channel and thus by the position and rotation of the sensor, the positioning receiver may use this at least one double-tone signal to derive synchronization information as needed to establish relative phase synchronization between the x'-, y'- and z'-magnetic field transmissions. This synchronization information may comprise time instances and time intervals for $t_s$ as defined by (16)-(18).

Since the x'-field is generated by a double-tone, in some implementations, the amplitudes $I_{x'a}$ and $I_{x'b}$ may be reduced by a factor of $\sqrt{2}$ so that the three generated magnetic (sum) moments have equal r.m.s. amplitudes.

In some implementations, tone frequencies are chosen such that adjacent tone frequencies are separated by $\Delta \omega$ and the frequencies of the at least one double-tone are adjacent to one another. Using the exemplary four-tone scheme as given by (19)-(21) and the above described selection of tone frequencies, the set of tone frequencies described by Equations (22)-(24) may be obtained:

$$\omega_{x'b} = \omega_{x'a} + \Delta \omega \quad (22)$$

$$\omega_{y'} = \omega_{x'b} + \Delta \omega = \omega_{x'a} + 2\Delta \omega \quad (23)$$

$$\omega_{z'} = \omega_{y'} + \Delta \omega = \omega_{x'a} + 3\Delta \omega \quad (24)$$

The angular frequency spacing $\Delta \omega$ may have a positive or a negative value. Assuming perfect receiver synchronization at time instances $t_s$ as defined by (16)-(18) and using complex signal representation, the set of voltages induced, e.g., into the x-sense coil (e.g., the sense coil 612) at the different transmission frequencies may be expressed according to Equations (25)-(28):

$$\underline{V}_{x'ax}(t_s) = V_{x'ax} \exp(j\omega_{x'a} t_s) = V_{x'xa} \exp\left(jn \frac{2\pi}{\Delta \omega} \omega_{x'a}\right) \quad (25)$$

$$\underline{V}_{x'bx}(t_s) = V_{x'bx} \exp(j\omega_{x'a} t_s) \exp(j\Delta \omega t_s) = V_{x'xb} \exp\left(jn \frac{2\pi}{\Delta \omega} \omega_{x'a}\right) \quad (26)$$

$$\underline{V}_{y'x}(t_s) = V_{y'x} \exp(j\omega_{x'a} t_s) \exp(j2\Delta \omega t_s) = V_{y'x} \exp\left(jn \frac{2\pi}{\Delta \omega} \omega_{x'a}\right) \quad (27)$$

$$\underline{V}_{z'x}(t_s) = V_{z'x} \exp(j\omega_{x'a} t_s) \exp(j3\Delta \omega t_s) = V_{z'x} \exp\left(jn \frac{2\pi}{\Delta \omega} \omega_{x'a}\right) \quad (28)$$

with time index $n \in \mathbb{N}$.

Multiplying the four phasors by $$\exp\left(-jn \frac{2\pi}{\Delta \omega} \omega_{x'a}\right)$$

rotates them all onto the real axis finally yielding the x-component of the x'-, y'- and z'-voltage vectors $$\underline{V}_{x'x}(t_s) = V_{x'ax} + V_{x'bx} \quad (29)$$

$$\underline{V}_{y'x}(t_s) = V_{y'x} \quad (30)$$

$$\underline{V}_{z'x}(t_s) = V_{z'x} \quad (31)$$

Optimum choice of the angular frequency separation $\Delta \omega$ of the multi-tone transmission, which is related to the signal filtering requirements of the receiver, is another aspect of this disclosure. In a real system where received signals are typically noisy and where there may be multiple magnetic field transmissions at a plurality of frequencies, it is desirable that received tone signals be optimally filtered. The minimum filter bandwidth is mainly dictated by a sampling rate that may be given by the position update rate $1/T_p$ (the number of position values the positioning receiver needs to compute per unit time). For positioning applications in stationary wireless electric vehicle charging, a suitable position update rate may be 10 updates per second.

According to the uncertainty principle, position update rate and minimum filter bandwidth are related. For a Gaussian-shaped filter impulse response, the pulse width in time may be defined as twice the standard deviation of the Gaussian pulse $T_F = 2\sigma_t$ and the pulse (band) width as $B_F = 2\sigma_f$ accordingly, the time-bandwidth product is constrained by Equation (32):

$$T_F \cdot B_F = 2\sigma_t \cdot 2\sigma_f \leq 2 \quad (32)$$

Assuming the pulse width $T_F = T_p$ with $T_p$ the sample (position update) period provides for a minimum filter bandwidth, according to Equation (33):

$$B_F = \frac{2}{T_F} = 20 \text{ Hz} \quad (33)$$

For the example of a Gaussian filter and $T_p = \frac{1}{10}$ s, the minimum bandwidth becomes $B_F = 20$ Hz.

Other factors to consider are tone frequency errors due to oscillator instability and thermal drifts. These effects may require a somewhat larger filter bandwidth than the above-calculated theoretical values.

To get enough frequency selectivity, larger frequency separation than given by the filter bandwidth $B_F$ may be needed to avoid cross-talk from adjacent frequency tones. A minimum frequency separation between tones of the same positioning transmitter may be $\Delta f \geq 5 B_F$ (100 Hz in the example given above). About 10 $B_F$ (200 Hz in the example given above) may be required between adjacent frequency tones of different positioning transmitters (different magnetic beaconing channels).

Other filter functions may be used instead of the Gaussian function. Any function known as a window function for spectral analysis, e.g., a rectangular window, a Hanning window, a Kaiser-Bessel window, a Blackman-Harris window, etc. may be used. Some windows, e.g., the Blackman-Harris window, can provide very high attenuation of adjacent frequency tone signals, provided that there is enough frequency separation between them.

Figure 18:
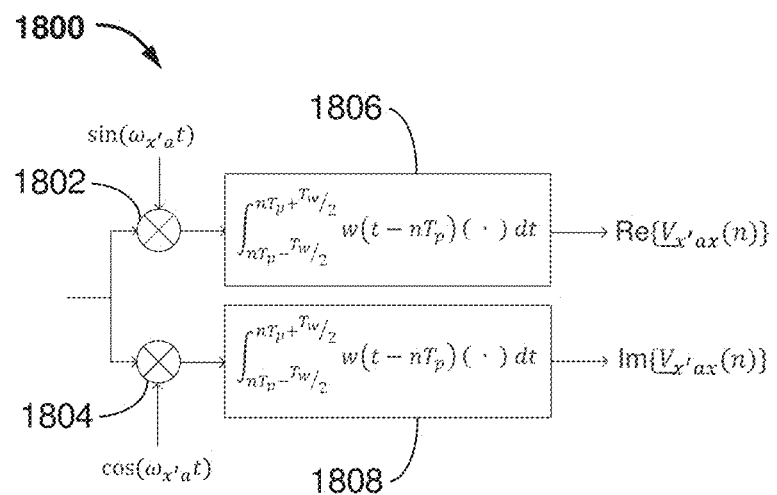
FIG. 18 illustrates a block diagram of a synchronous detector of a magnetic field positioning receiver, in accordance with some implementations.

In one system, the positioning receiver may use a bank of synchronous detectors to filter and detect each of the complex voltage components of each transmitted tone as received by each sense coil. FIG. 18 illustrates a block diagram of a synchronous detector 1800 of a magnetic field positioning receiver, in accordance with some implementations. The synchronous detector 1800 may be configured to filter and detect the tone transmitted at angular frequency $\omega_{x'a}$, as received by the x-sense coil (e.g., the sense coil 612). The synchronous detector 1800 provides at its two outputs the real and imaginary parts (I-component and Q-component), respectively, of the complex voltage $\underline{V}_{x'ax}=\text{Re}\{\underline{V}_{x'ax}\}+j\text{Im}\{\underline{V}_{x'ax}\}$.

The synchronous detector 1800 comprises a quadrature mixer (down-converter) and first and second integrators 1806, 1808, respectively. The quadrature mixer comprises a first mixer 1802 configured to multiply the input signal by $\sin(\omega_{x'a}t)$ to provide the I-component, and a second mixer 1804 configured to multiply the input signal by $\cos(\omega_{x'a}t)$ to provide the Q-component. The outputs of the first and second mixers 1802, 1804 are input to the first and second integrators 1806, 1808, respectively. Both integrators 1806, 1808 perform the same function as a FIR low pass filter by weighing the baseband signal with the filter impulse response (window function) w(t). Integration is carried out at a rate of $1/T_p$ over the time interval indicated by Equation (34):

$$nT_p-T_w/2 < t \le nT_p+T_w/2 \qquad (34)$$

with $nT_p$, $n \in \mathbb{N}$ defining the center time of the stepwise moving integration interval. The integrators deliver one complex output value every $T_p$ seconds. The integration time is the length $T_w$ of the filter function w(t). Consecutive integration intervals may overlap if $T_w > T_p$.

In a system in accordance with the present application, filtering and detection is performed quasi-synchronously with respect to the tone frequency but asynchronously with respect to the transmitter's time, which is denoted by t' below. There may be an arbitrary (random) time offset $T_0$ between the transmitter's time base and the receiver's time base and also a small relative time drift defined by a coefficient ($\gamma$ close to 1) as a consequence of inaccuracy associated with the transmitter's and receiver's reference clocks. The relationship between transmitter's and receiver's time bases may be expressed as shown in Equation (35):

$$t'=\gamma t-T_0 \qquad (35)$$

Using Equation (35), definitions made above, and complex signal representation, the operation of the synchronous detector as shown in FIG. 18 may be expressed according to Equation (36):

$$\underline{V}_{x'ax} = \int_{nT_p-T_w/2}^{nT_p+T_w/2} w(t-nT_p)\underline{v}_x(t') \cdot \exp(-j\omega_{x'a}t)\,dt \qquad (36)$$

Assuming the set of tone signals as defined by Equations (19)-(21) and absence of any noise component, the input signal as delivered by the x-sense coil 612 may be defined according to Equation (37):

$$\underline{v}_x(t')=\underline{v}_{x'ax}(t')+\underline{v}_{x'bx}(t')+\underline{v}_{y'x}(t')+\underline{v}_{z'x}(t') \qquad (37)$$

Furthermore, assuming that the synchronous detector 1800 sufficiently suppresses signals with angular frequency $\omega \ne \omega_{x'a}$, only $\underline{v}_{x'ax}(t')$ is retained. Substituting (36) for the time variable t', the relevant input signal may be expressed by Equation (38):

$$\underline{v}_{x'ax}(t')=V_{x'ax}\exp(j\omega_{x'a}t')=V_{x'ax}\exp(j\omega_{x'a}\gamma t)\exp(-j\omega_{x'a}T_0) \qquad (38)$$

Substituting (38) in (36), yields the complex output (detected voltage phasor) of the synchronous detector, expressed by Equation (39):

$$\underline{V}_{x'ax} = \int_{nT_p-T_w/2}^{nT_p+T_w/2} w(t-nT_p)\underline{v}_{x'ax}(t') \cdot \exp(-j\omega_{x'a}t)\,dt = \qquad (39)$$

$$V_{x'ax}\exp(-j\omega_{x'a}T_0)\int_{nT_p-T_w/2}^{nT_p+T_w/2} w(t-nT_p)\exp(j\omega_{x'a}(\gamma-1)t)\,dt$$

Using the assumptions of $\gamma \cong 1$ and a normalized filter function w(t), $$\int_{nT_p-T_w/2}^{nT_p+T_w/2} w(t-nT_p)\,dt = 1 \qquad (40)$$

and some rearrangements, equation (39) may be simplified to Equation (41) below:

$$\underline{V}_{x'ax} \cong V_{x'ax}\exp(-j\omega_{x'a}T_0)\exp(-j\omega_{x'a}(1-\gamma)nT_p) \qquad (41)$$

The noise-free outputs of the other synchronous detectors connected to the x-sense coil 612 may be obtained accordingly, as expressed in Equations (42)-(44) below:

$$\underline{V}_{x'bx} \cong V_{x'bx}\exp(-j\omega_{x'b}T_0)\exp(-j\omega_{x'b}(1-\gamma)nT_p) \qquad (42)$$

$$\underline{V}_{y'x} \cong (\pm)V_{y'x}\exp(-j\omega_{y'}T_0)\exp(-j\omega_{y'}(1-\gamma)nT_p) \qquad (43)$$

$$\underline{V}_{z'x} \cong (\pm)V_{z'x}\exp(-j\omega_{z'}T_0)\exp(-j\omega_{z'}(1-\gamma)nT_p) \qquad (44)$$

Expressions above show three terms: a magnitude, a constant phase angle and a stepwise rotating phasor that evolves as time index n increments. The constant phase offset can be attributed to the relative time offset $T_0$, while the rotating phasor to the relative time drift that manifests in a small relative frequency offset.

As opposed to the expressions for $\underline{V}_{x'ax}$ in Equation (41) and $\underline{V}_{x'bx}$ in Equation (42), a polarity uncertainty (±) has been introduced in the expressions for $\underline{V}_{y'x}$ in Equation (43) and $\underline{V}_{z'x}$ in Equation (44). This polarity uncertainty shall be understood as a relative polarity uncertainty between the $\underline{V}_{x'ax}$ or $\underline{V}_{x'bx}$ and $\underline{V}_{y'x}$ and between $\underline{V}_{x'ax}$ or $\underline{V}_{x'bx}$ and $\underline{V}_{z'x}$. There is no relative polarity uncertainty between $\underline{V}_{x'ax}$ and $\underline{V}_{x'bx}$ by definition, since these components are obtained from the double-tone signal as transmitted via the x'-magnetic field and, thus, are equally affected by the transmission channel.

In some implementations, the receiver performs relative phase synchronization by first determining the phase difference (relative phasor) between phasors $\underline{V}_{x'ax}$ and $\underline{V}_{x'bx}$ and second by correcting (rotating) all output phasors by an angle given by the relative phasor. It will be shown further down that this operation of phase correction is equivalent to adjusting the receiver's timing as defined, e.g., by Equations (16), (17).

The receiver derives the phase difference (relative phasor) at least from output phasors $\underline{V}_{x'ax}$ and $\underline{V}_{x'bx}$ by using the following complex phasor operation expressed by Equation (45):

$$\exp(j\widehat{\Delta\varphi}) = \frac{\underline{V}_{x'bx} \cdot \underline{V}^*_{x'ax}}{|\underline{V}_{x'bx} \cdot \underline{V}^*_{x'ax}|} \quad (45)$$

which may be considered as the normalized scalar product in complex number notation. Substituting (41) and (42) into (45) and some manipulations provides an expression for the relative phasor in time interval n, according to Equation (46):

$$\exp(\widehat{\Delta\varphi}_n) \cong \exp(-j(\omega_{x'b}-j\omega_{x'a})T_0) \cdot \exp(-j(\omega_{x'b}-j\omega_{x'a})(1-\gamma)nT_p) \quad (46)$$

Using the definition of $\Delta\omega$ of Equations (22)-(24), equation (46) may be rewritten as shown in Equation (47):

$$\exp(j\widehat{\Delta\varphi}_n) \cong \exp(-j\Delta\omega T_0) \cdot \exp(-j\Delta\omega(1-\gamma)nT_p) \cong \exp(-j\Delta\omega(T_0+(1-\gamma)nT_p)) \quad (47)$$

The term $(1-\gamma)nT_p$ represents the timing drift of the receiver's time base relative to the transmitter's time base. Since $1-\gamma$ is typically a very small factor (e.g., ±100 ppm) this timing drift may be considered minor so that the relative phasor stays nearly constant as time advances.

In some implementations, the receiver applies the estimated relative phasor to all synchronous detector outputs to achieve relative phase synchronization. For the exemplary tone frequency definitions of Equations (22)-(24), this may be accomplished by multiplying detector output $\underline{V}_{x'bx}$ by $\exp(-j\widehat{\Delta\varphi}_n)$, detector output $\underline{V}_{y'x}$ by $(\exp(j\widehat{\Delta\varphi}_n))^2$, and detector output $\underline{V}_{z'x}$ by $(\exp(-j\widehat{\Delta\varphi}_n))^3$ as shown in the following:

Using equation (47) and the exemplary definitions of equations (22)-(24), relative phase correction of the component $V f_{bx}$ may be expressed as shown in Equation (48).

$$\underline{V}_{x'bx} \cdot \exp(-j\widehat{\Delta\varphi}_n) \cong V_{x'bx} \cdot \exp(-j\omega_{x'a}(T_0+(1-\gamma)nT_p)) \\ \cdot \exp(-j\Delta\omega(T_0+(1-\gamma)nT_p)) \cdot \exp(j\Delta\omega(T_0+(1-\gamma)nT_p)) \cong V_{x'bx} \cdot \exp(-j\omega_{x'a}(T_0+(\gamma-1)nT_p)) \quad (48)$$

Accordingly, relative phase corrections of components $\underline{V}_{y'x}$ and $\underline{V}_{z'x}$ become equations (49)-(50), respectively.

$$\underline{V}_{y'x} \cdot (\exp(-j\widehat{\Delta\varphi}_n))^2 \cong (\pm)V_{y'x} \cdot \exp(-j\omega_{x'a}(T_0+(1-\gamma)nT_p)) \\ \cdot \exp(-j2\Delta\omega(T_0+(1-\gamma)nT_p)) \cdot \exp(j2\Delta\omega(T_0+(1-\gamma)nT_p)) \cong (\pm)V_{y'x} \cdot \exp(-j\omega_{x'a}(T_0+(1-\gamma)nT_p)) \quad (49)$$

$$V_{z'x} \cdot (\exp(-j\widehat{\Delta\varphi}_n))^2 \cong (\pm)V_{z'x} \cdot \exp(-j\omega_{x'a}(T_0+(1-\gamma)nT_p)) \\ \cdot \exp(-j3\Delta\omega(T_0+(1-\gamma)nT_p)) \cdot \exp(j3\Delta\omega(T_0+(1-\gamma)nT_p)) \cong (\pm)V_{z'x} \cdot \exp(-j\omega_{x'a}(T_0+(1-\gamma)nT_p)) \quad (50)$$

Equations (48) to (50) show that resulting (phase corrected) output phasors including $\underline{V}_{x'ax}$ are all equally oriented (but not necessarily equally directed) in the complex plane and are rotating quasi-phase synchronously as time advances and if $\gamma \neq 0$.

In the following it will be shown that relative phase correction is equivalent to time synchronization in accordance with (16), (17), and (25)-(28). Considering the complex output of the synchronous detector as the Fourier transform of the windowed time-domain input signal $\underline{v}_{x'ax}(t')$ at the distinct frequency $\omega_{x'a}$ and using (38) provides equation (51):

$$\underline{V}_{x'ax}(\omega_{x'a}) = \int_{-nT_p-T_w/2}^{nT_p+T_w/2} w(t-nT_p) \cdot \underline{v}_{x'ax}(t') \cdot \exp(-j\omega_{x'a}t) \, dt = \\ dt = \int_{-nT_p-T_w/2}^{nT_p+T_w/2} w(t-nT_p) \cdot V_{x'ax} \exp(j\omega_{x'a}t') \cdot \exp(-j\omega_{x'a}t) dt \quad (51)$$

The variable t' as defined in (35) may be rewritten in the form of a time shift $\tau_s$ that is a function of t according to equation (52):

$$t' = \gamma t - T_0 = t - (T_0 + (1-\gamma)t) = t - \tau_s(t) \quad (52)$$

Over the limited integration interval $[-nT_p+T_w/2, nT_p+T_w/2]$, the input signal $\underline{v}_{x'ax}(t')$ may be considered as non-drifting but solely shifted in time by:

$$\tau_s(nT_p) = T_0 + (1-\gamma)nT_p \quad (53)$$

Substituting (53) in (52) and (52) in (51) and applying the shift theorem of Fourier transforms provides equation (54):

$$\underline{V}_{x'ax}(\omega_{x'a}) \quad (54)$$
$$\int_{-nT_p-T_w/2}^{nT_p+T_w/2} w(t-nT_p) \cdot \underline{v}_{x'ax}(t - \tau_s(nT_p)) \cdot \exp(-j\omega_{x'a}t) \, dt = \\ \exp(-j\omega_{x'a}\tau_s(nT_p)) \cdot \int_{-nT_p-T_w/2}^{nT_p+T_w/2} w(t-nT_p) \cdot \underline{v}_{x'ax}(t) \cdot \exp(-j\omega_{x'a}t) dt$$

Equation (54) shows that shifting the receiver's time base relative to the transmitter's by $\tau_s$ is equivalent to shifting the phase of the detector complex output by $\exp(-j\omega_0\tau_s)$ where $\omega_0$ denotes the angular frequency of the detector. Therefore, relative phase synchronization between the different tone frequencies may be achieved by rotating the detector's output phasors by an angle $\omega_0\tau_s$. In some implementations, this may be more convenient than shifting the receiver's time base.

It shall be noted that some voltage components may be very weak or even null. Depending on the sensor's rotation relative to the generator, it may be impossible to determine the relative phasor, e.g., on the x-components as sensed by the x-sense coil 612.

In some implementations, the receiver uses diversity for determining the relative phasor by combining phasor products $\underline{V}_{x'bx} \cdot \underline{V}^*_{x'ax}$, $\underline{V}_{x'by} \cdot \underline{V}^*_{x'ay}$, and $\underline{V}_{x'bz} \cdot \underline{V}^*_{x'az}$ of all components as referring to the voltages induced into the x-, y- and z-sense coils 612, 614, 616 respectively. Combining may be performed empirically just by summing the phasor products. The relative phasor may then be obtained by normalizing on the sum product as shown in Equation (55):

$$\exp(j\widehat{\Delta\varphi}) = \frac{\underline{V}_{x'bx} \cdot \underline{V}^*_{x'ax} + \underline{V}_{x'by} \cdot \underline{V}^*_{x'ay} + \underline{V}_{x'bz} \cdot \underline{V}^*_{x'az}}{|\underline{V}_{x'bx} \cdot \underline{V}^*_{x'ax} + \underline{V}_{x'by} \cdot \underline{V}^*_{x'ay} + \underline{V}_{x'bz} \cdot \underline{V}^*_{x'az}|} \quad (55)$$

In other implementations, the receiver may employ a maximal ratio diversity combining technique, e.g., by weighing components with an estimate of the SNR prior to combining. In yet other implementations, the receiver may employ selection diversity by selecting the product with largest magnitude or with highest estimated SNR (quality).

To further improve synchronization accuracy or increase robustness against noise and interference, estimation of the relative phasor may be further enhanced by using averaging techniques over consecutively detected output phasors (time sequences). In some implementations, the receiver may determine the relative phasor based on a moving average of relative phasors $\exp(j\widehat{\Delta\varphi}_n)$ as obtained in consecutive time intervals. Other averaging techniques based on time sequences $\exp(j\widehat{\Delta\varphi}_n)$ may apply as well.

In a further step of post processing and as already disclosed above by equations (25)-(28), the receiver may rotate all detected phasors towards the real axis by a common angle by multiplying all outputs with a phasor $\exp(j\hat{\varphi}_n)$ that may be an estimate of $\exp(j\omega_{x'a}(T_0+(1-\gamma)nT_p))$. As already explained above, this phasor will generally be slowly rotating as time advances (n increments). Having applied this rotation towards the real axis, the receiver may select the real part of all rectified outputs to finally get estimates of all the components of the vectors $\hat{V}_{x'a}, \hat{V}_{x'b}, \hat{V}_{y'}, \hat{V}_{z'}$ as they may be required for determining a position. Selecting only the real part will remove the noise component on the imaginary part, hence generally improving a vector estimate and, finally, a position estimate.

Using (48) as an example, this operation of rotation and selection of the real part may be expressed by equation (56):

$$\hat{V}_{x'bx} = Re\{\underline{V}_{x'bx} \cdot \exp(-j\widehat{\Delta\varphi}) \cdot \exp(-j\hat{\varphi}_n)\} \cong Re\{V_{x'bx} \cdot \exp(-j\omega_{x'a}(T_0+(\gamma-1)nT_p)) \cdot \exp(j\omega_{x'a}(T_0+(\gamma-1)nT_p))\} \cong V_{x'bx} \quad (56)$$

The other x-components such as $\hat{V}_{x'ax}, \hat{V}_{y'x},$ and $\hat{V}_{z'x}$ as well as all the y- and z-components may be obtained accordingly.

Figure 20A:
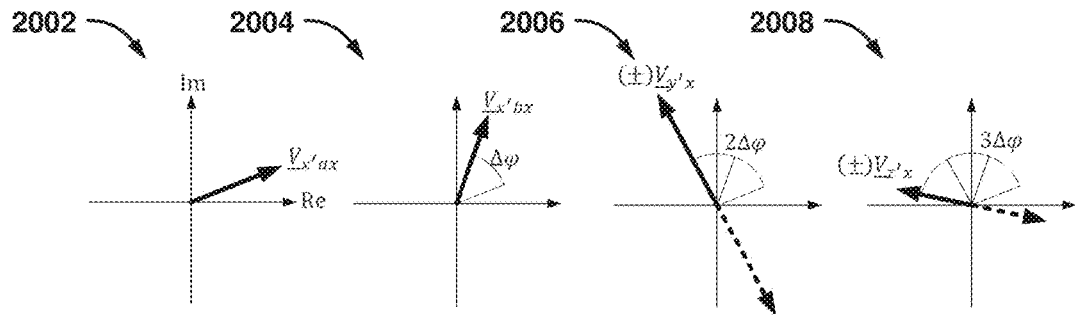
FIGS. 20A, 20B and 20C illustrate complex phasors at different stages of receiver synchronization and for different outputs of a sub-bank of synchronous detector, in accordance with some implementations.
Figure 20B:
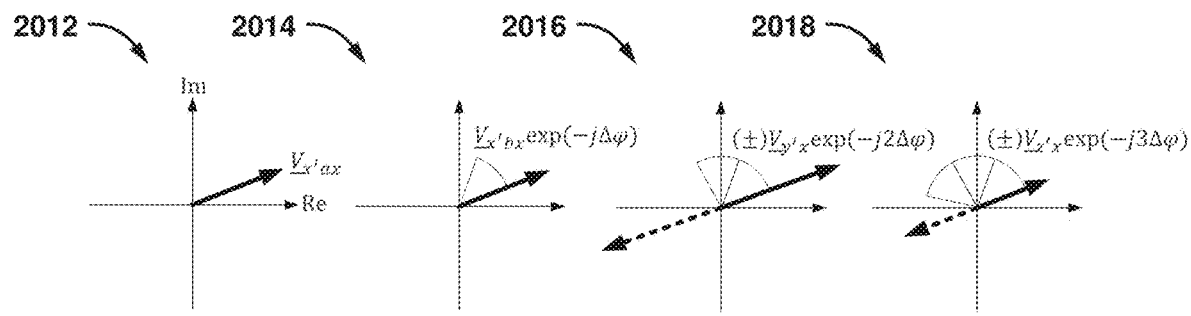
Figure 20C:
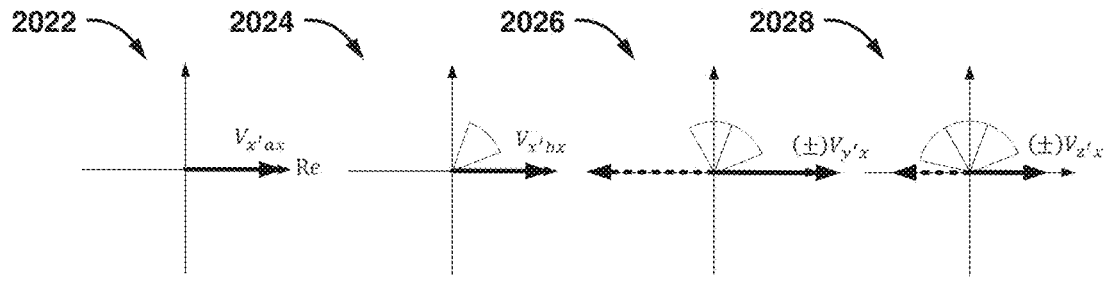

FIG. 20A to 20C further illustrate this process of relative phase synchronization and rotation towards the real axis showing the complex planes for each of the four detector outputs (x'ax, x'bx, y'x, and z'x-component). FIG. 20A, shows the complex phasors 2002, 2004, 2006, 2008 of the four detector outputs (x'ax, x'bx, y'x, and z'x-component, respectively) prior to any synchronization. FIG. 20B shows the complex phasors 2012, 2014, 2016, 2018 after relative phase synchronization, and FIG. 20C shows the complex phasors 2022, 2024, 2026, 2028 after common rotation towards the real axis.

A phasor estimate $\exp(j\hat{\varphi}_n)$ may be gained from at least one of the received x-, y-, and z-components of at least one of the x'-, y'-, and z'-magnetic fields. Since the components may have different polarities depending on the position and rotation of the sensor relative to the generator, the receiver may determine $\exp(j\hat{\varphi}_n)$ individually on components x'x, x'y, x'z, y'x, y'y, etc. and then eventually using a combining method as suggested above for determining the relative phasor $\exp(j\widehat{\Delta\varphi})$.

For improved performance and robustness, the phasor estimate $\exp(j\hat{\varphi}_n)$ may be determined based on consecutive noisy detector outputs, e.g., by using a phase drift (frequency offset) estimator to compensate first for the phasor's rotation and then by using averaging techniques as suggested above for determining the relative phasor $\exp(j\widehat{\Delta\varphi})$ as a second operation. Rotation compensation may be considered a post-detection fine frequency tuning of the receiver. Phase drift estimation, rotation compensation and averaging may be accomplished as a moving operation (e.g., a moving average). Alternatively, a linear regression method modified to a modulo $2\pi$ process may apply.

In some implementations, an enhanced receiver determines an estimate $\exp(j\hat{\varphi}_n)$ by using one of a diversity technique by combining at least two components and additionally, by using sequences of consecutively detected and relative phase corrected noisy phasors, e.g., to perform phase drift estimation, rotation compensation (frequency fine tuning) and averaging, or alternatively, linear regression on modulo $2\pi$.

In case relative time drift between transmitter and receiver exceeded a certain tolerable limit, which may happen in practice, e.g., due to an extreme temperature drift which may manifest in a too fast rotation of the detector's output phasors, the receiver or the transmitter may perform a coarse frequency correction. A too fast phase rotation indicates that the received tone signal is no longer centered in the filter and, thus, may suffer from attenuation that could induce error in the detected amplitude and eventually in the position estimate.

Therefore, in some implementations, the receiver may coarsely adjust the local oscillator frequencies of those synchronous detectors exhibiting non-tolerable fast phasor rotation at their outputs so that the residual rotation is maintained below the tolerable limit. Alternatively, the receiver may command the transmitter of concern via a data communications link to offset the magnetic field transmit frequencies by a certain amount.

For the purposes of diversity combining/selection and positioning, the receiver may include functions to assess the quality of the received signals in the various components. Quality may be assessed by estimating the SNR or by other signal integrity and consistency checks. A set of signals as used for magnetic vectoring may contain significant redundancy that can be used for quality assessment. The SNR of each received signal component may be obtained from noise variance statistics that may fall out as side product when performing averaging over time sequences of detected phasors.

Interference of received tone signals by another magnetic vectoring transmission (co-channel or adjacent channel interference) or by spurious emissions emanating from other sources (IPT systems, switched-mode power supplies, etc.) may therefore be detected by signal consistency checks, e.g., if the amplitude and/or phase difference between signals $\underline{v}_{x'ax}(t)$ and $\underline{v}_{x'bx}(t)$ exceeded certain thresholds.

In some implementations, the receiver performs signal consistency checks as described above and estimates an SNR for each complex output of a synchronous detector.

Figure 19:
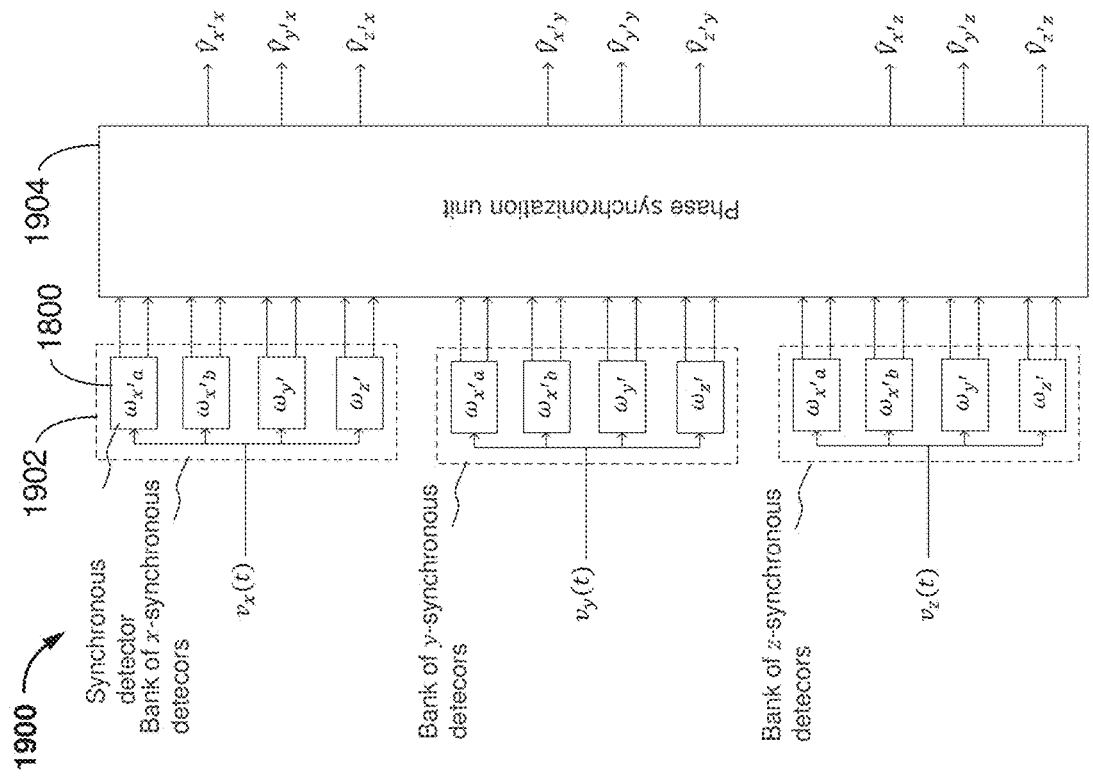
FIG. 19 shows a block diagram of a portion of a magnetic field positioning receiver using a bank of the synchronous detectors of FIG. 18, in accordance with some implementations.

FIG. 19 shows a block diagram of a portion of a magnetic field positioning receiver 1900 using a bank of the synchronous detectors of FIG. 18, in accordance with some implementations. The block diagram shows a bank of synchronous detectors 1902, e.g., as further detailed by FIG. 18, grouped into x-, y-, z-synchronous detector sub-banks, as indicated by the dotted boxes. Each sub-bank is associated to one of an analog output $v_x(t)$, $v_y(t)$, and $v_z(t)$ of a sense coil 612, 614, 616. As described above, the respective signal generated by each of the plurality of sense coils 612, 614, 616 comprises at least a first portion caused by the first alternating magnetic field oscillating at a first $f_{x'a}$ of the two frequencies $f_{x'a}, f_{x'b}$, a second portion caused by the first alternating magnetic field oscillating at a second $f_{x'b}$ of the two frequencies $f_{x'a}, f_{x'b}$, and a third portion caused by the second alternating magnetic field oscillating at the one other frequency $f_{y'}$. A processor is configured to estimate a relative phase angle $\Delta\varphi$ between the first portion and the second portion. For example, FIG. 19 shows a phase synchronization unit 1904 as part of the positioning receiver's post processing. The phase synchronization unit 1904 has for inputs all complex (quadrature) outputs of the synchronous detectors 1800. The phase synchronization unit 1904 produces for outputs the phase corrected components of vectors $\hat{V}_{x'}$, $\hat{V}_{y'}$, $\hat{V}_{z'}$ as they may be required for determining a position in a position and direction finding unit (not shown in FIG. 19). The phase synchronization unit 1904 determines an estimate of the relative phasor $\exp(j\widehat{\Delta\varphi})$ and establishes relative phase synchronization. Thus, in some implementations, the processor (e.g., phase synchronization unit 1904) is configured to establish relative phase synchronization in the time domain between the first portion, the second portion, and the third portion of the respective signal generated by each of the plurality of sense coils 612, 614, 616 by shifting a detection time instant by an amount that is a function of the relative phase angle and a frequency separation between the one other frequency $f_{y'}$ of the second alternating magnetic field and at least one of the two frequencies $f_{xa'}$, $f_{xb'}$ of the first alternating magnetic field. Similarly, the processor (e.g., the phase synchronization unit 1904) may be configured to establish relative phase synchronization in the frequency domain between the first portion, the second portion, and the third portion of the respective signal generated by each of the plurality of sense coils 612, 614, 616 by shifting a phase angle of at least one of the first portion, the second portion and the third portion by an angle corresponding to the relative phase angle $\Delta\varphi$ or an integer multiple of the relative phase angle $\Delta\varphi$.

The phase synchronization unit 1904 further determines an estimate of the rotating phasor $\exp(j\hat{\varphi}_n)$, compensates for the residual frequency offset (phase drift), and rotates all phasors by a common angle, e.g., towards the real axis to finally get components of vector estimates $\hat{V}_{x'}$, $\hat{V}_{y'}$, $\hat{V}_{z'}$. Moreover, the phase synchronization unit 1904 may assess quality of each component of vector estimates $\hat{V}_{x'}$, $\hat{V}_{y'}$, $\hat{V}_{z'}$ and may separately deliver this information to the position and direction finding unit (not shown in FIG. 19).

In a preferred implementation, the entire block as shown in FIG. 19 is implemented in a digital signal processor and the input signals $v_x(t)$, $v_y(t)$, and $v_z(t)$ are (discrete-time) digital signals. In another implementation, the positioning receiver implements multiple blocks as shown in FIG. 19, which can be instantiated and assigned to receive and process magnetic vectoring signals emanating from different transmitters transmitting at different frequencies (in different beaconing channels). In yet another implementation, Fast-Fourier-Transform (FFT) techniques or similar algorithms are used to implement the banks of synchronous detectors and to reduce computational complexity (burden) of the digital signal processor.

Figure 21:
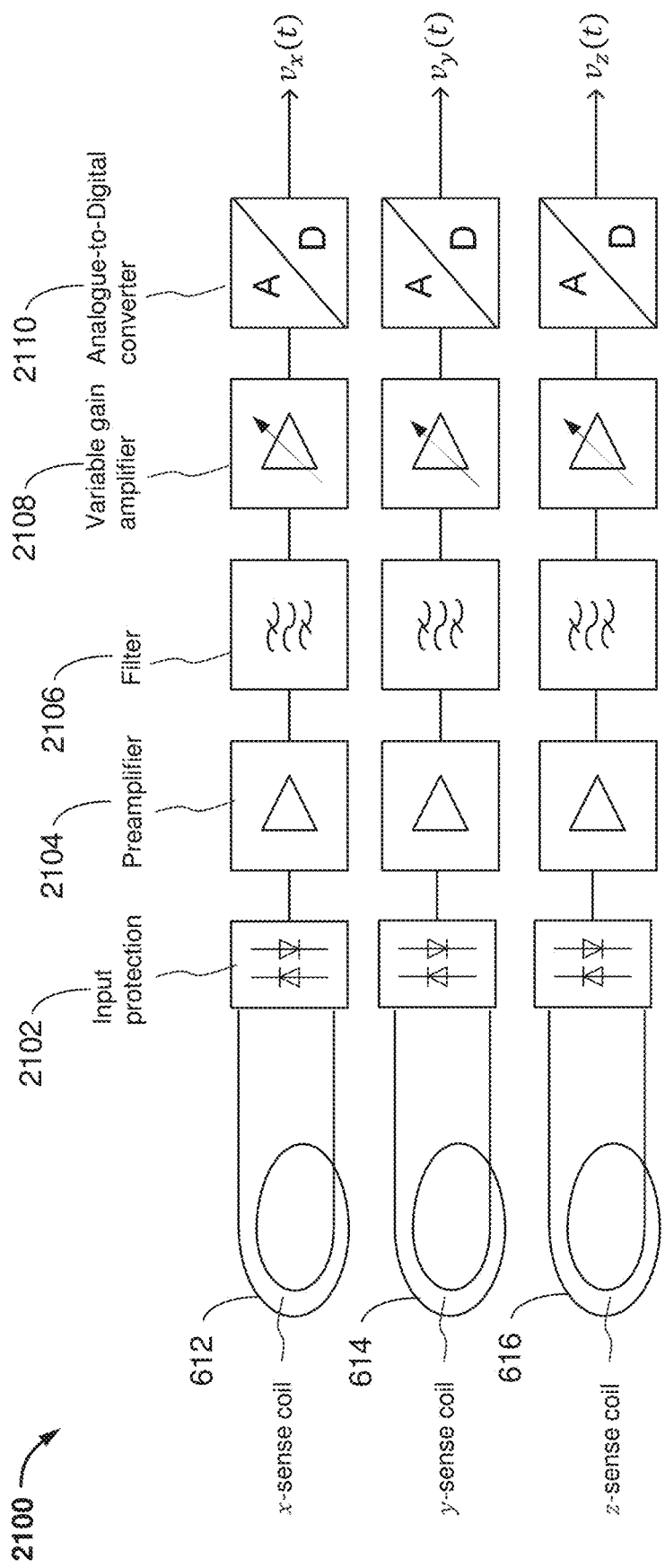
FIG. 21 illustrates a block diagram of an analog front end (AFE) of a 3-axis magnetic field positioning receiver, in accordance with some implementations.

FIG. 21 illustrates a block diagram of an analog front end (AFE) 2100 of a 3-axis magnetic field positioning receiver, in accordance with some implementations.

The AFE 2100 may provide the digital signals $v_x(t)$, $v_y(t)$, and $v_z(t)$ at its three outputs that may represent the three input signals of the synchronous detector sub-banks as shown in FIG. 19. Each of the three AFE channels comprises an input protector (limiter) 2102, a preamplifier 2104, a filter 2106, a variable gain amplifier 2108, and optionally an analog-to-digital (A/D) converter 2110.

The input protector 2102 serves to protect the preamplifier 2104 from being damaged when the magnetic field sensor (e.g., the sense coils 612, 614, 616) is exposed to a strong magnetic field, e.g., during active power transfer from an IPT system. The input protector 2102 limits the input voltage and is designed in a manner such that there is no substantial current flow when the circuit is limiting so that there is no substantial power loss and no heating effects. The preamplifier 2104 may have a gain (e.g., 20 dB) and a high impedance input (>100 kΩ) and a relatively low output impedance (e.g., <50 Ohm) for driving the following filter 2106.

The filter 2106 may be a bandpass filter having a passband with reasonably low ripple and sufficient width to cover the full frequency band as it may be specified for magnetic vectoring and having sufficient suppression (e.g., >60 dB) of signals received out-of-band, particularly at IPT operating frequencies, e.g., 85 kHz. The filter 2106 may also act as anti-aliasing filter as needed for sampling the signal in the A/D converter 2110.

The variable gain amplifier 2108 ensures that the A/D converter 2110 always operates in the favorable range over the large dynamic range and compensates for large receive signal level variations as they may occur in real scenarios, due to the so-called "near-far" effect. The variable gain amplifier 2108 may be controlled by the digital processing unit that follows the AFE 2100 providing an automatic gain control function (not shown in FIG. 21).

In some implementations, at least three co-planar sense coils may be configured to provide at least a two-axis sensor in combination. In yet other implementations, four co-planar sense coils may be configured to provide a three-axis sensor in combination and may be suitably disposed on a ferrite substrate may be used to sense the three alternating magnetic fields as needed for magnetic vectoring. Such a 4-coil arrangement may act as a 3-axis sensor. For a 4-coil sensor, the AFE 2100 of FIG. 21 may be extended to a 4-channel AFE having four analog inputs and four digital outputs. The required linear combinations providing the three signals $v_x(t)$, $v_y(t)$, and $v_z(t)$ may then be performed in the digital domain in a block prior to synchronous detection, as previously described in connection with FIG. 19.

Figure 22:
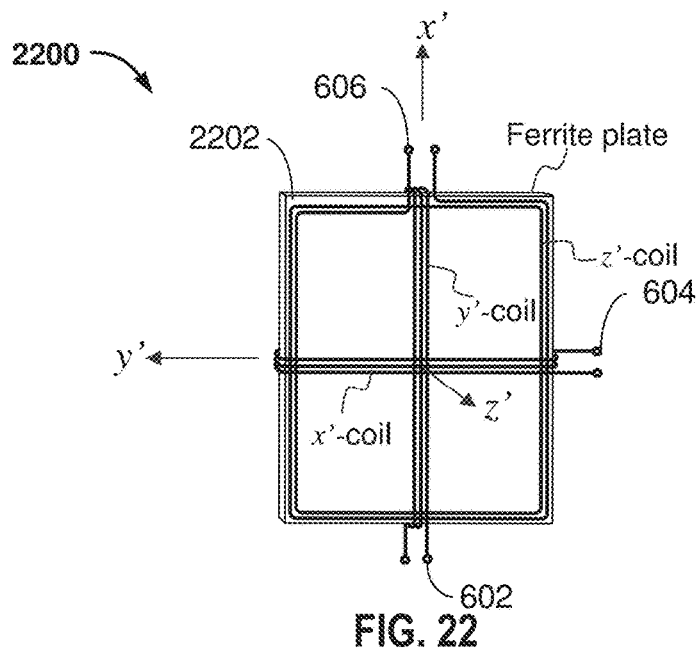
FIG. 22 illustrates an orthogonal coil arrangement for a 3-axis generator or sensor, in accordance with some implementations.

FIG. 22 illustrates an orthogonal coil arrangement 2200 for a 3-axis generator or sensor, in accordance with some implementations. It uses three orthogonal generator coils 602, 604, 606. Typically, the coils 602, 604, 606 may have a few turns of relatively thin copper wire with a cross section of <0.2 mm$^2$. The x'- and y'-coils 602, 604, respectively, are wound around a ferrite structure 2202. The z'-coil 606 may be a rectangular coil disposed along the contours near the edges of the ferrite structure 2202. Alternatively, the z'-coil 606 may be wound around the long perimeter entirely at the edges of the ferrite structure 2202. In a preferred implementation, the ferrite structure 2202 is shared by the IPT and MV systems. This allows for a large volume of the ferrite structure 2202 to capture larger amounts of magnetic flux and, thus, provide a more accurate indication of the alignment between the generator and sensor.

In some other implementations, the 3-coil arrangement of FIG. 22 applies to a 3-axis sensor. In such implementations, the axis designation x', y' and z' would change to x, y and z, respectively. A 2-axis generator for vehicle positioning applications generating an x'- and y'-magnetic moment may be achieved by omitting the z'-coil 606 shown in FIG. 22 or by driving the z'-coil with a substantially zero-current.

In other implementations, a multi-axis generator or sensor uses a combination of at least one IPT coil and at least one magnetic vectoring coil. In some implementations, the x'-coil 602 is formed by reusing the IPT coil, e.g., a "Double-D" coil, a "Solenoid"-coil, a "Bi-polar"-coil, and the y'-coil 604 is a supplementary dedicated magnetic vectoring coil.

Figure 23:
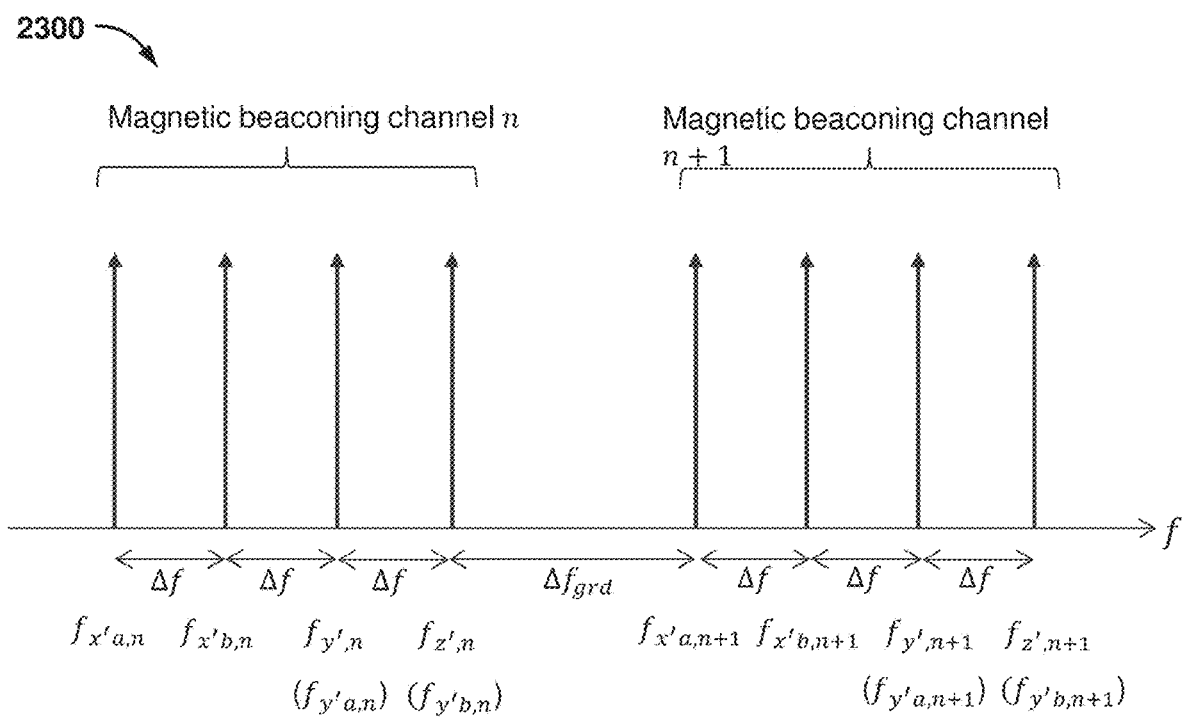
FIG. 23 illustrates a frequency division 4-tone magnetic field transmission scheme, in accordance with some implementations.

FIG. 23 illustrates a frequency division 4-tone magnetic field transmission scheme 2300, in accordance with some implementations. A first variant applies to a 3-axis generator where a double-tone with frequencies $f_{x'a}$ and $f_{x'b}$ is used to excite the x'-coil 602 and single tones with frequencies $f_{y'}$ and $f_{z'}$ for the y'-coil and z'-coils, respectively. Adjacent tones are separated by $\Delta f$ (tone frequency spacing). The second variant applies to a 2-axis generator where a double-tone ($f_{x'a}$, $f_{x'b}$) and a double-tone ($f_{y'a}$, $f_{y'b}$) is used to excite each the x'-coil 602 and y'-coil 604, respectively. The second double-tone transmitted via the y'-coil 604 may be not necessary for the basic function but may improve robustness of the system as it provides more redundancy for determination of the synchronization. As previously mentioned, any redundancy in the transmitted signals may be used for enhanced signal consistency and integrity checks. But even more important, the system may establish relative phase synchronization and determine a position even if one of the four tones is jammed by a narrow-band interference signal.

Furthermore, FIG. 23 shows a 4-tone transmission in each of the two adjacent magnetic beaconing channels (e.g., channel n and channel n+1). Adjacent tones of two different channels may be separated by $\Delta f_{grd} > \Delta f$ providing a guard band between adjacent channels for purposes as already explained above.

In another aspect of the disclosure, the channel number n that a particular positioning transmitter is assigned to may implicitly serve as an identifier so that no transmitting of an explicit ID is needed. Assuming out-of-band data communications in parallel (e.g., via UHF WLAN) as well as a central coordinator, ID's may be communicated out-of-band and the central coordinator may inform the positioning receiver that transmissions on channel n belong to the transmitter matching the communicated ID.

In a further aspect of the disclosure, it may be desirable to minimize the peak-to-average ratio (crest factor) of the multi-tone transmission scheme. It shall be noted that the sum signal of a multi-tone transmissions may exhibit a high peak-to-average level ratio if there exist time instances where all tones have the same phase thus adding up constructively. A high crest factor may be disadvantageous, e.g., in a system where transmit levels are constrained by regulatory limits based on peak detection, e.g., ICNIRP EMF exposure limits. In a transmission scheme using more than two tones, the crest factor may be minimized by offsetting the phase of at least one second tone relative to the phase of a first tone whose phase is maintained. Applied to the exemplary multi-tone transmission scheme as given by equations (19)-(21), rewritten here, $$i_{x'}(t) = I_{x'a} \sin(\omega_{x'a} t) + I_{x'b} \sin(\omega_{x'b} t) \qquad (19)$$

$$i_{y'}(t) = I_{y'} \sin(\omega_{y'} t + \varphi_{y'}), \qquad (20)$$

$$i_{z'}(t) = I_{z'} \sin(\omega_{z'} t + \varphi_{z'}). \qquad (21)$$

the crest factor may be minimized by optimizing phase offsets $\varphi_{y'}$ and $\varphi_{z'}$. Since phase offsets may remain fixed during transmission and may be known to the receiver, these phase offsets can be taken into account in the process of synchronization.

In some implementations, the multi-tone transmission is optimized with respect to the crest factor by offsetting the phase of at least one second tone relative to the phase of a first tone whose phase is maintained. In yet other implementations, relative phase information as needed for relative polarity ambiguity resolution is provided to the receiver by using a dedicated synchronization signal. This synchronization signal may be a synchronization sequence that is modulated on at least one of the tone signals. This synchronization sequence may be a pseudo-random sequence such as a "m"-sequence, a Gold-sequence, etc. characterized by adequate auto and/or cross-correlation properties as needed to reliably synchronize the receiver with the required accuracy, taking the modulation (symbol, data) rate into account. At least one of an amplitude and phase modulation may apply. The modulation signal may be adequately filtered in regards to an efficient use of the available spectrum and minimum adjacent channel interference. The synchronization sequence may be transmitted periodically, e.g., at least every $T_p$ second or integer multiples thereof, where $T_p$ defines the position update period as introduced above.

The synchronization sequence may also serve as an ID since it may be needed in some system implementations to identify a transmitter. In such implementations, the transmitter would use one of a predefined set of different synchronization sequences, e.g., a set of Gold-sequences. Without a priori knowledge, the receiver may first demodulate the received signal to identify the synchronization sequence of a particular transmission and then use that sequence as the local replica for correlating the received signal in order to find the synchronization time instance.

Figure 24:
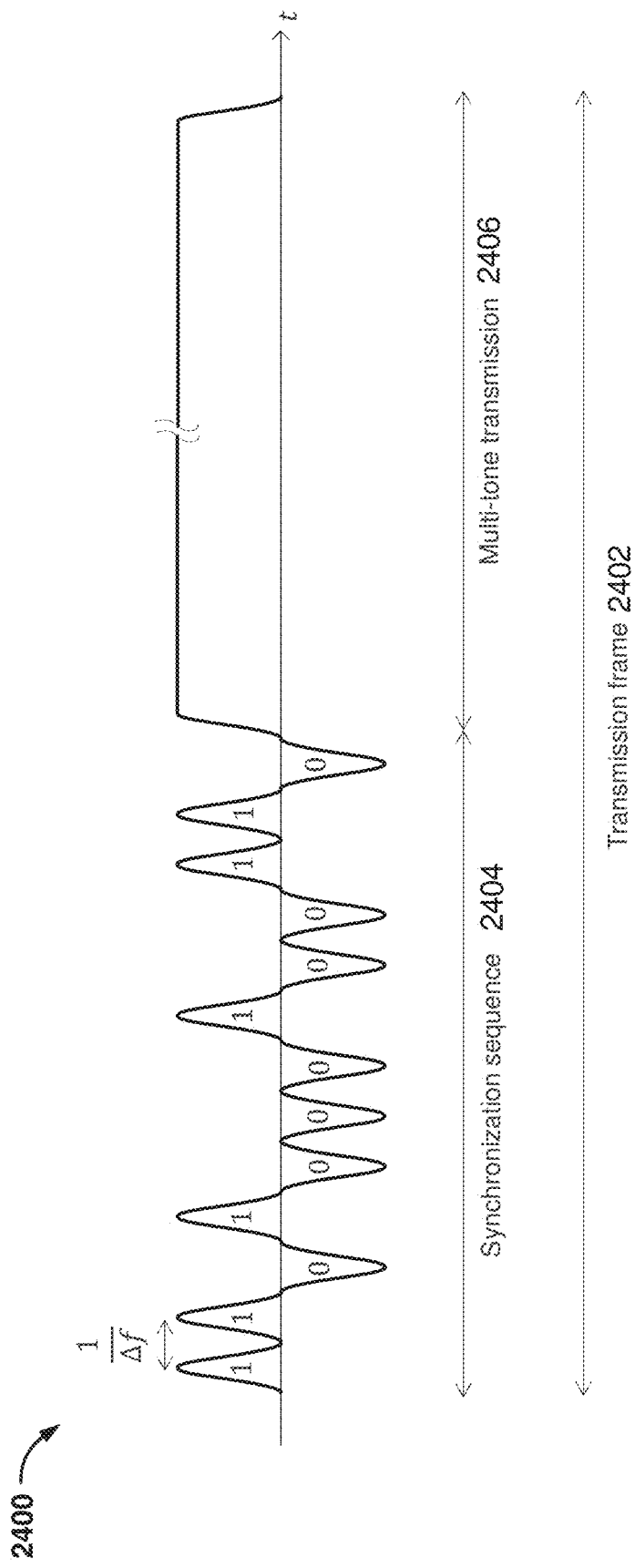
FIG. 24 illustrates a modulation waveform of a transmission frame comprising a synchronization sequence and a multi-tone transmission, in accordance with some implementations.

Such an exemplary transmission format is shown in FIG. 24. FIG. 24 illustrates a modulation waveform of a transmission frame 2402 comprising a synchronization sequence 2400 and a multi-tone transmission, in accordance with some implementations. The transmission frame 2402 may have the duration $T_p$ or multiples thereof and is subdivided into a synchronization sequence interval 2404 and a multi-tone frequency interval 2406. The synchronization sequence 2400 is indicated by the exemplary binary data sequence {1, 1, 0, 1, 0, 0, 0, 1, 0, 0, 1, 1, 0} that is modulated using a filtered (pulse-shaped) "return-to-zero" antipodal modulation scheme. For example, a "1" may be indicated by a spike or impulse rising above and then settling back to zero magnitude, while a "0" may be indicated by a spike or impulse falling below and then settling back to the zero magnitude. The modulation rate is equal to the frequency spacing $\Delta f$ of the multi-tone transmission. The resulting modulated synchronization signal may provide the correlation properties as required to synchronize the receiver with an accuracy within a small fraction of $1/\Delta f$. Thus, in some implementations the processor (e.g., the phase synchronization unit 1904) may be configured to establish relative phase synchronization between the first portion, the second portion, and the third portion of the respective signal generated by each of the plurality of sense coils 612, 614, 616 by using the synchronization sequence 2400 that is transmitted in at least one of the first alternating magnetic field (e.g., by the generator coil 602) or the second alternating magnetic field (e.g., by the generator coil 604).

With respect to the TDM implementations previously described in connection with FIGS. 7B and 7C, pulse modulated single-carrier signals (e.g., common carrier frequency wave pulses) may be transmitted in every time slot as exemplarily shown in FIG. 25. The pulse shape may be the result of a design trade-off between spectral efficiency and average transmit power, e.g., under a transmitter peak power constraint. In some other implementations, additional guard intervals are inserted between wave pulses (not shown in FIG. 25) to guarantee that no inter-slot interference occurs, e.g., due to time synchronization errors as further explained below.

As previously shown for the 3 or 2-axis generator/3-axis sensor system, the position finding problem of vehicle charging only requires knowledge of the relative polarities of the detected voltage vectors. In a pulse modulated single-carrier TDM system, relative polarity means relative phase between the signal components as sensed in the different time slots with the different sensors. To correctly detect signal magnitude and polarity of the x'-, y'- and z'-magnetic field signal, the timing of the magnetic positioning receiver is adjusted to the time slots (e.g., the time slots 782a, 784a, 786a, 788a of FIG. 7C) as defined by the sequence of the transmitted wave pulses 2502, 2504, 2506, 2508. This time slot synchronization will ensure that there is no substantial inter-slot interference falsifying magnitude and polarity as detected by the magnetic positioning receiver.

Figure 26:
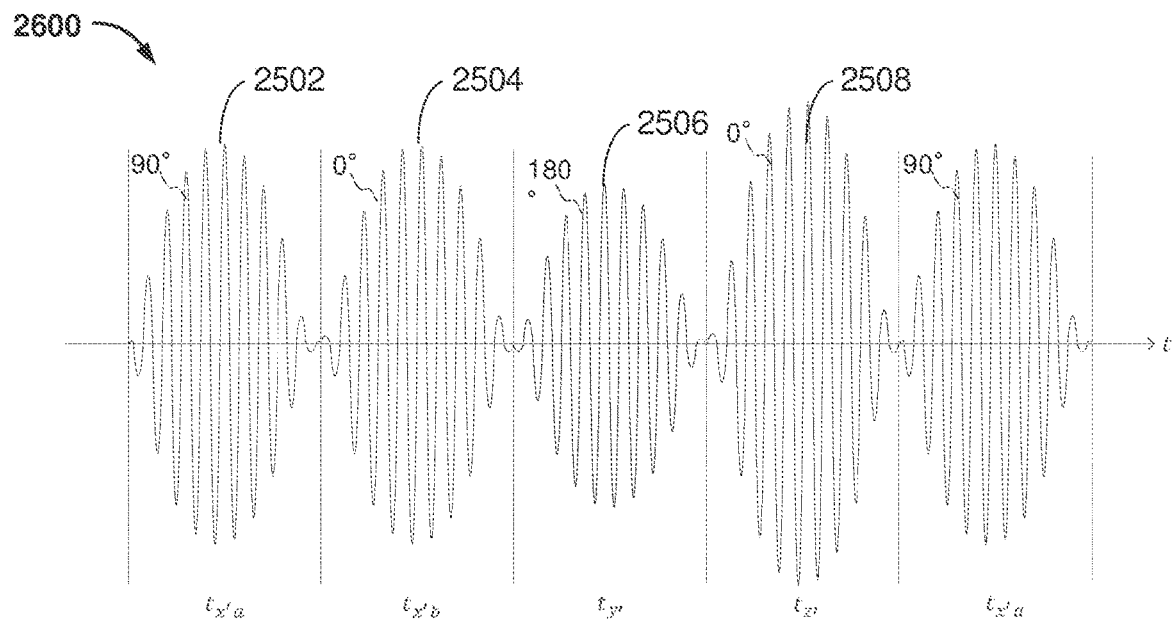
FIG. 26 shows the sequence of the wave pulses of FIG. 25 as received during the different time slots as altered by the transmission channel, in accordance with some implementations.

In some implementations all wave pulses except the start of frame wave pulse 2502 in time slot $t_{x'a}$ are transmitted with equal phase, e.g., 0°. In some implementations, the start of frame wave pulse 2502 is transmitted with a 90° phase shift relative to the phases of the other wave pulses 2504, 2506, 2508 so that time slot $t_{x'a}$ (e.g., the time slot 782a) may be distinguishable from the other time slots (e.g., the time slots 784a, 786a, 788a) in all circumstances, e.g., if the phase (polarity) of one or more wave pulses is altered by the transmission channel as determined by the relative position and rotation of the generator and sensor frame. Accordingly, the first wave pulse 2502 has a predetermined phase shift (e.g., 90 degrees) with respect to each following wave pulse 2504, 2506, 2508 of the plurality of wave pulses. In general, magnitude and phase (polarity) of the x'-, y'- and z'-magnetic field signals as transmitted in the different time slots may change as exemplarily shown in FIG. 26, which illustrates each of the wave pulses 2502, 2504, 2506, 2508.

Figure 25:
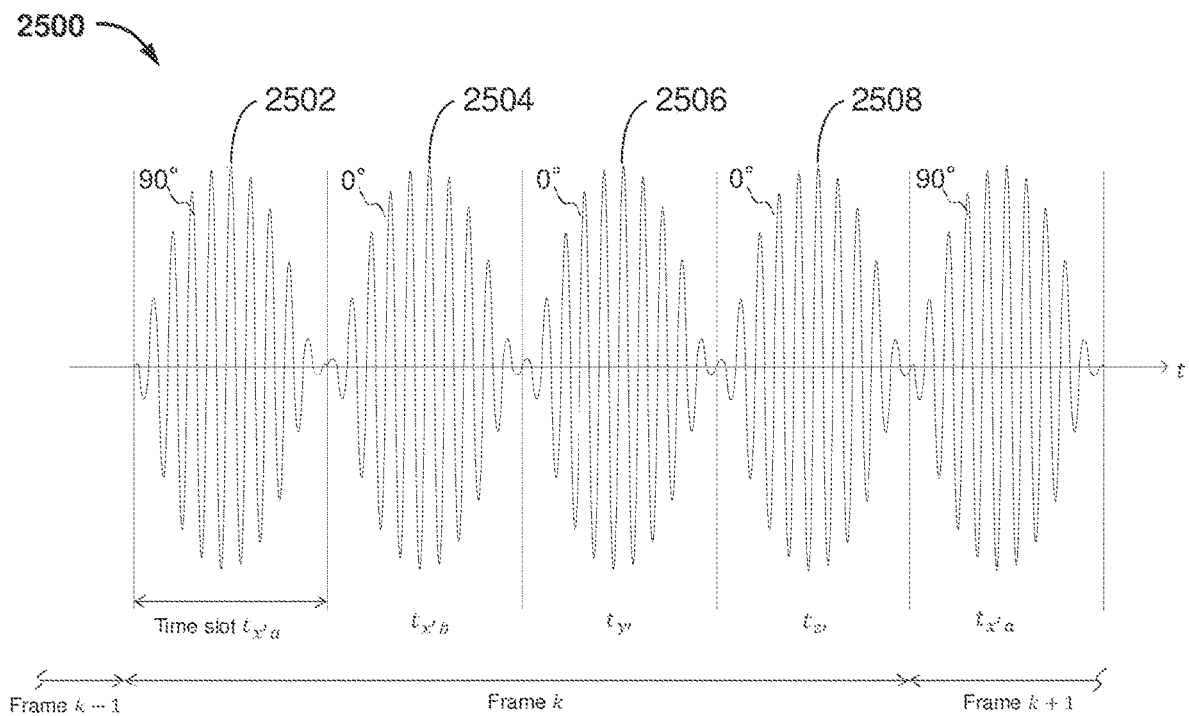
FIG. 25 shows a sequence of modulated single-carrier wave pulses transmitted during different time slots, in accordance with some implementations.

The set of coil excitation currents that generate the magnetic field beacon signals as transmitted in the different time slots and as shown in FIG. 25 may be mathematically described as follows:

$$i_{x'a}(t)=I_{x'a}p(t-t_{x'a})\sin(\omega_0 t+\pi/2), \quad (22)$$

$$i_{x'b}(t)=I_{x'b}p(t-t_{x'b})\sin(\omega_0 t), \quad (23)$$

$$i_{y'}(t)=I_{y'}p(t-t_{y'})\sin(\omega_0 t), \quad (24)$$

$$i_{z'}(t)=I_{z'}p(t-t_{z'})\sin(\omega_0 t), \quad (25)$$

where $I_{x'a}$ denotes the peak amplitude of the coil current $i_{x'a}(t)$, $p(t-t_{x'a})$ denotes the pulse envelope function positioned in time slot $t_{x'a}$, and $\omega_0$ denotes the carrier angular frequency. Denotations for the quantities defining the other signals x'b, y', and z' are shown according to (26)-(28). Defining time slot duration $T_s$, pulse positions may be expressed as:

$$t_{x'b}=t_{x'a}+T_s, \quad (26)$$

$$t_{y'}=t_{x'a}+2T_s, \quad (27)$$

$$t_{z'}=t_{x'a}+3T_s, \quad (28)$$

In some implementations, however not necessary for the basic method disclosed herein, time slot duration $T_s$ is an integer multiple k of the carrier wave period, which may be expressed as:

$$T_s = k\frac{2\pi}{\omega_0}, k \in \mathbb{N}, \quad (29)$$

In another implementation, a frame comprises only three time slots (e.g., 712a, 714a, 716a) in accordance with FIG. 7B and one wave pulse of a frame, e.g., wave pulse $i_x(t)$ is transmitted with a 90° phase shift relative to the phase of the other two wave pulses to mark a specific time slot, e.g., time slot $t_x$, and so that this time slot may be distinguishable from the other time slots in all circumstances, e.g., if the phase (polarity) of one or more wave pulses is altered by the transmission channel as determined by the relative position and rotation of the generator and sensor frame.

Figure 27:
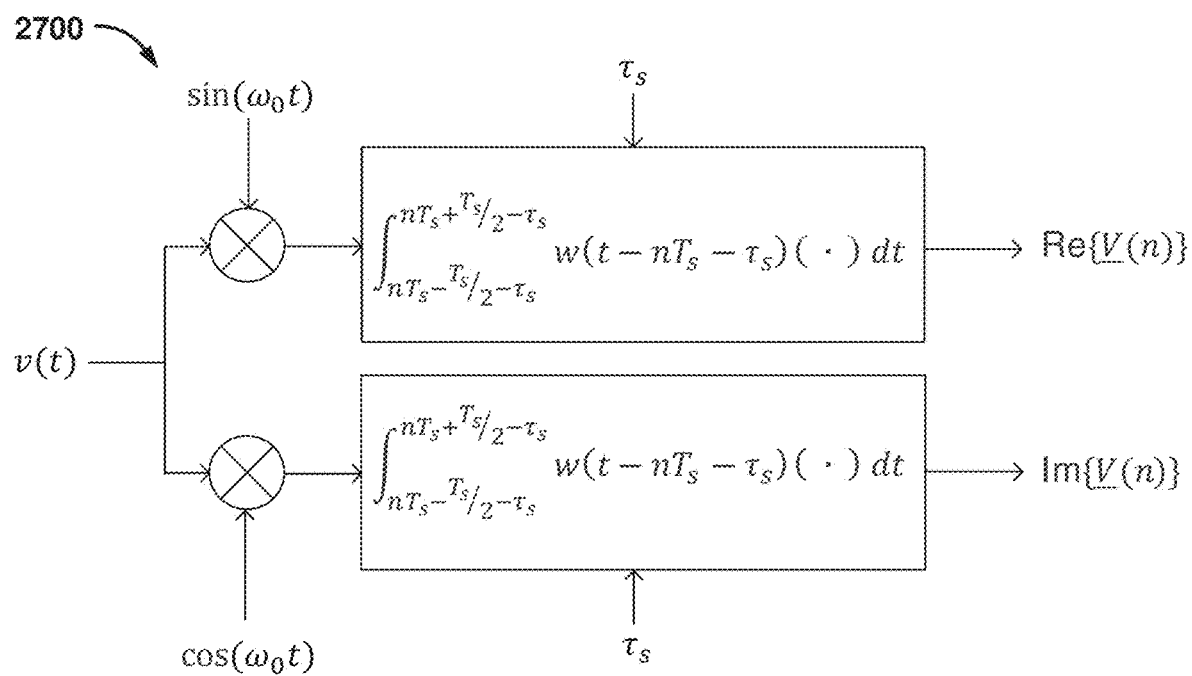
FIG. 27 shows a block diagram of a synchronous detector of a magnetic field positioning receiver operating in time-division mode in accordance with some implementations.

In a system in accordance with some implementations, the magnetic field positioning receiver uses a plurality of detectors to filter and detect each of the voltage signal components as received by each sense coil in each time slot. FIG. 27 shows a block diagram of an exemplary synchronous detector 2700 that may be used to optimally filter and detect the wave pulses 2502, 2504, 2506, 2508 as transmitted at angular frequency $\omega_0$ and received by any of the sense coils 612, 614, 616 in time slot n, where n denotes the time slot counter. In time slot n, the synchronous detector 2700, if correctly timed, provides at its two outputs the real and imaginary part (I- and Q-component), respectively, of a complex value that may represent the complex voltage $\underline{V}(n)=\text{Re}\{\underline{V}(n)\}+j\text{Im}\{\underline{V}(n)\}$ of the signal as received by a particular sense coil. $\underline{V}(n)$ is also called a phasor in the following.

Using complex signal representation and assuming perfect carrier frequency synchronization, the operation of the synchronous detector 2700 as shown in FIG. 27 may be expressed as:

$$\underline{V}(n) = \int_{nT_s-T_s/2+\tau_s}^{nT_s+T_s/2+\tau_s} w(t-nT_s-\tau_s)v(t)\cdot \exp(-j\omega_0 t)dt \quad (30)$$

where $w(\cdot)$ is a windowing function, $v(t)$ the input voltage signal as received from one of the sensor outputs, e.g., from the x-sensor output ($v_x(t)$), and $\tau_s$ a time offset parameter used to adjust timing of the synchronous detector 2700 as part of a time slot synchronization process.

In some implementations, the windowing function is matched to the transmit pulse so as to maximize signal-to-noise ratio (SNR) in outputs $\underline{V}(n)$. In other implementations, the windowing function is optimized for other criteria, e.g., carrier frequency offset tolerance, adjacent channel suppression, etc.

Figure 28:
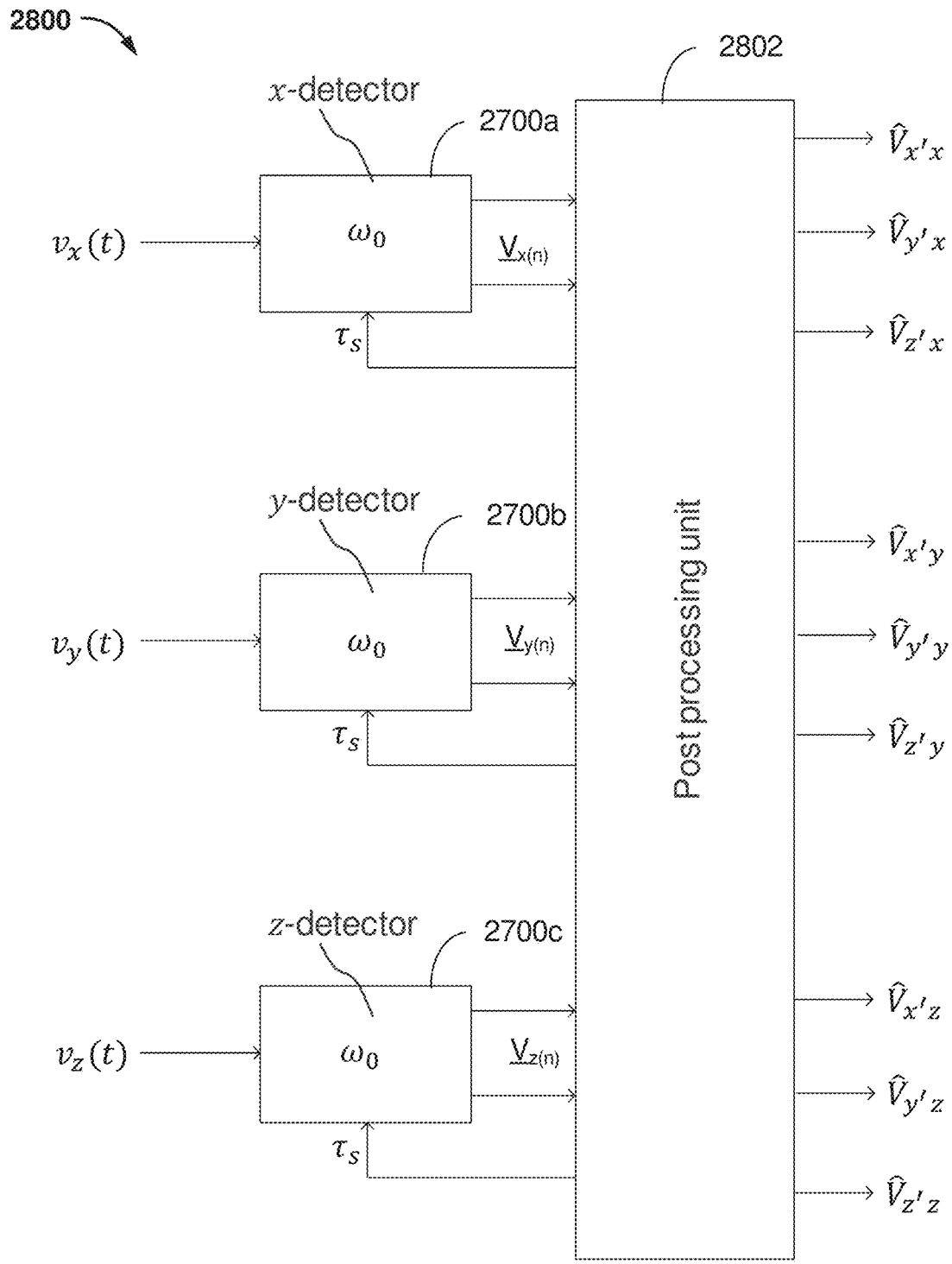
FIG. 28 shows a block diagram of a portion of a 3-branch magnetic field positioning receiver operating in time-division mode using a synchronous detector per sensed magnetic field component, in accordance with some implementations.

FIG. 28 shows a block diagram of a portion of a TDM magnetic field 3-branch receiver 2800 for a 3-axis sensor system, in accordance with some implementations. The block diagram shows the 3-branch receiver 2800 using three synchronous detectors 2700a, 2700b, 2700c (see FIG. 27). Each synchronous detector 2700a-2700c (branch) is associated to one of an analogue output of a sense coil 612, 614, 616 as further detailed below. Moreover, FIG. 28 shows a post processing unit 2802 that performs at least frame synchronization, time slot synchronization, phasor rotation, and demultiplexing (serial to parallel conversion) of the sequentially received phasors in each receiver branch. The post processing unit 2802 provides at least three complex (quadrature) inputs $\underline{V}_x(n)$, $\underline{V}_y(n)$, and $\underline{V}_z(n)$, nine scalar outputs, which are the components of the vectors $\hat{V}_{x'}$, $\hat{V}_{y'}$, $\hat{V}_{z'}$ as they may be required for determining a position in a position and direction finding unit (not shown in FIG. 28).

In some implementations, the post processing unit 2802 detects the synchronization signals as received, e.g., in time slots $t_{x'a}$ in all receiver branches assuming a TDM scheme in accordance with FIG. 7C. The post processing unit 2802 establishes frame synchronization, which is required for correct demultiplexing of signals received in consecutive time slots. It also performs time slot synchronization by determining a time offset and by adjusting a common timing parameter $\tau_s$ of the detectors to match the transmitter's time slots.

In some implementations, the post processing unit 2802 uses the synchronization signal as received (e.g., in time slots $t_{x'a}$), assuming a TDM scheme in accordance with FIG. 7C, and at least one signal received in another time slot to estimate the timing offset and to establish time slot synchronization.

In some implementations, equation (29) holds and the receiver precisely knows time slot duration $T_s$. Moreover, transmit-side and receive-side time and frequency bases are sufficiently accurate, so that consecutively detected phasors $\underline{V}(n)$ in a receiver branch are substantially equally oriented (but generally not equally directed) over a considerable number of time slots. Under certain conditions, this may also apply to phasors concurrently detected in other receiver branches, so that all detected phasors exhibit substantially equal orientation, but generally not equal sense.

Therefore, in some implementations in accordance with equations (22) to (25), the post processing unit 2802 estimates a phasor angle $\hat{\varphi}$ based on the phasors detected during time slots $t_{x'a}$ and $t_{x'b}$ and in all receiver branches and rotates all phasors detected in time slots $t_{x'b}$, $t_{y'}$, and $t_{z'}$ by an angle $-\widehat{\Delta\varphi}$ towards the real axis and selects the real part to finally provide vector estimates $\hat{V}_{x'}$, $\hat{V}_{y'}$, $\hat{V}_{z'}$ at its outputs. This process of phasor rotation may also be considered as using the phasors detected in time slots $t_{x'a}$ and $t_{x'b}$ as phase reference for detecting the phasors received in time slots $t_{y'}$, and $t_{z'}$. This is consistent with a positioning approach that requires relative phase (polarity) information only.

In some other implementations, phasor angle $\hat{\varphi}$ is estimated by means of all phasors as detected in all time slots and in all receiver branches, e.g., using a joint relative polarity detection and phase estimation approach.

In some other implementations, transmit-side and receive-side time and frequency bases may not be accurate enough so that substantial rotation results in consecutively detected phasors. In such implementations, the post processing unit 2802 may additionally perform carrier frequency synchronization by estimating and correcting the carrier frequency offset. Frequency offset correction may be performed by de-rotating detected phasors, by adjusting the frequency of the synchronous detectors ($\omega_0$), or by sending frequency control commands to the magnetic field positioning transmitter to adjust the transmit carrier frequency.

In some implementations, the post processing unit 2802 additionally combines outputs detected in time slots $t_{x'a}$ and $t_{x'b}$ to fully utilize available signal energy and to produce a vector estimate $\hat{V}_{x'}$ with improved signal-to-noise ratio. Assuming transmit signal definitions (22) and (23), combining may be accomplished by rotating the phasor detected in time slot $t_{x'a}$ by 90° and by adding it constructively to the phasor detected in time slot $t_{x'b}$, and by scaling the sum by a factor of 0.5. The combined phasor will have about equal magnitude as the individual phasors but less noise on average. This operation may apply to phasors detected in every receiver branch.

Figures 29A, 29B:
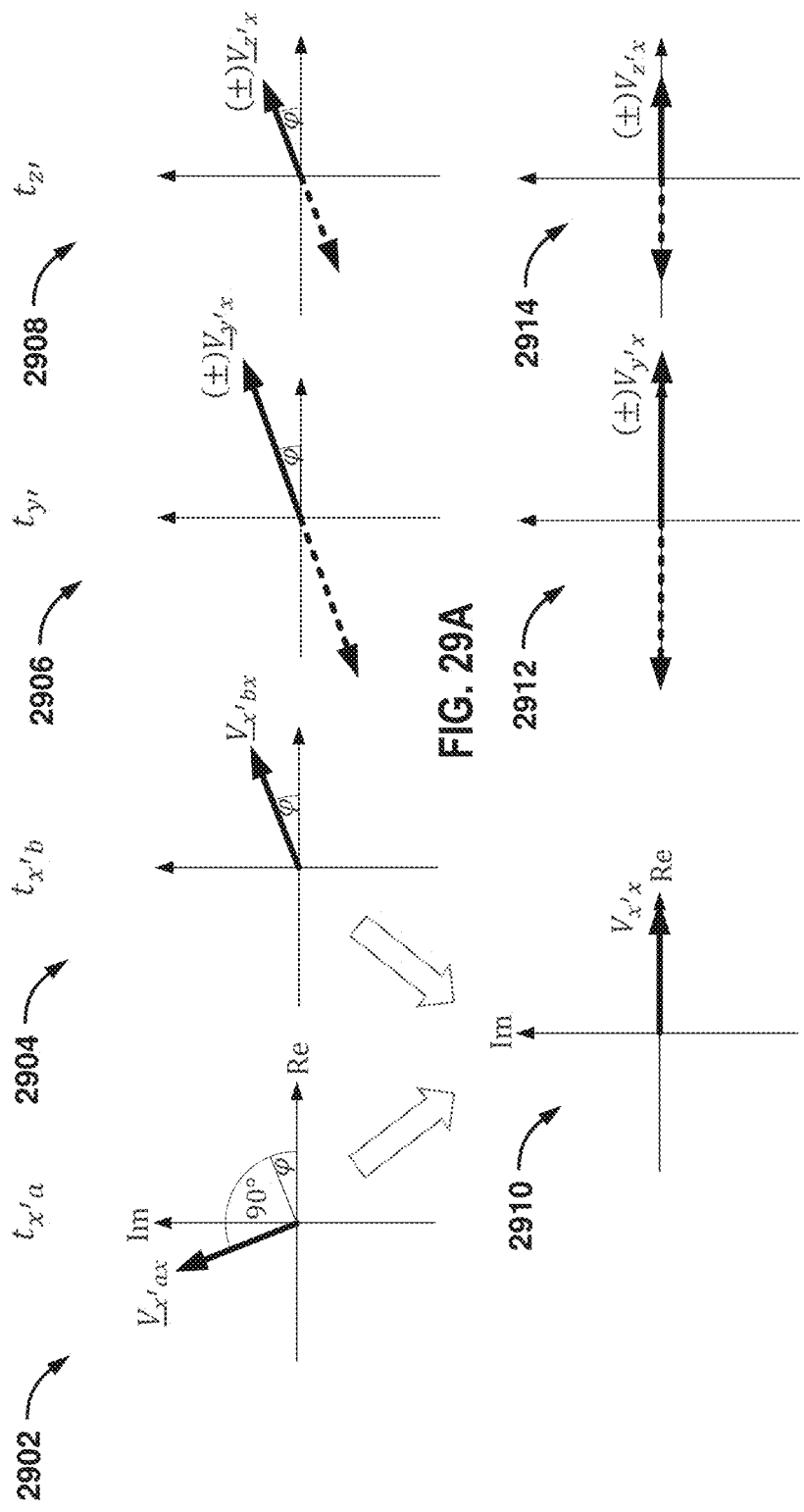
FIGS. 29A and 29B show complex phasors as sequentially detected by the x-branch synchronous detector in consecutive time slots before and after phasor rotation, respectively, in accordance with some implementations.

FIGS. 29A and 29B further illustrate the process of phasor rotation towards the real axis, phasor combination, and real part selection in the complex planes for the case of a perfect time and carrier frequency synchronization and in the absence of noise. FIG. 29A shows the sequence of phasors 2902, 2904, 2906, 2908 as detected in consecutive time slots $t_{x'a}$, $t_{x'b}$, $t_{y'}$, and $t_{z'}$ in the x-branch of the 3-branch receiver 2800. FIG. 29B shows the three relevant phasors 2910, 2912, 2914 after common rotation towards the real axis. The dashed arrow shall indicate that the relative polarities (senses) of phasors detected in time slot $t_{y'}$, and $t_{z'}$ may generally differ depending on the position and rotation of the generator frame relative to the sensor frame.

In yet other implementations, this application also contemplates a code-division multiplexing scheme (CDM) to generate magnetic field beacon signals with magnetic moments in different axis directions. As opposed to time-division multiplexing (TDM), magnetic field beacon signals are transmitted concurrently (in the same time interval) using different spreading codes. Thus, the alternating magnetic field generated by the generator coils 602, 604, 606 as well as the voltage induced in the sense coils 612, 614, 616 by that alternating magnetic field comprises at least a first portion caused by a first beacon signal of the plurality of beacon signals, a second portion caused by a second beacon signal of the plurality of beacon signals, and a third portion caused by a third beacon signal of the plurality of beacon signals. In some implementations, orthogonal spreading codes as known in the art are used to differentiate the x'-, y'-, and z'-magnetic field beacon signals in the receiver. To preserve orthogonality, these codes signals may have to be transmitted synchronously (e.g., without time offset). Other sets of spreading codes, e.g., codes with non-zero but low cross-correlation for any time offset may be used to separate magnetic field beacon signals emanating from different sources in the receiver, e.g., signals emanating from different charging bases or vehicles, depending on the direction of transmission. These code signals may be transmitted asynchronously in random time epochs.

In some implementations, the length of the spreading codes as used for code-division multiplexing of magnetic field beacon signals of the same source (e.g. the length of the orthogonal codes) corresponds to the position data update period of the magnetic field positioning system, e.g., 200 ms (5 position updates per second).

The magnetic positioning receiver uses local replicas of transmitted spreading code signals for detecting the received signals by correlation, once the receiver is in synchronism with received code signals.

In a 3-axis generator system in accordance with some implementations, spreading codes are modulated onto a sinusoidal carrier signal. In this case, the set of coil excitation currents that generate the magnetic field beacon signals as concurrently transmitted with different code sequences may be mathematically described as follows:

$$i_{x'}(t) = Re\{I_{x'} \underline{c}_{x'}(t) \exp(j\omega_0 t)\}, \tag{31}$$

$$i_{y'}(t) = Re\{I_{y'} \underline{c}_{y'}(t) \exp(j\omega_0 t)\}, \tag{32}$$

$$i_{z'}(t) = Re\{I_{z'} \underline{c}_{z'}(t) \exp(j\omega_0 t)\}, \tag{33}$$

where $I_{x'}$ denotes the peak amplitude of the coil current $i_{x'}(t)$, $\underline{c}_{x'}(t)$ the complex envelope as resulting from the spreading code modulation and some filtering for purposes of spectral shaping. Denotations for the quantities defining the other signals, y', and z' are accordingly.

In some implementations, the magnetic field positioning transmitter additionally applies a pre-emphasis on the transmit signals to compensate for the frequency response of the transmission channel, which may show a linear increase with frequency as the voltage induced in a sense coil linearly increases with frequency. Pre-emphasis may be particularly useful if the fractional bandwidth of the spectral spreading is high.

Figure 30:
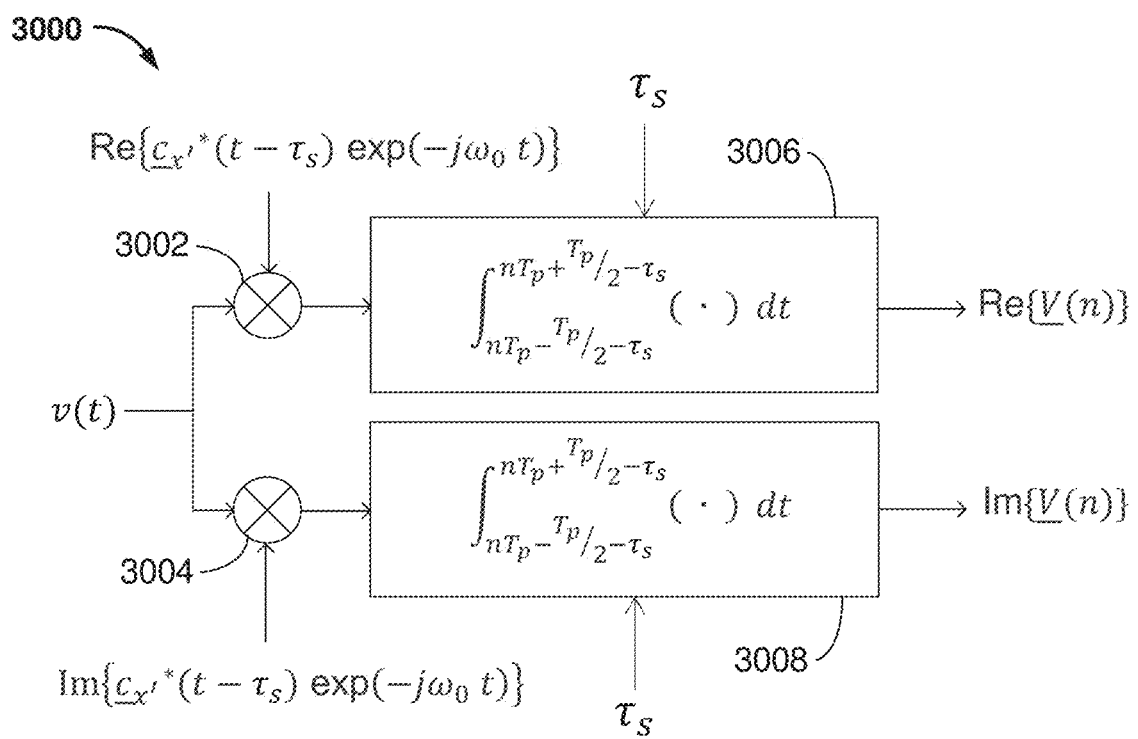
FIG. 30 shows a block diagram of a correlation detector of a magnetic field positioning receiver operating in code-division mode, in accordance with some implementations.

The magnetic field positioning receiver may use a plurality of correlation detectors for filtering and detecting each of the voltage signal components as received by each sense coil 612, 614, 616 and transmitted using different spreading codes. FIG. 30 shows a block diagram of an exemplary correlation detector 3000 for detecting the signal v(t) as it may be received, e.g., via the x-sense coil 612. It uses the conjugate complex of the transmit waveforms as local replicas. The correlation detector 3000 comprises a quadrature mixer for down-conversion and de-spreading and first and second integrators 3006, 3008, respectively. The quadrature mixer comprises a first mixer 3002 configured to multiply the input signal by the real part of the complex local replica to provide the I-component, and a second mixer 3004 configured to multiply the input signal by the imaginary part of the complex local replica to provide the Q-component. The outputs of the first and second mixers 3002, 3004 are input to the first and second integrators 3006, 3008, respectively. Both integrators 3006, 3008 perform the same function as a FIR low pass filter by weighing the baseband signal at the filter impulse response (window function). Integration may be performed over a time period $T_p$ corresponding with the position update period or any fraction thereof. In some implementations $T_p$ may correspond with the repetition period of a code sequence, e.g., a set of orthogonal code sequences. The correlation detector 3000, if code synchronous, outputs complex values (phasors) that may represent the complex voltage $\underline{V}(n)=\text{Re}\{\underline{V}(n)\}+j\text{Im}\{\underline{V}(n)\}$ of the signal received by a sense coil, where n is the detection time interval counter.

Figure 31:
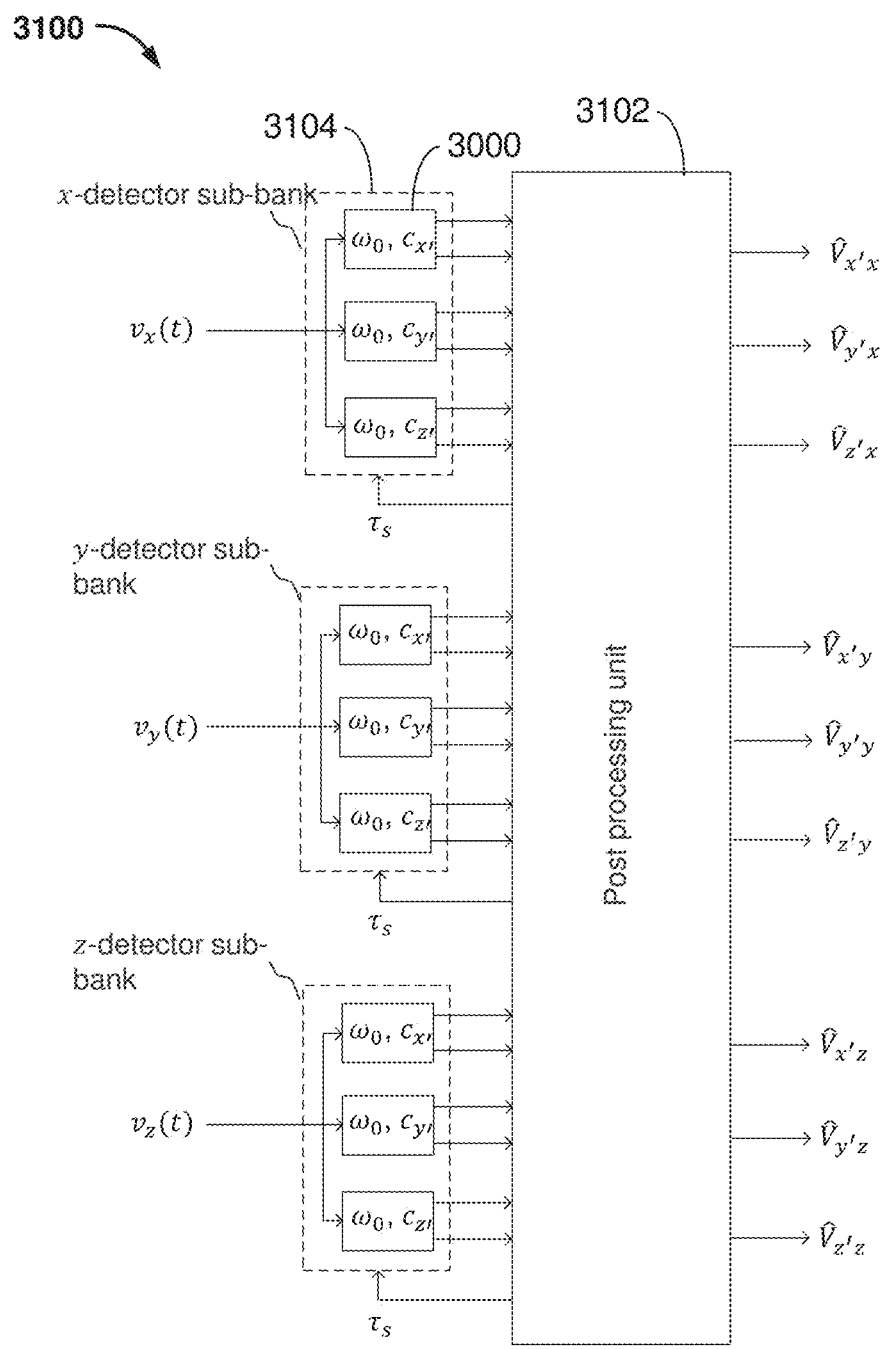
FIG. 31 shows a block diagram of a portion of a 3-branch magnetic field positioning receiver operating in code-division mode using a correlation detector per magnetic field beacon signal and per sensed magnetic field component, in accordance with some implementations.

FIG. 31 shows a block diagram of a portion of a CDM magnetic field positioning 3-branch receiver 3100 for a 3-axis sensor system, in accordance with some implementations. The block diagram shows a 3-branch receiver 3100 using a bank 3104 of correlation detectors 3000 (see FIG. 30), grouped into x-, y-, z-detector sub-banks (branches), as indicated by the dotted boxes. Each sub-bank (branch) is associated to one of an analog output ($v_x(t)$, $v_y(t)$, $v_z(t)$) of a sense coil 612, 614, 616. FIG. 31 shows a post-processing unit 3102 that performs at least code synchronization and phasor rotation of the sequentially received phasors in each receiver branch. The post-processing unit 3102 has for inputs all complex (quadrature) outputs of the correlation detectors. The post-processing unit produces for outputs the phase corrected components of vectors $\hat{V}_{x'}$, $\hat{V}_{y'}$, $\hat{V}_{z'}$ as they may be utilized for determining a position in a position and direction finding unit (not shown in FIG. 31).

In some implementations, the post processing unit 3102 establishes code synchronization with all CDM signals as received in all receiver branches and performs code synchronization tracking by determining a time offset and by adjusting a common timing parameter $\tau_s$ of the correlation detectors 3000 to match the transmitted code sequences.

In some implementations, transmit-side and receive-side time and frequency bases are sufficiently accurate, so that consecutively detected phasors $\underline{V}(n)$ in all receiver branches are substantially equally oriented (but generally not equally directed) over a considerable number of time slots. Therefore, in some implementations in accordance with equations (31) to (33), the post processing unit estimates a phasor angle $\hat{\varphi}$ based on the phasors detected, e.g., based on all receive signal components of the x'-magnetic field as transmitted with spreading code modulation $\underline{c}_{x'}(t)$ and as sensed by all sense coils 612, 614, 616. The post processing unit 3102 rotates all phasors detected by all correlation detectors 3000 in all receiver branches by an angle $-\widehat{\Delta\varphi}$ towards the real axis and selects the real part to finally provide vector estimates $\hat{V}_{x'}$, $\hat{V}_{y'}$, $\hat{V}_{z'}$ at its outputs. This process of phasor rotation may be also considered as using detected phasors of signals transmitted with spreading code modulation $\underline{c}_{x'}(t)$ as phase reference for detecting the phasors of signals transmitted with spreading code modulation $\underline{c}_{y'}(t)$ and $\underline{c}_{z'}(t)$. This is consistent with a positioning approach that requires relative phase (polarity) information only.

In some other implementations, an estimate of phasor angle $\hat{\varphi}$ is determined by means of all detected phasors of all signals as transmitted with the different spreading codes and received in all receiver branches, e.g., using a joint relative polarity detection and phase estimation approach.

In some other implementations, transmit-side and receive-side time and frequency bases may not be accurate enough so that substantial rotation results in consecutively detected phasors. In such implementations, the post processing unit 3102 may additionally perform carrier frequency synchronization by estimating and correcting the carrier frequency offset. Frequency offset correction may be performed by de-rotating detected phasors, by adjusting the frequency of the synchronous detectors ($\omega_0$), or by sending frequency control commands to the magnetic field positioning transmitter to adjust transmit carrier frequency.

FIGS. 32A and 32B further illustrate the process of phasor rotation towards the real axis and real part selection in the complex planes for the case of a perfect time and carrier frequency synchronization and in the absence of noise. FIG. 32A shows the phasors 3202, 3204, 3206 as detected on the different code signals $c_{x'}$, $c_{y'}$, and $c_{z'}$ in the x-branch of the 3-branch receiver 3100. FIG. 32B shows the phasors 3210, 3212, 3214 after common rotation towards the real axis. The dashed arrow shall indicate that the relative polarities (senses) of phasors as detected on code signals $c_{y'}$, and $c_{z'}$ may generally differ depending on the position and rotation of the generator frame relative to the sensor frame.

The above methods and systems described for a 3-axis generator/3-axis sensor system, if modified accordingly, may also apply to a 2-axis generator/3-axis sensor or to a 3-axis generator/2-axis sensor system or to any other system transmitting at least two different magnetic fields.

Figure 33:
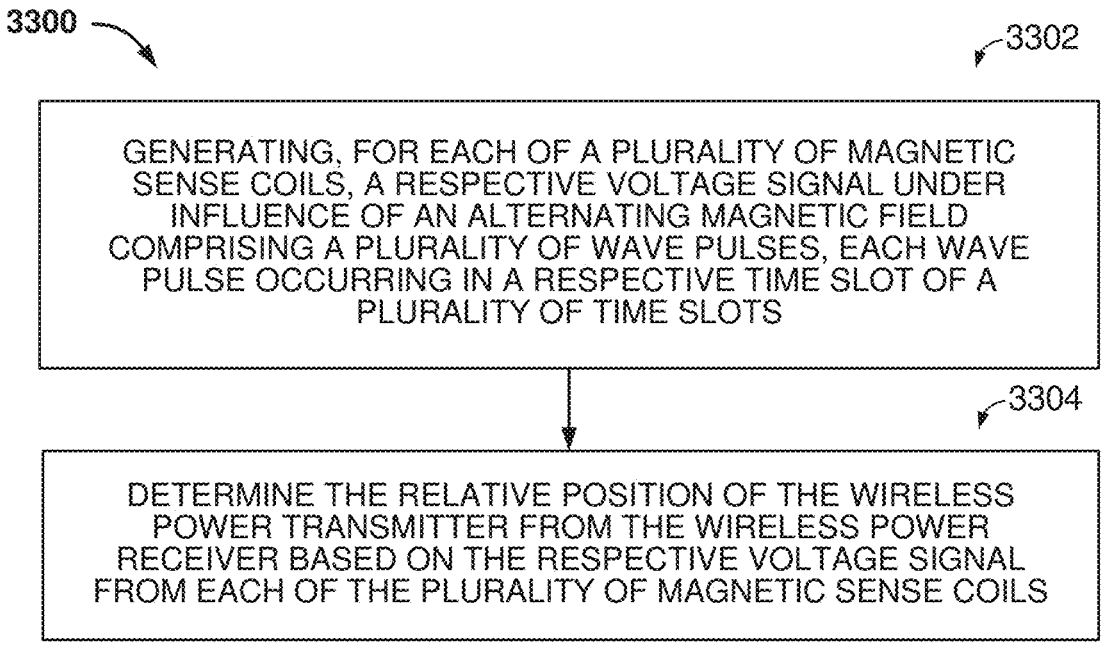
FIG. 33 is a flowchart depicting a method for determining a position between a wireless power transmitter and a wireless power receiver, in accordance with some implementations.

FIG. 33 is a flowchart 3300 depicting a method for determining a relative position of a wireless power transmitter from a wireless power receiver, in accordance with some implementations. Flowchart 3300 corresponds to the TDM method previously described with reference to at least FIGS. 4-32 and may correspond to a magnetic vectoring field sensor. Although the flowchart 3300 is described herein with reference to a particular order, in various implementations, blocks herein may be performed in a different order, or omitted, and additional blocks may be added.

Block 3302 includes generating, by each of a plurality of sense coils, a respective voltage signal under influence of an alternating magnetic field comprising a plurality of wave pulses, each wave pulse occurring in a respective time slot of a plurality of time slots. For example, as previously described in connection with at least FIG. 6, a plurality of sense coils 612, 614, 616, may each be configured to generate a respective voltage signal under influence of an alternating magnetic field comprising a plurality of wave pulses (e.g., a first wave pulse 2502, a second wave pulse 2504, a third wave pulse 2506, and a fourth wave pulse 2508) (see FIGS. 25-29B), each wave pulse occurring in a respective time slot 782a, 784a, 786a (see FIG. 7C) of a plurality of time slots).

Block 3304 includes determining the relative position of the wireless power transmitter from the wireless power receiver based on the respective voltage signal from each of the plurality of sense coils. For example, as previously described in connection with at least FIGS. 4-32 a processor or controller downstream from and/or including the post processing unit 2802 (see FIG. 28) may be configured to determine the relative position of the wireless power transmitter from the wireless power receiver based on the respective voltage signal from each of the plurality of sense coils.

Figure 34:
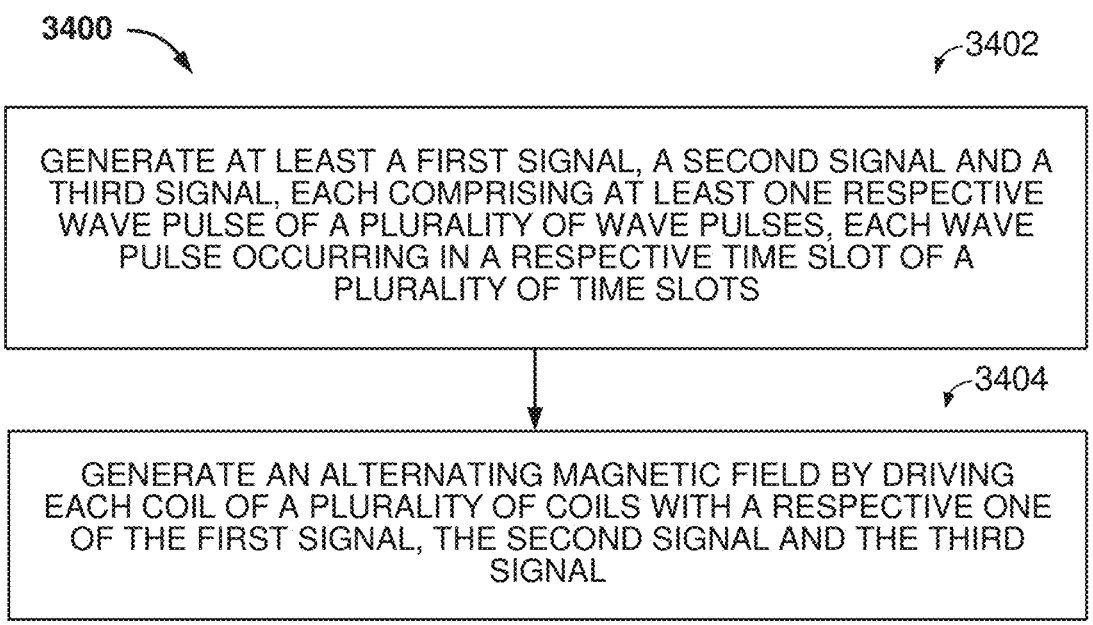
FIG. 34 is a flowchart depicting a method for determining a relative position of a wireless power transmitter from a wireless power receiver, in accordance with some implementations.

FIG. 34 is a flowchart 3400 depicting a method for determining a relative position of a wireless power transmitter from a wireless power receiver, in accordance with some implementations. Flowchart 3400 corresponds to the TDM methods previously described. The flowchart 3400 is described herein with reference to at least FIGS. 4-32 and may correspond to a magnetic vectoring field generator. Although the flowchart 3400 is described herein with reference to a particular order, in various implementations, blocks herein may be performed in a different order, or omitted, and additional blocks may be added.

Block 3402 includes generating at least a first signal, a second signal and a third signal, each comprising one of at least one respective wave pulse of a plurality of wave pulses, each wave pulse occurring in a respective time slot of a plurality of time slots. For example, as previously described in connection with at least FIG. 6, a driver circuit may generate a first signal, a second signal and a third signal, each comprising one of at least one respective wave pulse of a plurality of wave pulses 2502, 2504, 2506, 2508 (see FIGS. 25-29B), each wave pulse occurring in a respective time slot 782a, 784a, 786a (see FIG. 7C) of a plurality of time slots.

Block 3404 includes generating an alternating magnetic field by driving each coil of a plurality of coils with a respective one of the first signal, the second signal and the third signal. For example, as previously described in connection with at least FIG. 6 the alternating magnetic field may be generated by driving the coil 602 with the first signal (e.g., the wave pulses 2502 and 2504), driving the coil 604 with the second signal (e.g., the wave pulse 2506), and driving the coil 606 with the third signal (e.g., the wave pulse 2508). Where the coils 602, 604, 606 are driven with the wave pulses 2502, 2504, 2506, 2508, the wave pulses 2502 and 2504 may occur in a first time slot (e.g., time slot 782a of FIG. 7C), the wave pulse 2506 may occur in a second time slot (e.g., time slot 784a of FIG. 7C) and the wave pulse 2508 may occur in a third time slot (e.g., time slot 786a of FIG. 7C). Thus, each of the coils 602, 604, 606 may contribute to generating the alternating magnetic field during their respective time slots.

Figure 35:
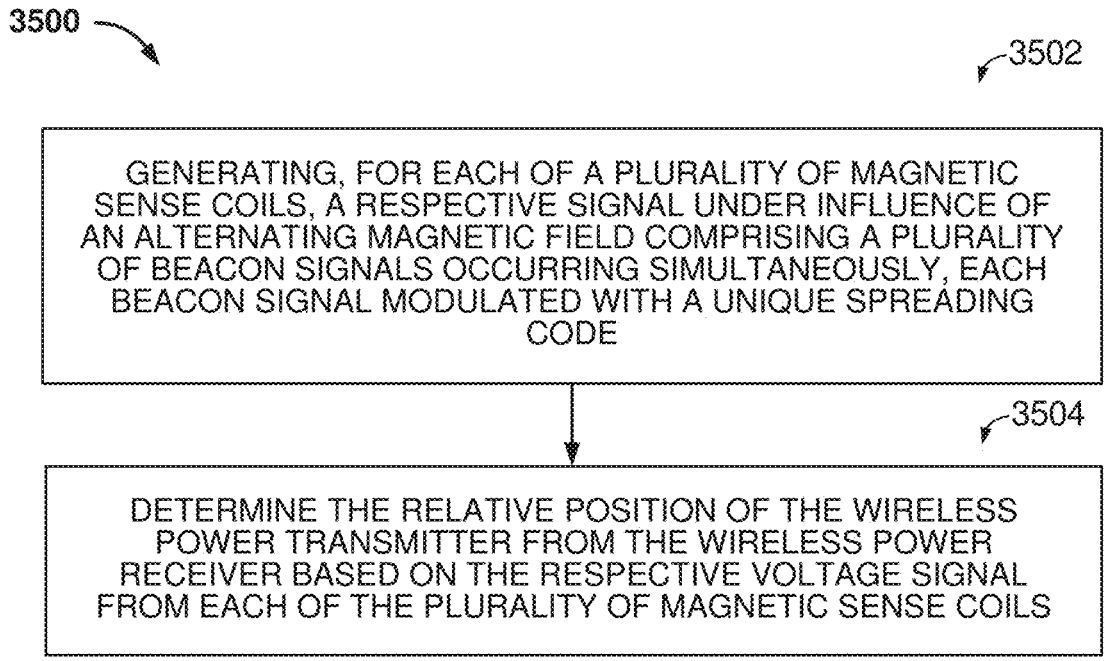
FIG. 35 is a flowchart depicting a method for determining a position between a wireless power transmitter and a wireless power receiver, in accordance with some implementations.

FIG. 35 is a flowchart 3500 depicting a method for determining a relative position of a wireless power transmitter from a wireless power receiver, in accordance with some implementations. Flowchart 3500 corresponds to the CDM method previously described with reference to at least FIGS. 4-32 and may correspond to a magnetic vectoring field sensor. Although the flowchart 3500 is described herein with reference to a particular order, in various implementations, blocks herein may be performed in a different order, or omitted, and additional blocks may be added.

Block 3502 includes generating, by each of a plurality of sense coils, a respective voltage signal under influence of an alternating magnetic field comprising a plurality of beacon signals occurring simultaneously, each beacon signal modulated with a unique spreading code. For example, as previously described in connection with at least FIG. 6, a plurality of sense coils 612, 614, 616, may each be configured to generate a respective voltage signal under influence of an alternating magnetic field comprising a plurality of beacon signals occurring simultaneously, each beacon signal modulated with a unique spreading code (e.g., $c_x(t)$, $c_y(t)$, $c_z(t)$) (see FIGS. 30-32B).

Block 3504 includes determining the relative position of the wireless power transmitter from the wireless power receiver based on the respective voltage signal from each of the plurality of sense coils. For example, as previously described in connection with at least FIGS. 4-32 a processor or controller downstream from and/or including the post processing unit 3102 (see FIG. 31) may be configured to determine the relative position of the wireless power transmitter from the wireless power receiver based on the respective voltage signal from each of the plurality of sense coils.

Figure 36:
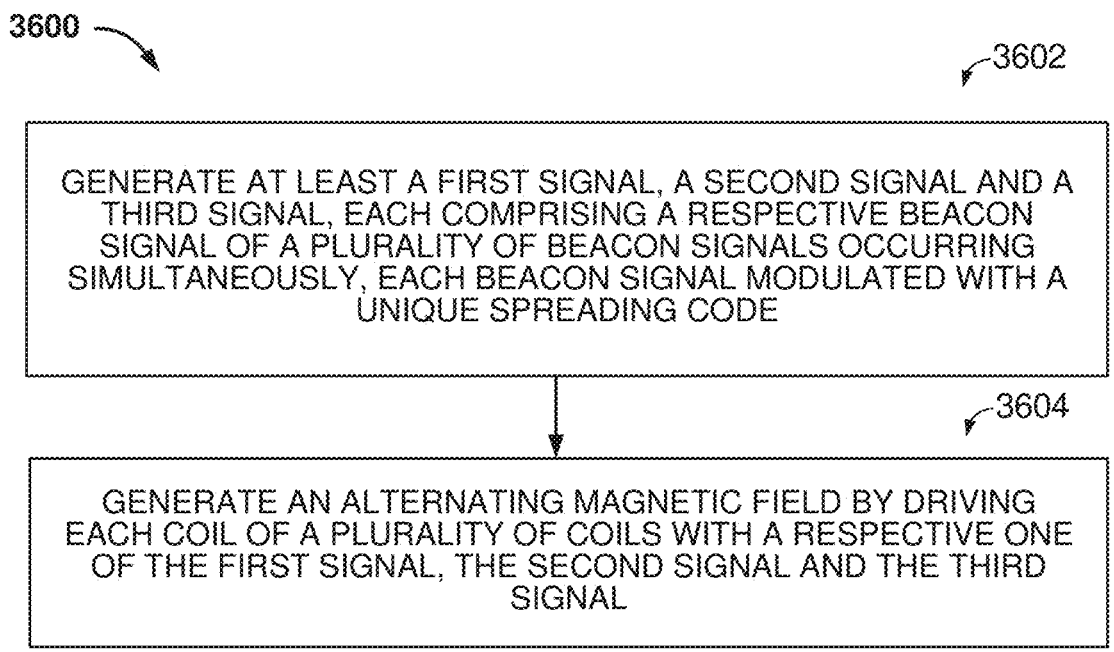
FIG. 36 is a flowchart depicting a method for determining a relative position of a wireless power transmitter from a wireless power receiver, in accordance with some implementations.

FIG. 36 is a flowchart 3600 depicting a method for determining a relative position of a wireless power transmitter from a wireless power receiver, in accordance with some implementations. Flowchart 3600 corresponds to the CDM method previously described. The flowchart 3600 is described herein with reference to at least FIGS. 4-32 and may correspond to a magnetic vectoring field generator. Although the flowchart 3600 is described herein with reference to a particular order, in various implementations, blocks herein may be performed in a different order, or omitted, and additional blocks may be added.

Block 3602 includes generating at least a first signal, a second signal and a third signal, each comprising a respective beacon signal of a plurality of beacon signals occurring simultaneously, each beacon signal modulated with a unique spreading code. For example, as previously described in connection with at least FIG. 6, a driver circuit may generate a first signal, a second signal and a third signal, each comprising a respective beacon signal of a plurality of beacon signals occurring simultaneously, each beacon signal modulated with a unique spreading code (e.g., $c_x(t)$, $c_y(t)$, $c_z(t)$) (see FIGS. 30-32B).

Block 3604 includes generating an alternating magnetic field by driving each coil of a plurality of coils with a respective one of the first signal, the second signal and the third signal. For example, as previously described in connection with at least FIG. 6 the alternating magnetic field may be generated by driving the coil 602 with the first signal (e.g., the beacon signal modulated with the spreading code $c_x(t)$), driving the coil 604 with the second signal (e.g., the beacon signal modulated with the spreading code $c_y(t)$), and driving the coil 606 with the third signal (e.g., the beacon signal modulated with the spreading code $c_z(t)$). Where the coils 602, 604, 606 are driven with the respective beacon signals, each modulated with one of the unique spreading codes $c_x(t)$, $c_y(t)$, and $c_z(t)$, all beacon signals may be transmitted simultaneously.

The various operations of methods described above may be performed by any suitable means capable of performing the operations, such as various hardware and/or software component(s), circuits, and/or module(s). Generally, any operations illustrated in the FIG.s may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted as one or more instructions or code on a tangible, non-transitory, computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC.

For purposes of summarizing the disclosure, certain aspects, advantages and novel features have been described herein. It is to be understood that not necessarily all such advantages may be achieved in accordance with any particular implementation. Thus, one or more implementations achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for determining a relative position of a wireless power transmitter from a wireless power receiver, comprising:
    a plurality of sense coils, each configured to generate a respective signal under influence of an alternating magnetic field comprising a plurality of beacon signals occurring simultaneously, each beacon signal modulated with a unique spreading code; and
    a processor configured to determine the relative position of the wireless power transmitter from the wireless power receiver based on the respective signal from each of the plurality of sense coils,
    wherein the respective signal generated by each of the plurality of sense coils comprises at least:
        a first portion caused by a first beacon signal of the plurality of beacon signals,
        a second portion caused by a second beacon signal of the plurality of beacon signals, and
        a third portion caused by a third beacon signal of the plurality of beacon signals,
    wherein the processor is configured to estimate a relative phase angle of the first portion, and
    wherein the processor is configured to establish relative phase synchronization in the time domain between the first portion, the second portion, and the third portion by shifting a detection time instant by an amount that is a function of the relative phase angle between the first portion and the second portion.

2. An apparatus for determining a relative position of a wireless power transmitter from a wireless power receiver, comprising:
    a plurality of sense coils, each configured to generate a respective signal under influence of an alternating magnetic field comprising a plurality of beacon signals occurring simultaneously, each beacon signal modulated with a unique spreading code; and
    a processor configured to determine the relative position of the wireless power transmitter from the wireless power receiver based on the respective signal from each of the plurality of sense coils,
    wherein the respective signal generated by each of the plurality of sense coils comprises at least:
        a first portion caused by a first beacon signal of the plurality of beacon signals,
        a second portion caused by a second beacon signal of the plurality of beacon signals, and
        a third portion caused by a third beacon signal of the plurality of beacon signals,
    wherein the processor is configured to estimate a relative phase angle of the first portion, and
    wherein the processor is further configured to establish relative phase synchronization in the frequency domain between the first portion, the second portion, and the third portion by shifting a phase angle of each of the first portion, the second portion and the third portion by the relative phase angle.

3. A method for determining a relative position of a wireless power transmitter from a wireless power receiver, comprising:
    generating, by each of a plurality of sense coils, a respective signal under influence of an alternating magnetic field comprising a plurality of beacon signals occurring simultaneously, each beacon signal modulated with a unique spreading code;
determining the relative position of the wireless power transmitter from the wireless power receiver based on the respective signal from each of the plurality of sense coils, wherein the respective signal generated by each of the plurality of sense coils comprises at least:
a first portion caused by a first beacon signal of the plurality of beacon signals,
a second portion caused by a second beacon signal of the plurality of beacon signals, and
a third portion caused by a third beacon signal of the plurality of beacon signals;
estimating a relative phase angle of the first portion; and
establishing relative phase synchronization in the time domain between the first portion, the second portion, and the third portion by shifting a detection time instant by an amount that is a function of the relative phase angle between the first portion and the second portion.

4. A method for determining a relative position of a wireless power transmitter from a wireless power receiver, comprising:

generating, by each of a plurality of sense coils, a respective signal under influence of an alternating magnetic field comprising a plurality of beacon signals occurring simultaneously, each beacon signal modulated with a unique spreading code;
determining the relative position of the wireless power transmitter from the wireless power receiver based on the respective signal from each of the plurality of sense coils, wherein the respective signal generated by each of the plurality of sense coils comprises at least:
a first portion caused by a first beacon signal of the plurality of beacon signals,
a second portion caused by a second beacon signal of the plurality of beacon signals, and
a third portion caused by a third beacon signal of the plurality of beacon signals;
estimating a relative phase angle of the first portion; and
establishing relative phase synchronization in the frequency domain between the first portion, the second portion, and the third portion by shifting a phase angle of each of the first portion, the second portion and the third portion by the relative phase angle.

* * * * *